US012685006B2

(12) United States Patent
Kim et al.

(10) Patent No.: US 12,685,006 B2
(45) Date of Patent: Jul. 14, 2026

(54) POLYMER AND ORGANIC LIGHT EMITTING DEVICE COMPRISING SAME

(71) Applicant: LG Chem, Ltd., Seoul (KR)

(72) Inventors: Ji Hoon Kim, Daejeon (KR); Jaesoon Bae, Daejeon (KR); Jaechol Lee, Daejeon (KR); Yu Jin Woo, Daejeon (KR); Sungkyoung Kang, Daejeon (KR); Min Suk Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 989 days.

(21) Appl. No.: 17/792,241

(22) PCT Filed: Mar. 16, 2021

(86) PCT No.: PCT/KR2021/003235

§ 371 (c)(1),
(2) Date: Jul. 12, 2022

(87) PCT Pub. No.: WO2021/194148

PCT Pub. Date: Sep. 30, 2021

(65) Prior Publication Data

US 2023/0140039 A1 May 4, 2023

(30) Foreign Application Priority Data

Mar. 27, 2020 (KR) ........................ 10-2020-0037811
Mar. 15, 2021 (KR) ........................ 10-2021-0033357

(51) Int. Cl.
*H10K 85/10* (2023.01)
*C08G 61/12* (2006.01)
*H10K 50/15* (2023.01)

(52) U.S. Cl.
CPC .......... *H10K 85/111* (2023.02); *C08G 61/121* (2013.01); *H10K 85/151* (2023.02);
(Continued)

(58) Field of Classification Search
CPC .... H10K 85/111; H10K 85/151; H10K 50/15; C08G 2261/124; C08G 2261/148;
(Continued)

(56) References Cited

U.S. PATENT DOCUMENTS 7,351,358 B2 4/2008 Hsu et al.
9,525,134 B1 12/2016 Radu et al.
(Continued)

FOREIGN PATENT DOCUMENTS

CN 107108498 A 8/2017
CN 110121493 A 8/2019
(Continued)

OTHER PUBLICATIONS

International Search Report for Application No. PCT/KR2021/003235 mailed Jul. 1, 2021, pp. 1-4.
(Continued)

*Primary Examiner* — Jenna N Chandhok
(74) *Attorney, Agent, or Firm* — Lerner David LLP

(57) ABSTRACT

The present disclosure provides a polymer and an organic light emitting device including the same, wherein the polymer comprising a repeating unit represented by the following Chemical Formula 1:
(Continued)

[Chemical Formula 1]

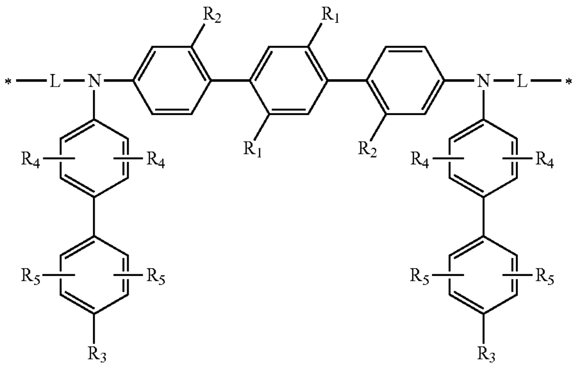

wherein L, $R_1$ to $R_5$, and * are described herein.

18 Claims, 1 Drawing Sheet

(52) U.S. Cl.
CPC . *C08G 2261/124* (2013.01); *C08G 2261/148* (2013.01); *C08G 2261/312* (2013.01); *C08G 2261/512* (2013.01); *C08G 2261/95* (2013.01); *H10K 50/15* (2023.02)

(58) Field of Classification Search
CPC ........ C08G 2261/312; C08G 2261/512; C08G 2261/132; C08G 2261/1412; C08G 2261/1642; C08G 2261/3162; C08G 2261/344; C08G 61/12
See application file for complete search history.

(56) References Cited

U.S. PATENT DOCUMENTS

| | | | |
|---|---|---|---|
| 2004/0251816 | A1 | 12/2004 | Leo et al. |
| 2007/0292681 | A1 | 12/2007 | Okuda et al. |
| 2009/0051281 | A1 | 2/2009 | Inoue et al. |
| 2013/0082251 | A1 | 4/2013 | Park et al. |
| 2013/0087779 | A1 | 4/2013 | Park et al. |
| 2016/0308141 | A1 | 10/2016 | Radu et al. |
| 2016/0329497 | A1 | 11/2016 | Radu et al. |
| 2018/0287067 | A1 | 10/2018 | Radu et al. |
| 2019/0067591 | A1 | 2/2019 | Jang |
| 2019/0386219 | A1 | 12/2019 | Kim et al. |
| 2020/0185611 | A1 | 6/2020 | Yi et al. |
| 2020/0239610 | A1 | 7/2020 | Seo et al. |
| 2020/0259095 | A1 | 8/2020 | Shin et al. |
| 2020/0291175 | A1 | 9/2020 | Kang et al. |
| 2023/0140682 | A1 | 5/2023 | Numata et al. |

FOREIGN PATENT DOCUMENTS

| | | | |
|---|---|---|---|
| CN | 110366551 | A | 10/2019 |
| CN | 110492011 | A | 11/2019 |
| CN | 110691806 | A | 1/2020 |
| CN | 111148791 | A | 5/2020 |
| CN | 111225930 | A | 6/2020 |
| EP | 3674290 | A2 | 7/2020 |
| JP | 2007220772 | A | 8/2007 |
| JP | 2012131993 | A | 7/2012 |
| JP | 2019501872 | A | 1/2019 |
| JP | 2019108296 | A | 7/2019 |
| JP | 2019163471 | A | 9/2019 |
| JP | 2020105152 | A | 7/2020 |
| KR | 20000051826 | A | 8/2000 |
| KR | 20070120876 | A | 12/2007 |
| KR | 20130021446 | A | 3/2013 |
| KR | 20160131947 | A | 11/2016 |
| KR | 20180030220 | A | 3/2018 |
| KR | 20200005933 | A | 1/2020 |
| KR | 20200029344 | A | 3/2020 |
| WO | 2003012890 | A2 | 2/2003 |
| WO | 2011028216 | A1 | 3/2011 |
| WO | 2011159872 | A1 | 12/2011 |
| WO | 2011159876 | A2 | 12/2011 |
| WO | 2015089027 | A1 | 6/2015 |
| WO | 2019105327 | A1 | 6/2019 |

OTHER PUBLICATIONS

Extended European Search Report for Application No. 21776998.3 dated Aug. 11, 2023, pp. 1-5.

[FIG. 1]
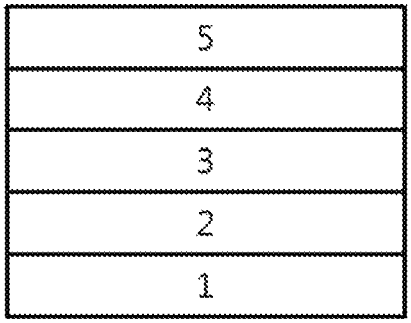
[FIG. 2]
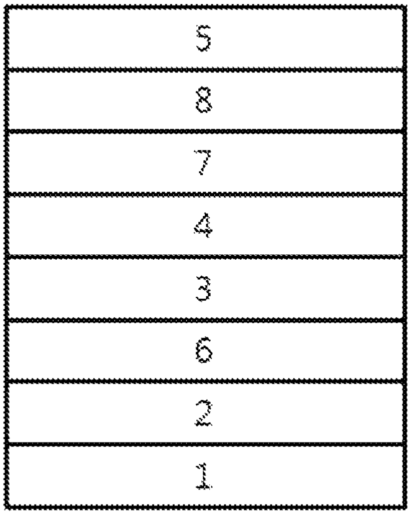

POLYMER AND ORGANIC LIGHT EMITTING DEVICE COMPRISING SAME

CROSS-REFERENCE TO RELATED APPLICATION(S)

The present application is a national stage entry under 35 U.S.C. § 371 of International Application No. PCT/KR2021/003235 filed on Mar. 16, 2021, which claims priority from Korean Patent Applications No. 10-2020-0037811 filed on Mar. 27, 2020, and No. 10-2021-0033357 filed on Mar. 15, 2021, all the disclosures of which are incorporated herein by reference.

TECHNICAL FIELD

The present disclosure relates to a novel polymer and an organic light emitting device comprising the same.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

Accordingly, the present disclosure provides a novel material for organic light emitting devices capable of being deposited by a solution process while being used for an organic light emitting device.

PRIOR ART LITERATURE

Patent Literature (Patent Literature 1) Korean Patent Laid-open Publication No. 10-2000-0051826

DETAILED DESCRIPTION OF THE INVENTION

Technical Problem

It is an object of the present disclosure to provide a novel polymer and an organic light emitting device including the same.

Technical Solution

In one aspect of the present disclosure, there is provided a polymer comprising a repeating unit represented by the following Chemical Formula 1:

[Chemical Formula 1]

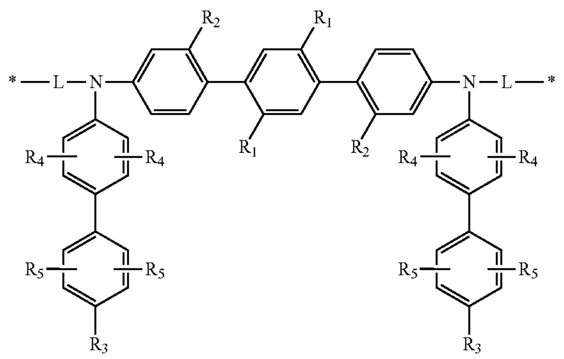

wherein, in Chemical Formula 1, each L is independently a substituted or unsubstituted $C_{6-10}$ arylene, each $R_1$ is independently a substituted or unsubstituted $C_{4-10}$ alkyl, each $R_2$ is independently a substituted or unsubstituted $C_{1-4}$ alkyl, each $R_3$ is independently a substituted or unsubstituted $C_{1-10}$ alkyl, all of $R_4$ are not present, and $R_5$ are each independently a substituted or unsubstituted $C_{1-4}$ alkyl; or $R_4$ are each independently a substituted or unsubstituted $C_{1-4}$ alkyl, and all of $R_5$ are not present, and

* indicates the point of attachment within the polymer.

In another aspect of the present disclosure, there is provided an organic light emitting device comprising an anode; a cathode that is disposed opposite to the anode; a light emitting layer that is provided between the anode and the cathode; and a hole transport layer that is provided between the anode and the light emitting layer, wherein the hole transport layer comprises the above-mentioned polymer.

Advantageous Effects

The polymer according to the present disclosure can be used as a material of a hole transport layer of an organic light emitting device, is capable of being deposited by a solution process, and can improve the efficiency, achieve low driving voltage and/or improve lifetime characteristics in the organic light emitting device.

BRIEF DESCRIPTION OF DRAWINGS

FIG. 1 shows an example of an organic fight emitting device comprising a substrate 1, an anode 2, a hole transport layer 3, a light emitting layer 4, and a cathode 5.

FIG. 2 shows an example of an organic light emitting device comprising a substrate 1, an anode 2, a hole injection layer 6, a hole transport layer 3, a light emitting layer 4, an electron transport layer 7, an electron injection layer 8, and a cathode 5.

DETAILED DESCRIPTION OF THE EMBODIMENTS

Hereinafter, embodiments of the present disclosure will be described in more detail to facilitate understanding of the invention.

As used herein, the notation,  or  means a bond linked to another substituent group.

As used herein, the term "substituted or unsubstituted" means being substituted of a hydrogen with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or substituted with a substituent to which two or more substituents are linked among the substituents exemplified above, or being unsubstituted. For example, "the substituent to which two or more substituents are linked" may be a biphenyl group. That is, the biphenyl group may be interpreted as an aryl group, or a substituent to which two phenyl groups are linked.

In the present specification, the number of carbon atoms of a carbonyl group is not particularly limited, but is preferably 1 to 40. Specifically, the carbonyl group may be a compound having the following structural formulae, but is not limited thereto.

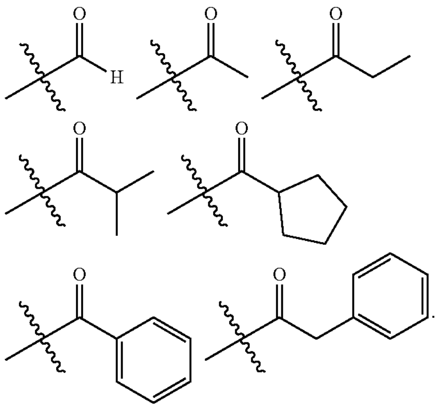

In the present specification, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulae, but is not limited thereto.

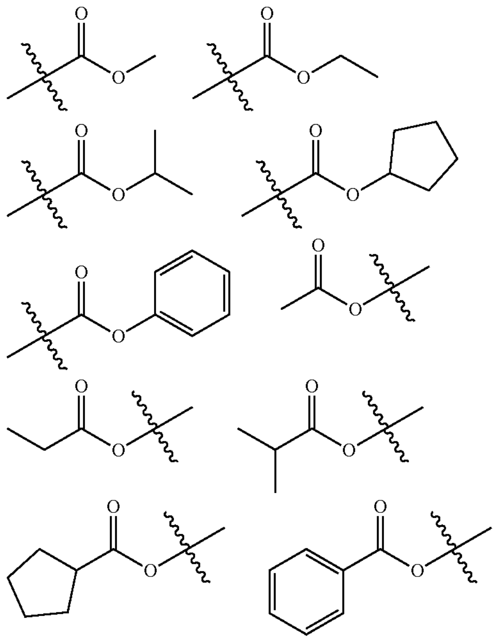

In the present specification, the number of carbon atoms of an imide group is not particularly limited, but is preferably 1 to 25. Specifically, the imide group may be a compound having the following structural formulae, but is not limited thereto.

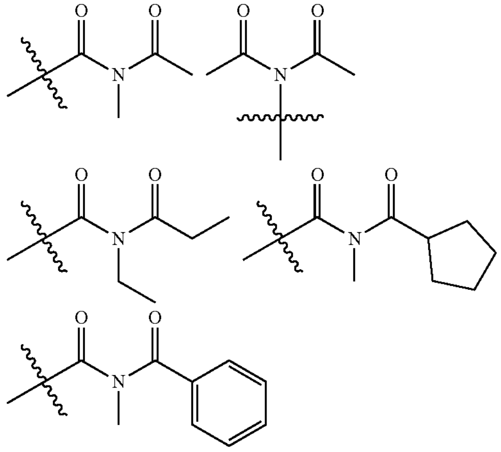

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be a straight-chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentyl-methyl, cyclohectylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, iso-hexyl, 2-methylpentyl, 4-methylhexyl, 5-methylhexyl, and the like, but are not limited thereto.

In the present specification, the alkenyl group may be a straight-chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group, or the like, but is not limited thereto.

In the present specification, a fluorenyl group may be substituted, and two substituent groups may be linked to each other to form a spiro structure. In the case where the fluorenyl group is substituted,

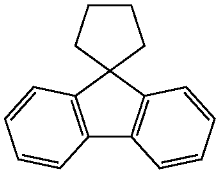

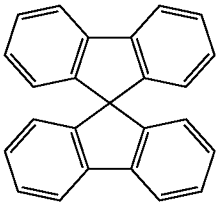

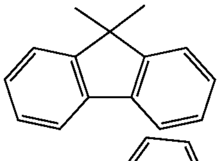

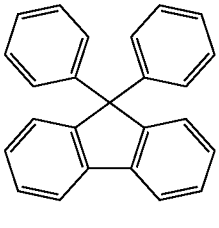

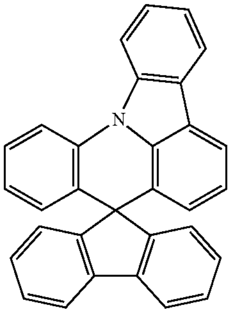

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

(Repeating Unit Represented by Chemical Formula 1)

The repeating unit represented by Chemical Formula 1 included in the polymer according to the present disclosure has excellent hole transport properties. Particularly, long-chain and short-chain alkyls are introduced into the terphenyl structure, which is the central structure of Chemical Formula 1, and alkyls are further introduced into the nitrogen-substituted biphenyl structure, whereby the HOMO energy level can be lowered, the hole mobility can be improved, and the solubility in a solvent can be improved. Particularly, in Chemical Formula 1, due to the steric hindrance effect of the substituted alkyl in the nitrogen-substituted biphenyl structure, the conjugation in the molecular structure is weakened, and thus high luminous efficiency can be exhibited.

Preferably, the Chemical Formula 1 is represented by the following Chemical Formula 1' or 1":

[Chemical Formula 1′]

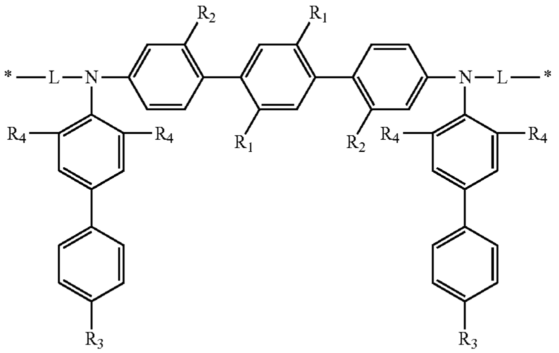

wherein, in Chemical Formula 1',

L, $R_1$, $R_2$, $R_3$, and * are as defined above, and each $R_4$ is independently a substituted or unsubstituted $C_{1-4}$ alkyl,

[Chemical Formula 1″]

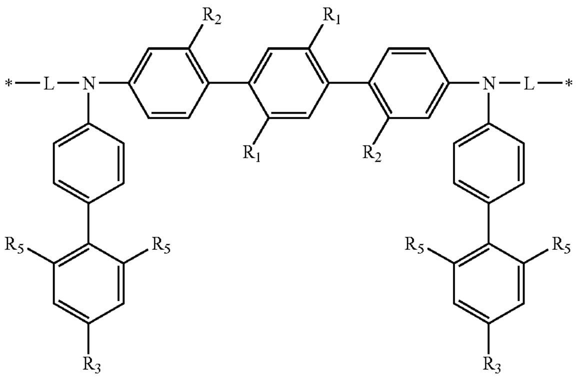

wherein, in Chemical Formula 1",

L, $R_1$, $R_2$, $R_3$, and * are as defined above, and each $R_5$ is independently a substituted or unsubstituted $C_{1-4}$ alkyl.

Preferably, L are the same as each other. Preferably, each L is independently phenylene, or biphenylyl. More preferably, each L is independently

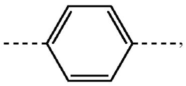, or

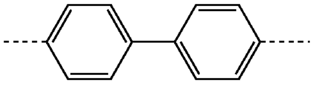

Preferably, $R_1$ are the same as each other. Preferably, each $R_1$ is independently a straight-chain hexyl, a straight-chain heptyl, a straight-chain octyl, a straight-chain nonyl, or a straight-chain decyl.

Preferably, $R_2$ are the same as each other. Preferably, each $R_2$ is independently methyl, ethyl, or propyl, more preferably, methyl.

Preferably, $R_3$ are the same as each other. Preferably, each $R_3$ is independently methyl, ethyl, or propyl.

Preferably, $R_4$ are the same as each other. Preferably, each $R_4$ is independently methyl, ethyl, or propyl.

Preferably, the Chemical Formula 1 is represented by the following formulas:

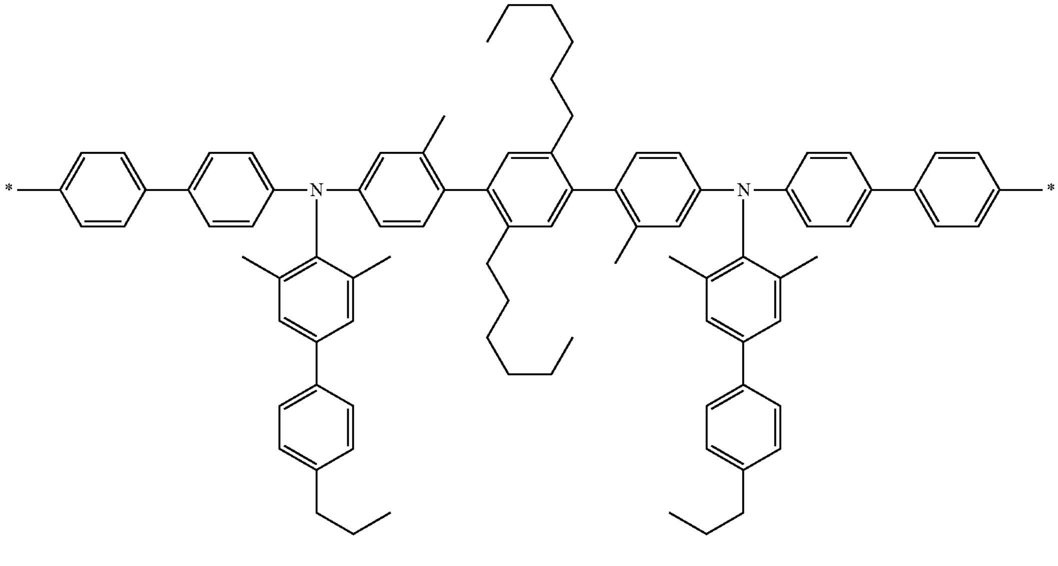

-continued

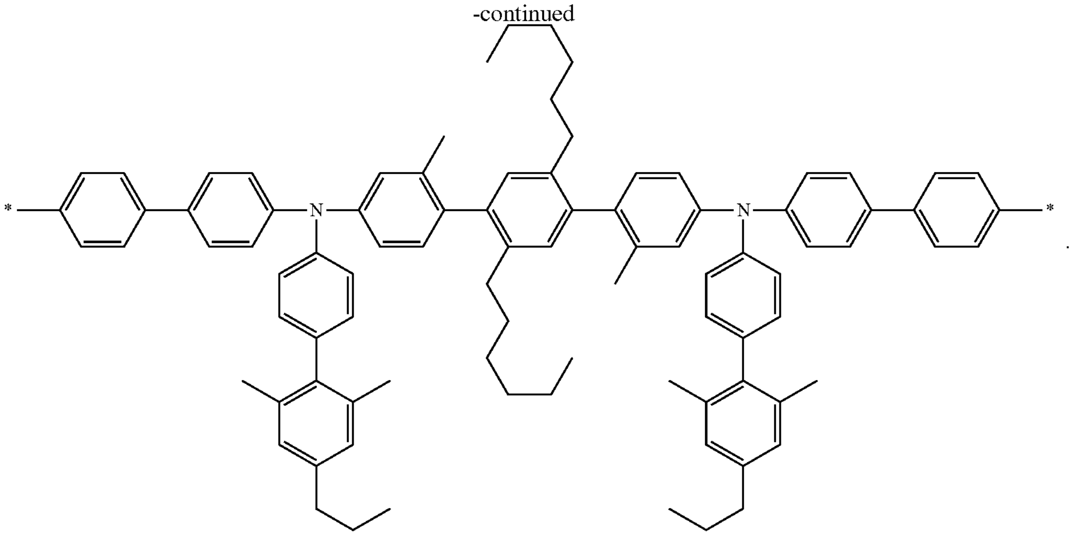

Further, the repeating unit represented by Chemical Formula 1 is derived from a compound represented by the following Chemical Formula 1-1.

[Chemical Formula 1-1]

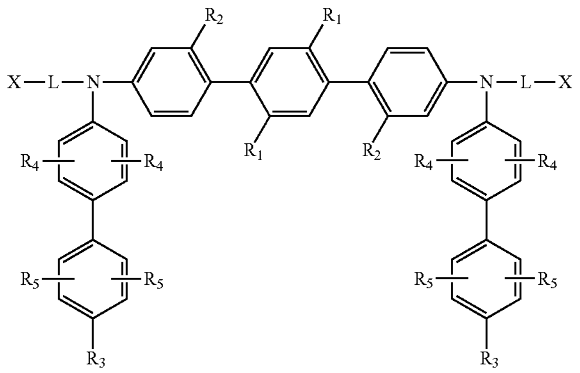

wherein, in Chemical Formula 1-1, the remaining substituents excluding X are as defined above, and X is halogen, preferably bromo, or chloro.

The compound represented by Chemical Formula 1-1 can be prepared according to the preparation method as shown in the following Chemical Scheme 1.

[Chemical Scheme 1]

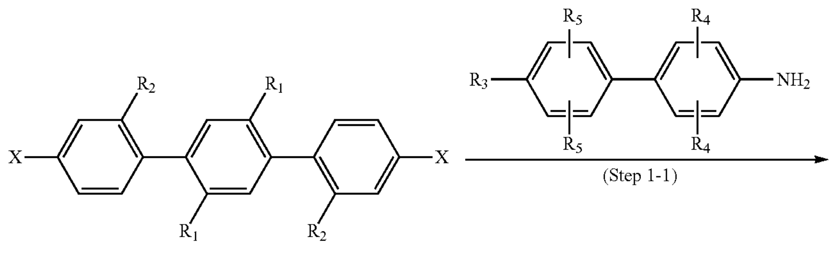

-continued

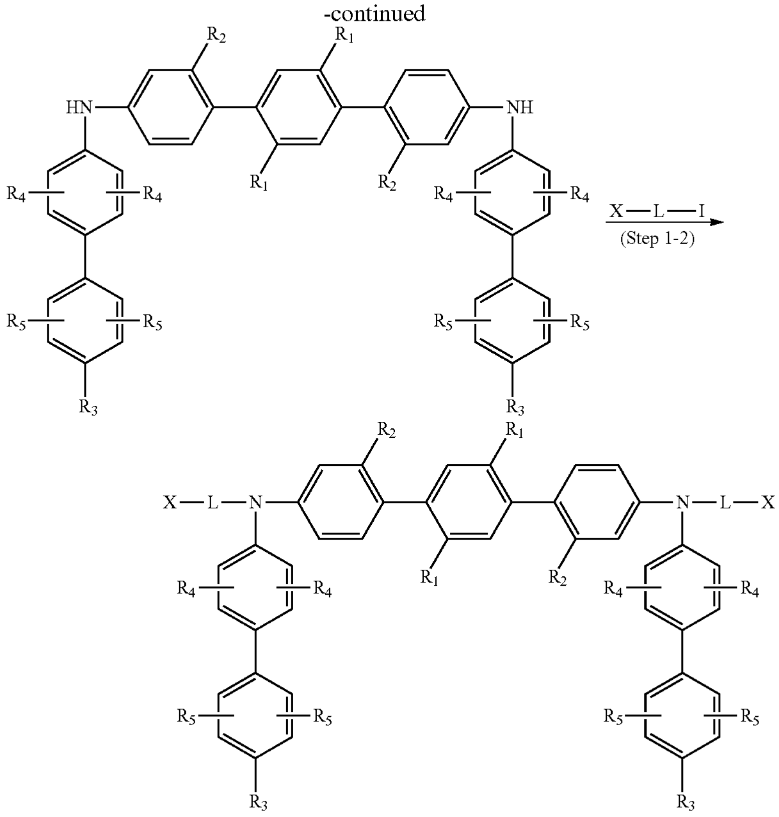

In Reaction Scheme 1, the remaining substituents excluding X are as defined above, and X is halogen, preferably bromo, or chloro.

Steps 1-1 and 1-2 in Reaction Scheme 1 are each an amine substitution reaction, which reactions are carried out in the presence of a palladium catalyst and a base to produce the compound represented by Chemical Formula 1-1. The reactive group for the amine substitution reaction can be changed as known in the art. The above preparation method can be further embodied in Preparation Examples described hereinafter.

(Repeating Unit Represented by Chemical Formula 2)

The polymer according to the present disclosure may further include a repeating unit represented by the following Chemical Formula 2:

$Z\text{-}(L'-*)_n$ [Chemical Formula 2]

wherein, in Chemical Formula 2, each L' is independently a single bond; or a substituted or unsubstituted $C_{6-60}$ arylene, Z is C, Si, N, Si (phenyl), or an n-valent substituted or unsubstituted $C_{6-60}$ aromatic ring, n is 3 or 4, with the proviso that n is 4 if Z is C or Si and n is 3 if Z is N or Si (phenyl), and

* indicates the point of attachment within the polymer.

The repeating unit represented by Chemical Formula 2 is a branched repeating unit, and when included in the polymer structure according to the present disclosure, the polymer structure can be branched to improve the solubility in a solvent.

Preferably, each L' may be independently a single bond, or phenylene.

Preferably, Z is C, N, Si, or a trivalent benzene.

Preferably, the Chemical Formula 2 is any one selected from the group consisting of:

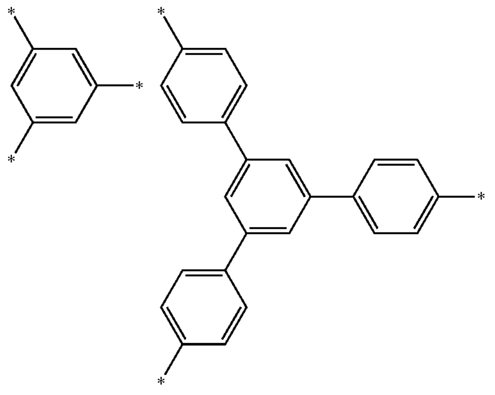

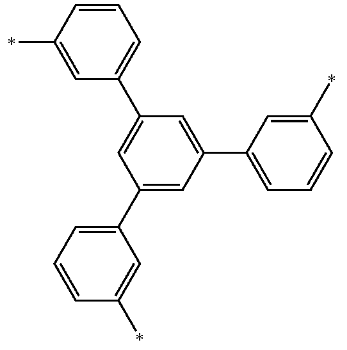

-continued

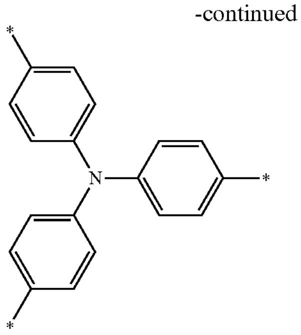

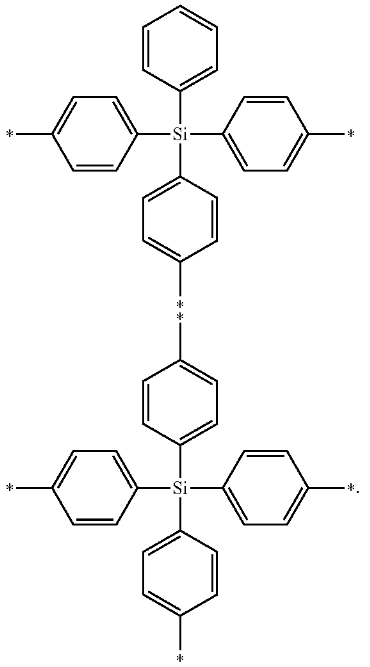

Further, the repeating unit represented by Chemical Formula 2 is derived from a compound represented by the following Chemical Formula 2-1.

$Z\text{-}(\text{-}L'\text{-}x')_n$ [Chemical Formula 2-1]

wherein, in Chemical Formula 2-1, the remaining substituents excluding X' are as defined above, and X' is halogen, preferably bromo, or chloro.

(Terminal Group Represented by Chemical Formula 3)

The polymer according to the present disclosure may further include a repeating unit represented by the following Chemical Formula 3:

Ar —* [Chemical Formula 3]

wherein, in Chemical Formula 3,

Ar is a substituted or unsubstituted $C_{6-60}$ aryl, and

* indicates the point of attachment within the polymer.

The terminal group represented by Chemical Formula 3 is an aromatic cyclic terminal group, and when included in the polymer structure according to the present disclosure, the solubility in a solvent can be improved.

Preferably, Ar is phenyl or biphenylyl, and the Ar is unsubstituted or substituted with a $C_{1-10}$ alkyl, a photocurable group, or a thermosetting group.

Preferably, the photocurable group, or the thermosetting group is any one selected from the group consisting of:

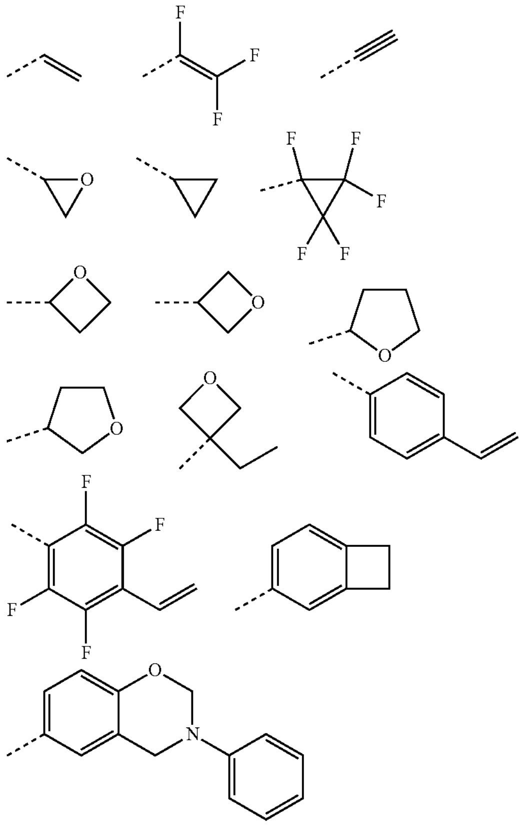

Preferably, the Chemical Formula 3 is any one selected from the group consisting of:

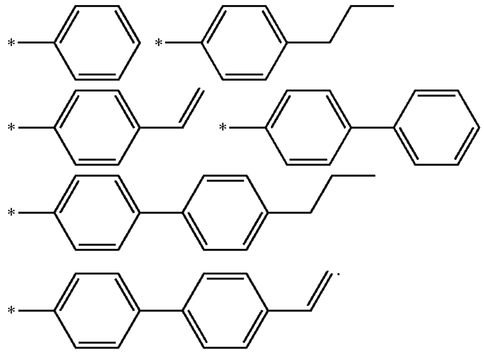

Further, the repeating unit represented by Chemical Formula 3 is derived from a compound represented by the following Chemical Formula 3-1.

Ar—X'' [Chemical Formula 3-1]

wherein, in Chemical Formula 3-1, the remaining substituents excluding X'' are as defined above, and X'' is halogen, preferably bromo, or chloro.

(Polymer)

The polymer according to the present disclosure can be prepared by polymerizing the monomer represented by Chemical Formula 1-1 described above. Further, the polymer according to the present disclosure can be prepared by polymerizing the monomer represented by Chemical Formula 1-1 and the monomer represented by Chemical Formula 2-1. Further, the polymer according to the present disclosure can be prepared by polymerizing the monomer represented by Chemical Formula 1-1, the monomer represented by Chemical Formula 2-1, and the monomer represented by Chemical Formula 3-1. Preferably, the polymer according to the present invention is a random copolymer including the repeating unit.

In the polymer according to the present disclosure, when the repeating unit of Chemical Formula 2 is included, preferably, the repeating unit of Chemical Formula 2 is contained in an amount of 10 to 50 moles based on 100 moles of the repeating unit of Chemical Formula 1. More preferably, the repeating unit of Chemical Formula 2 is contained in an amount of 15 moles or more, 20 moles or more, 25 moles or more, or 30 moles or more, and 45 moles or less, 40 moles or less, or 35 moles or less, based on 100 moles of the repeating unit represented by Chemical Formula 1.

In the polymer according to the present disclosure, when the repeating unit of Chemical Formula 3 is included, preferably, the repeating unit of Chemical Formula 3 is contained in an amount of 20 to 65 moles based on 100 moles of the repeating unit expressed by Chemical Formula 1. More preferably, the repeating unit of Chemical Formula 3 is contained in an amount of 25 moles or more, 30 moles or more, 35 moles or more, or 40 moles or more, and 60 moles or less, or 55 moles or less based on 100 moles of the repeating unit represented by Chemical Formula 1.

Further, the reaction molar ratio of the monomer represented by Chemical Formula 1-1, the monomer represented by Chemical Formula 2-1, and/or the monomer represented by Chemical Formula 3-1 can be adjusted, thereby adjusting the molar ratio of the polymer.

Preferably, the weight average molecular weight (Mw; g/mol) of the polymer is 3,000 to 1,000,000, more preferably 10,000 or more, 20,000 or more, 30,000 or more, 40,000 or more, 50,000 or more, 60,000 or more, 70,000 or more, or 80,000 or more; and 500,000 or less, 400,000 or less, 300,000 or less, 200,000 or less, or 150,000 or less.

Preferably, the number average molecular weight (Mn; g/mol) of the polymer is 3,000 to 1,000,000, more preferably 10,000 or more, 20,000 or more, or 30,000 or more; and 100,000 or less, 90,000 or less, 80,000 or less, 70,000 or less, 60,000 or less, 50,000 or less, or 40,000 or less.

Preferably, the molecular weight distribution (PDI; Mw/Mn) of the polymer is 1.5 to 10, more preferably 2.0 or more, 2.1 or more, 2.2 or more, 2.3 or more, 2.4 or more, or 2.5 or more; 9.0 or less, 8.0 or less, 7.0 or less, 6.0 or less, 5.0 or less, or 4.0 or less.

Preferably, the polymer according to the present disclosure is represented by the following formulas, wherein a1, b1 and c1 represent the above-mentioned molar ratios:

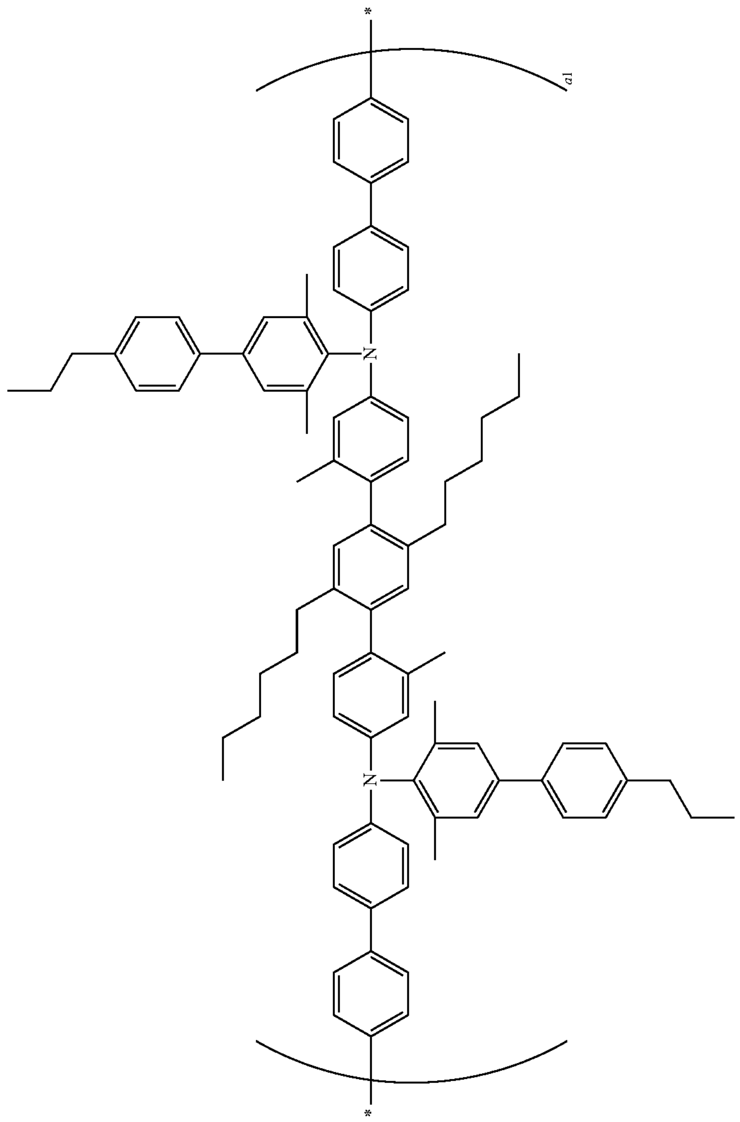

-continued
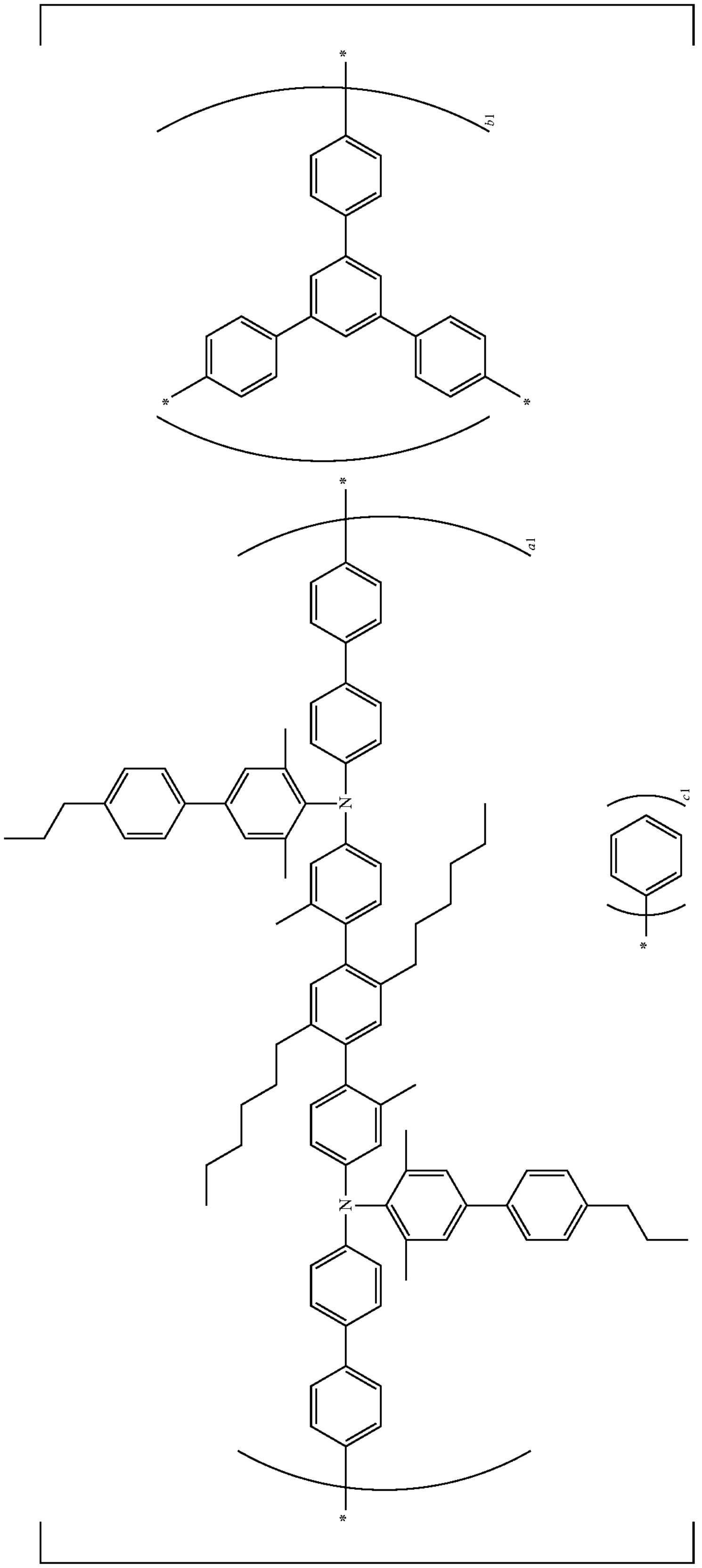

-continued
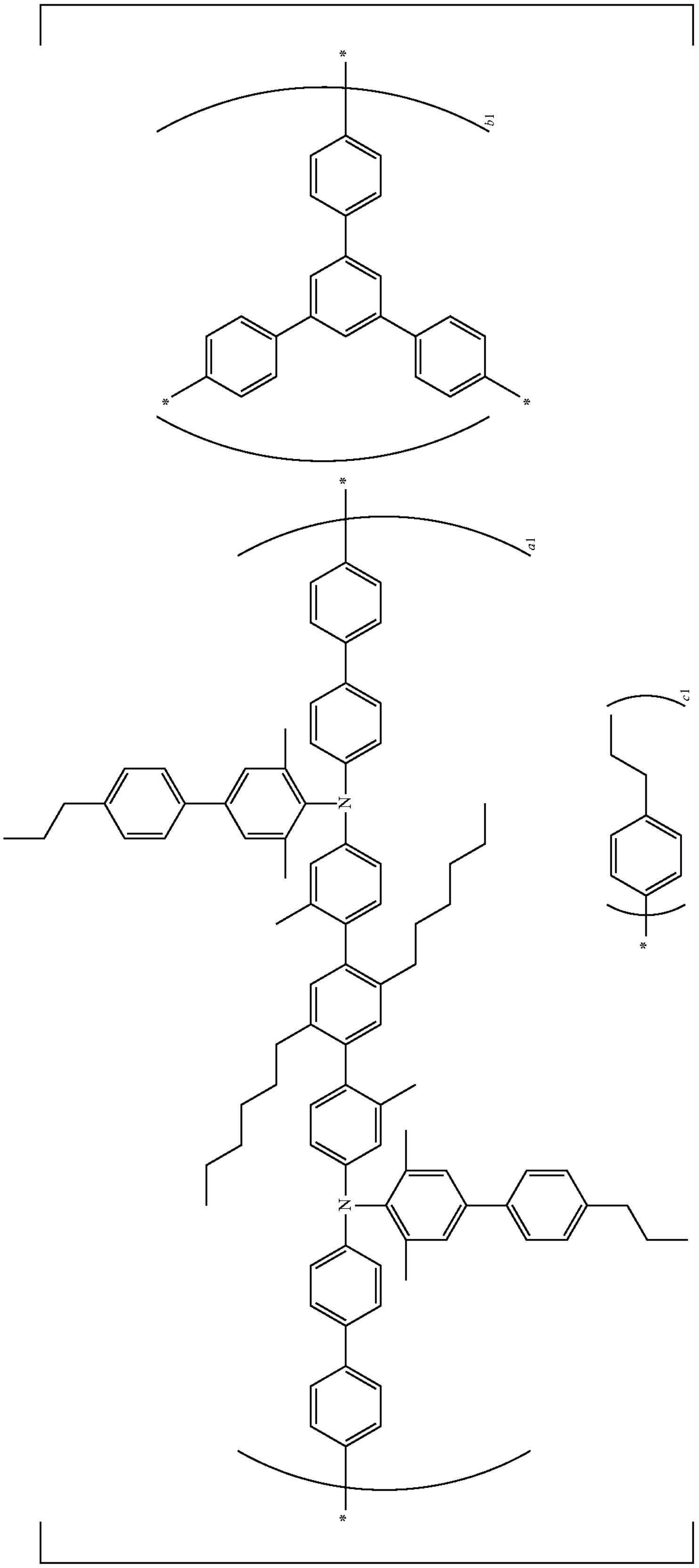

-continued
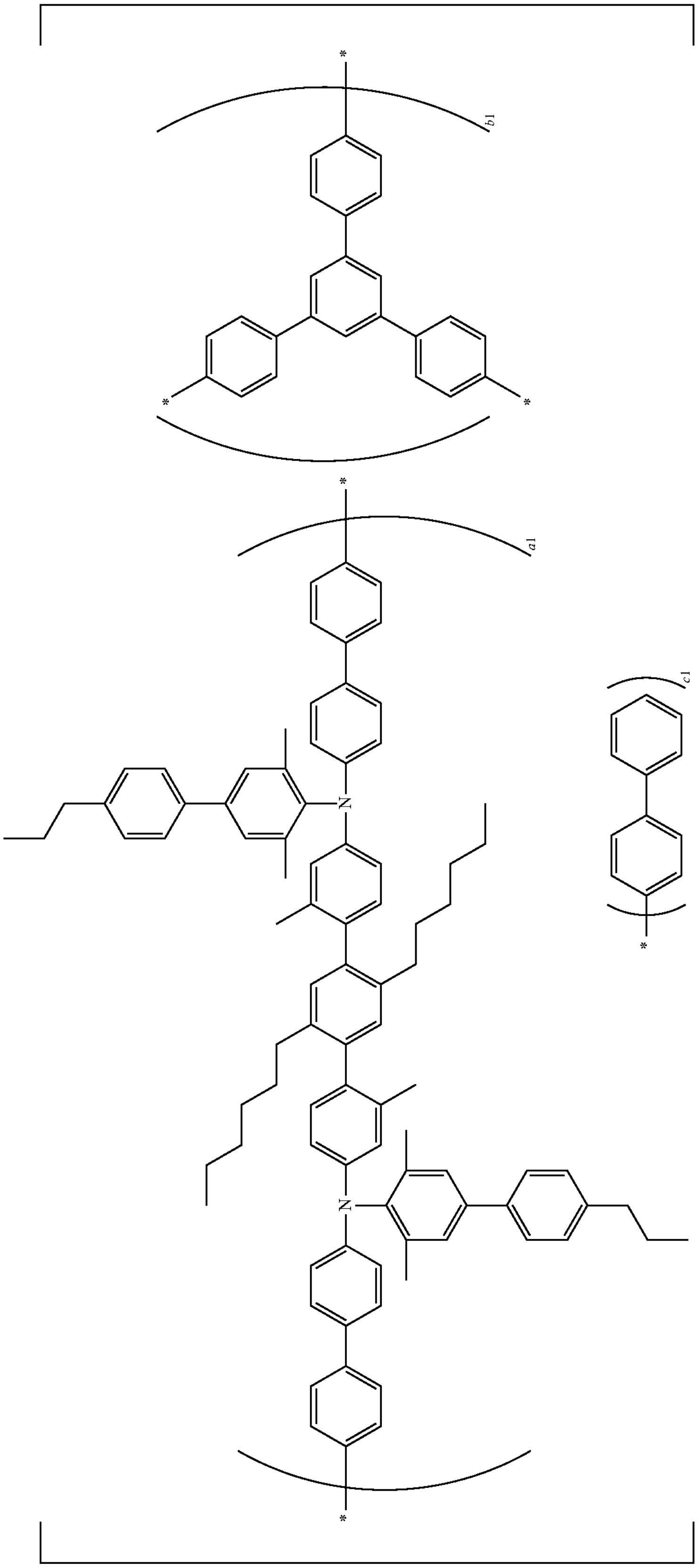

-continued
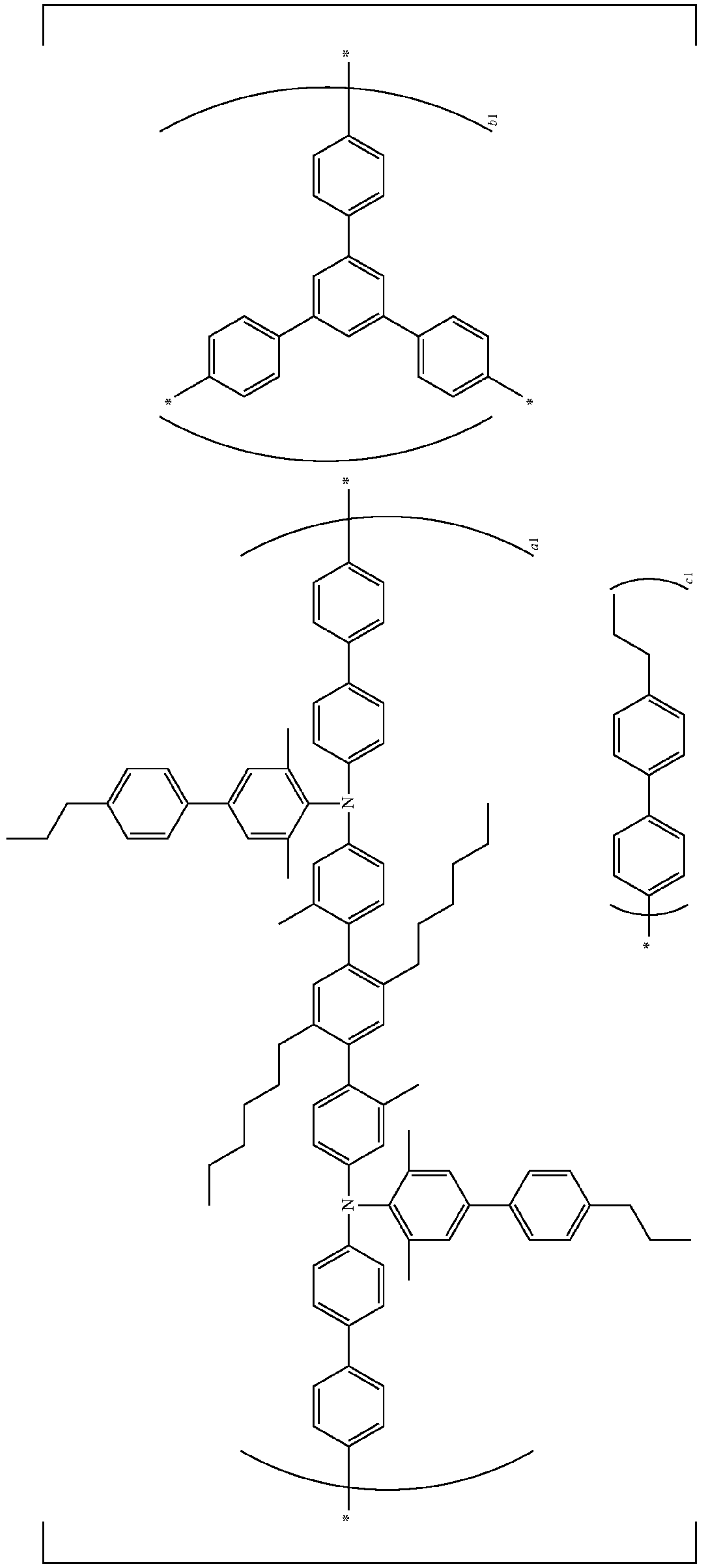

-continued
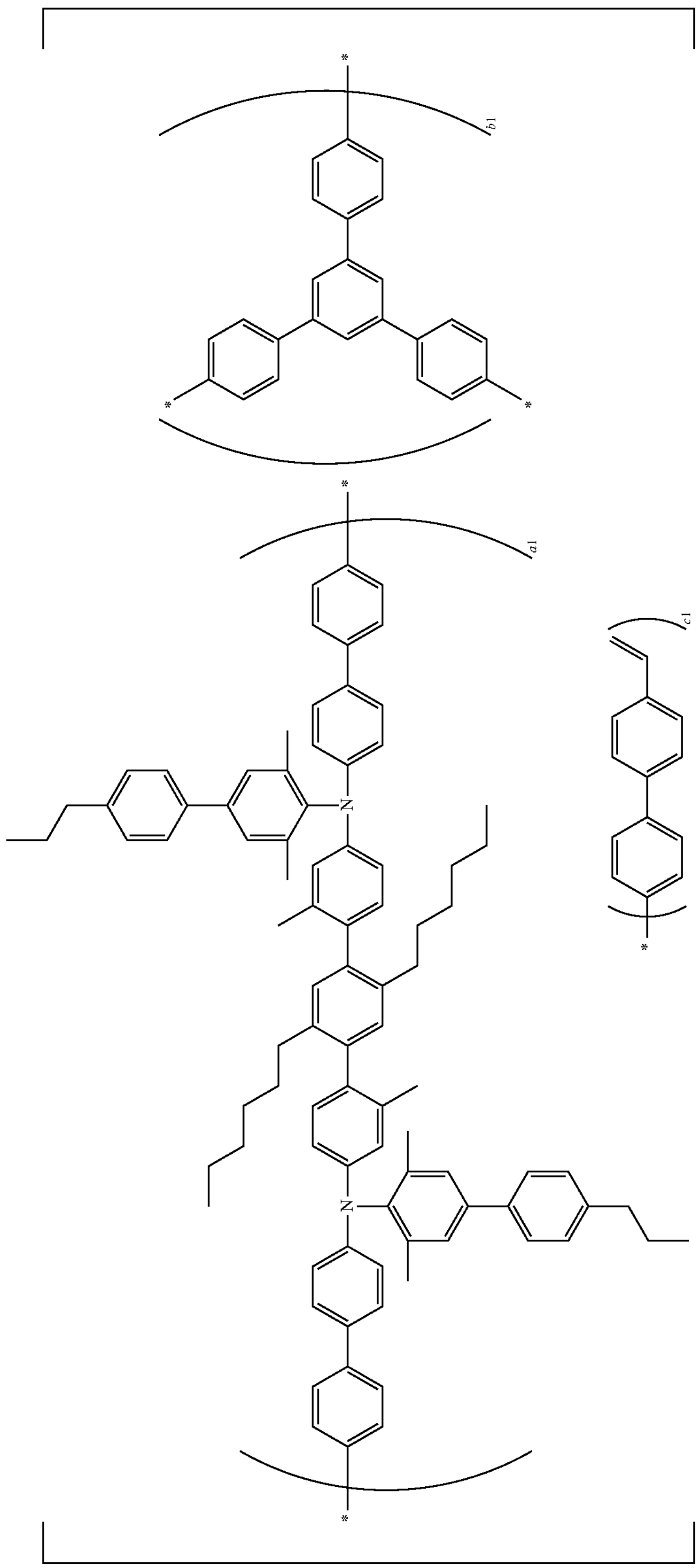

-continued
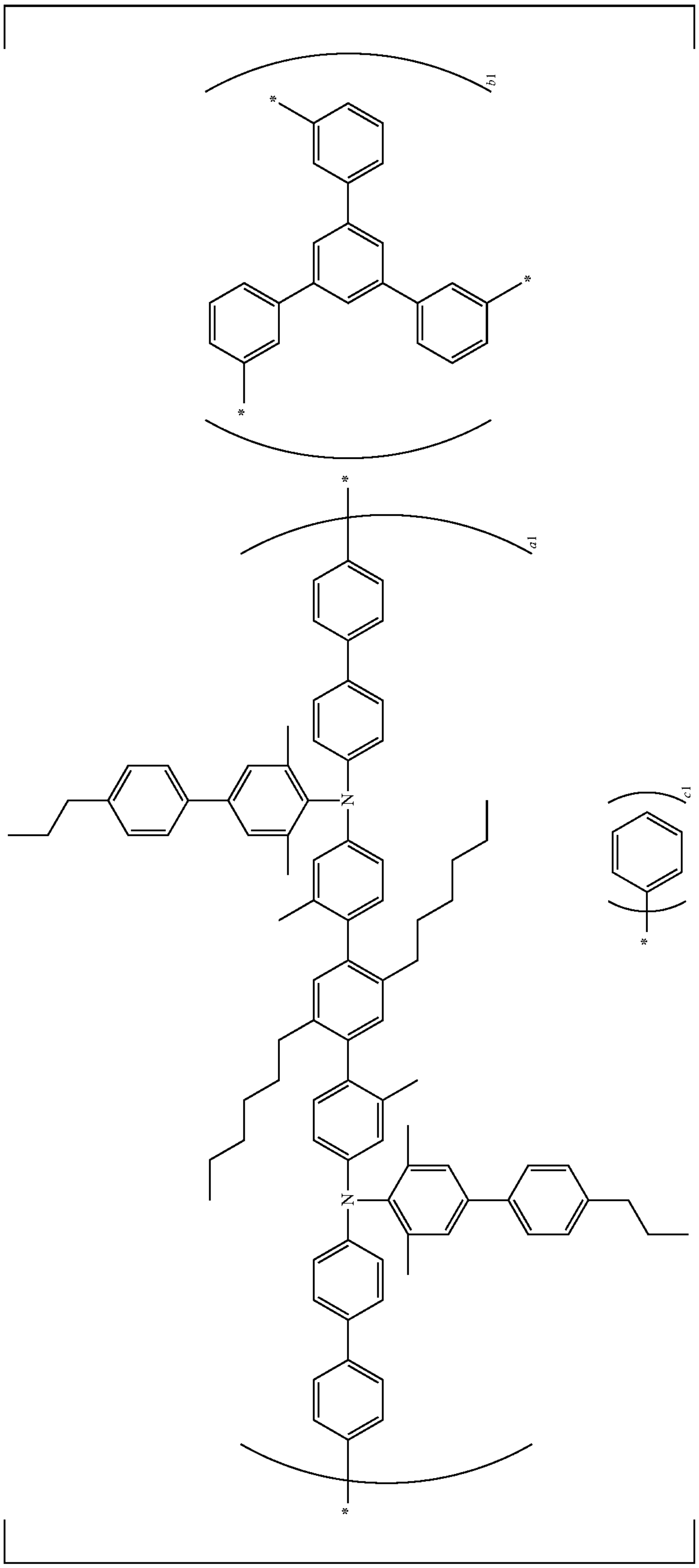

-continued
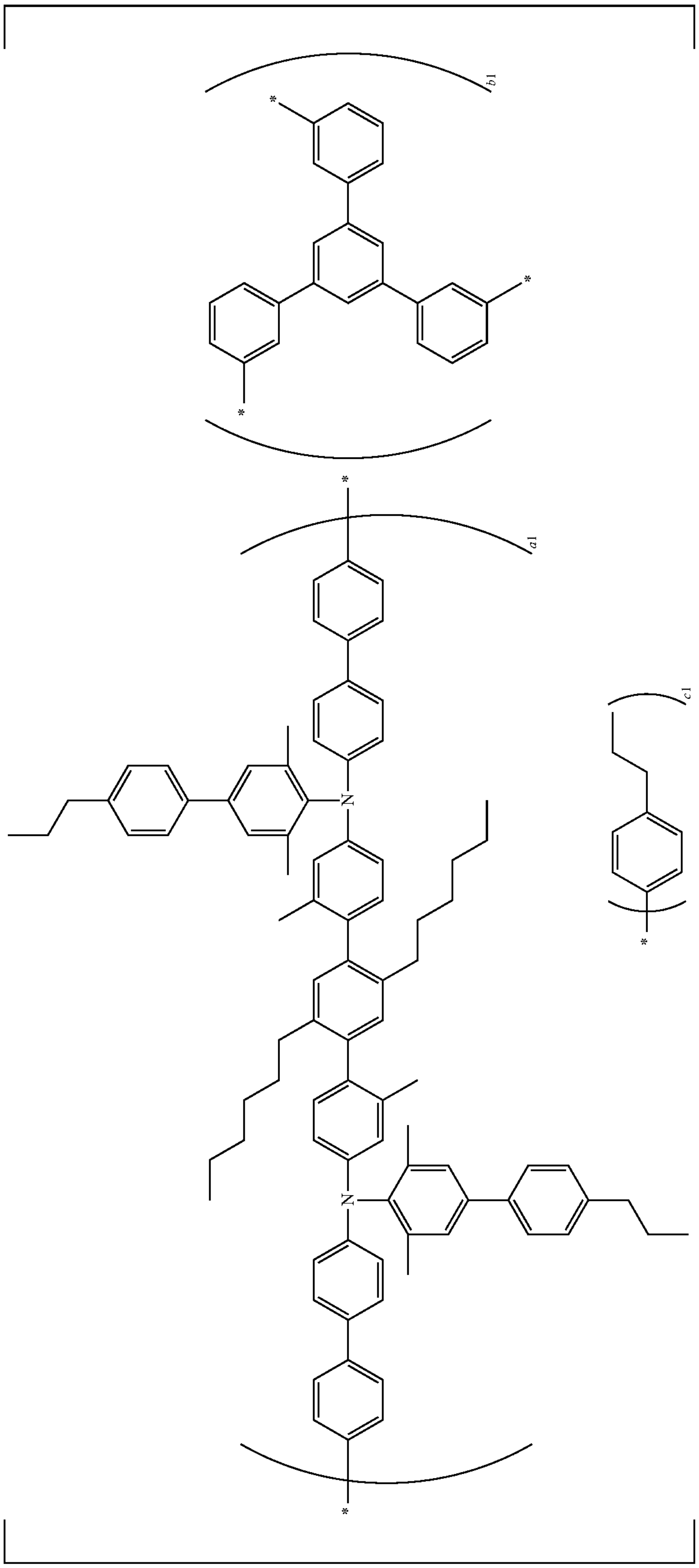

-continued
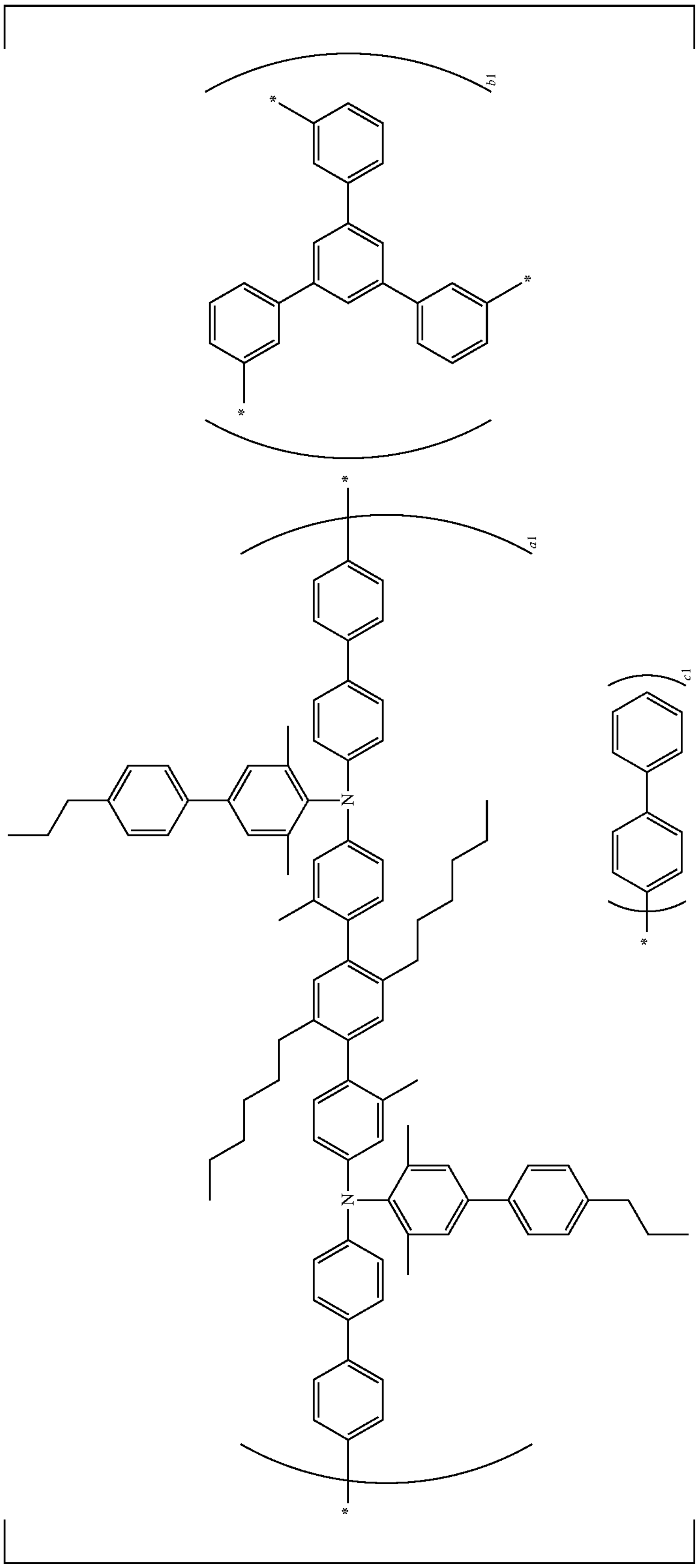

-continued
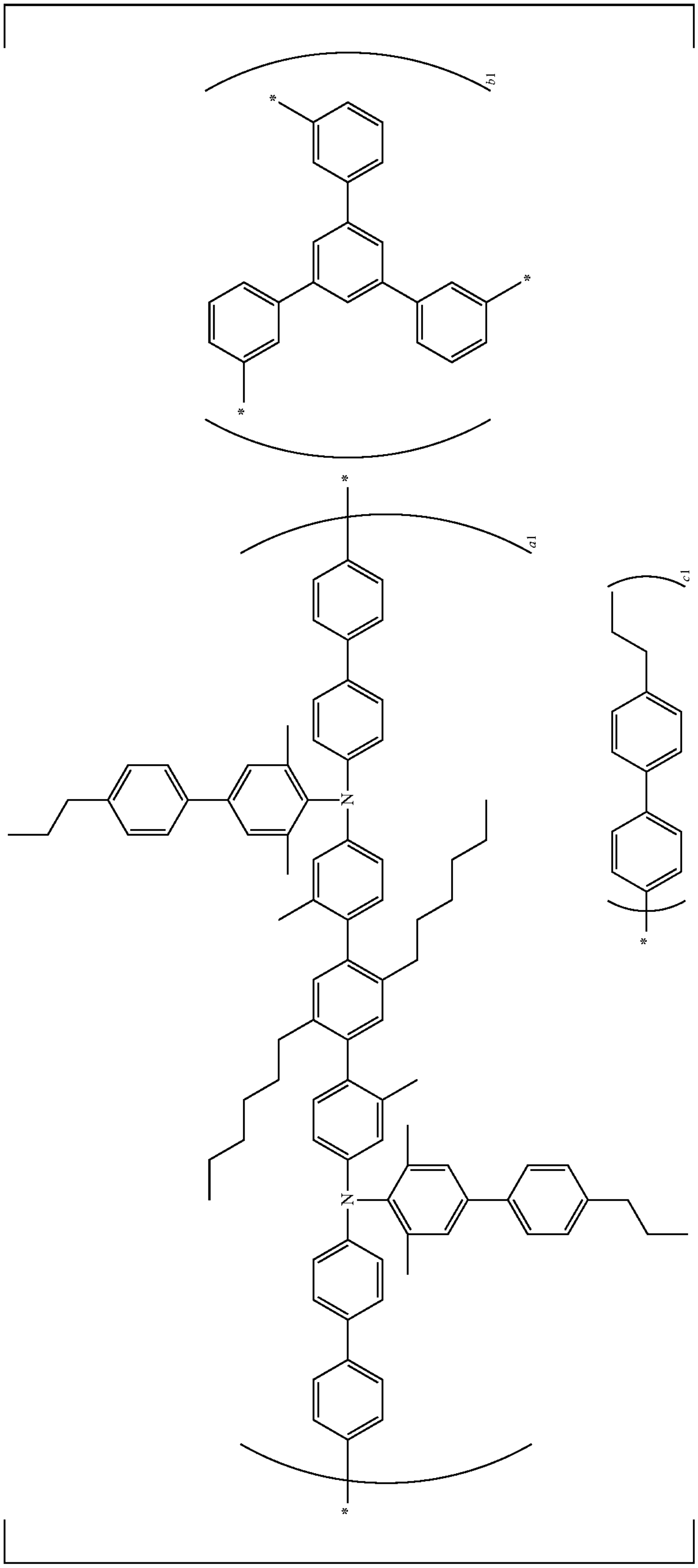

-continued
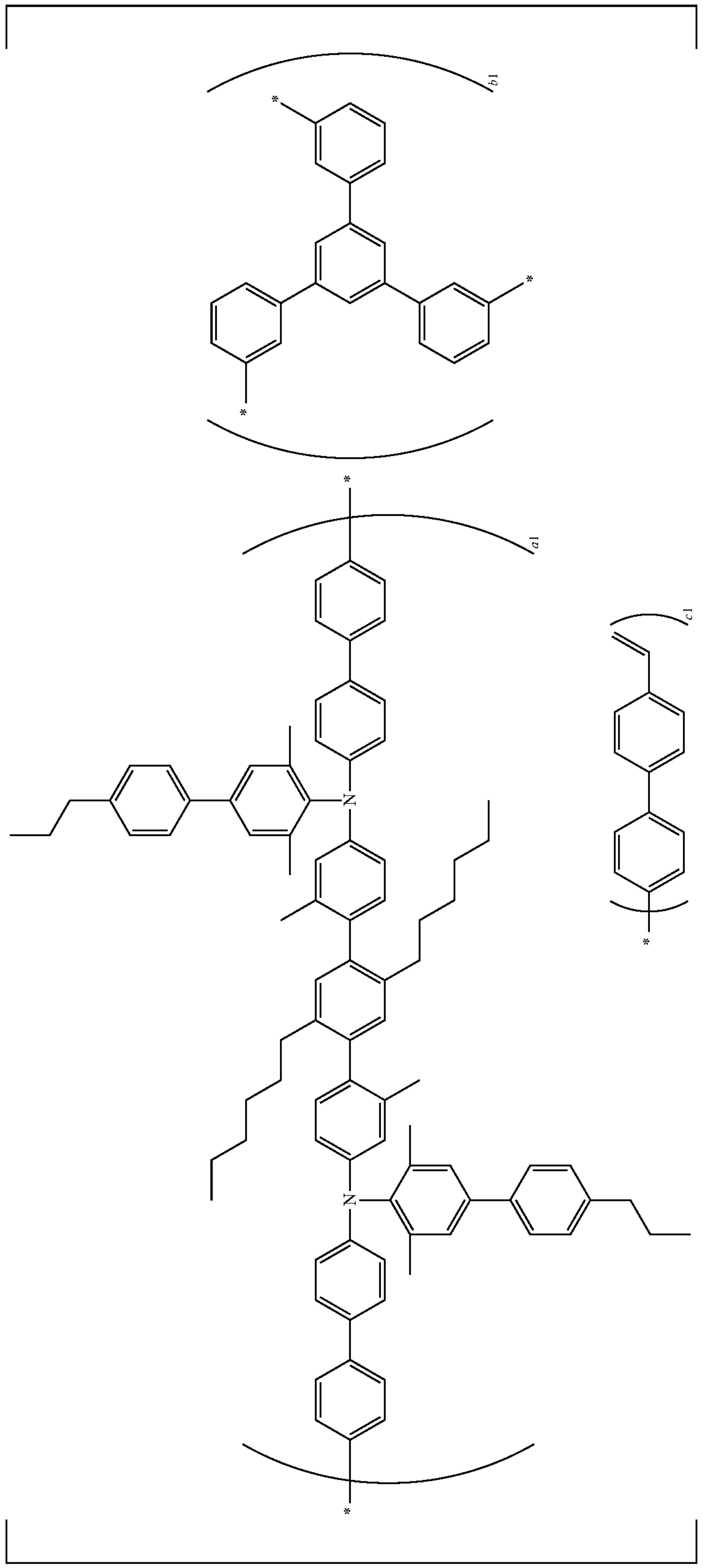

-continued
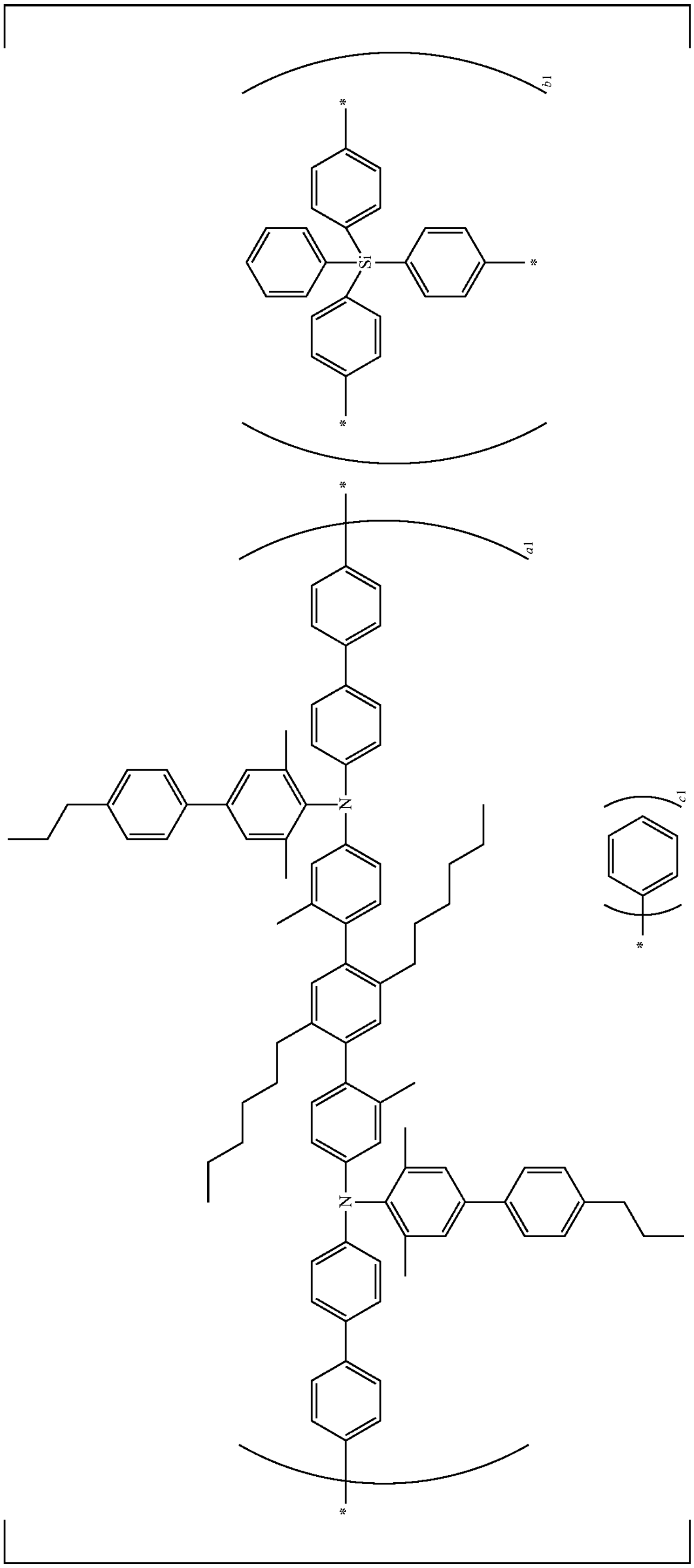

-continued
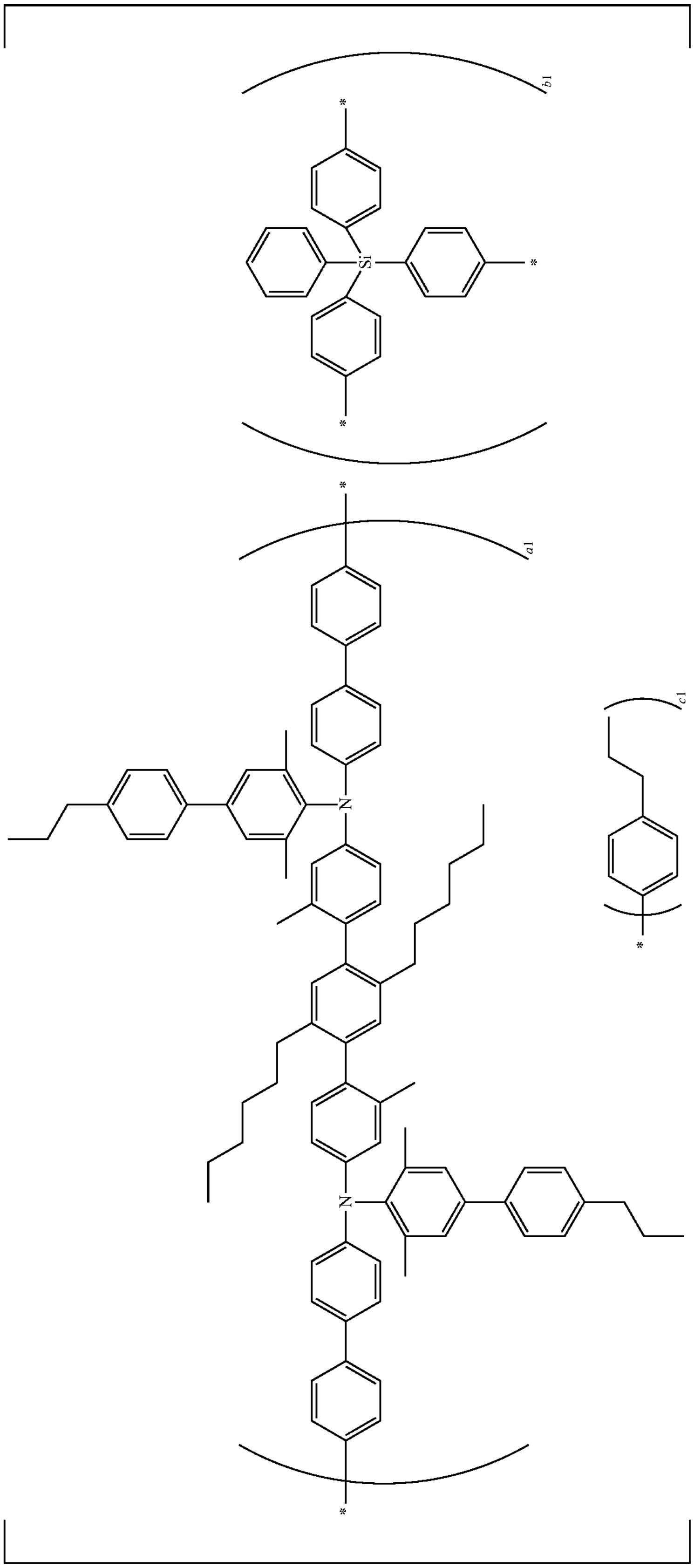

-continued
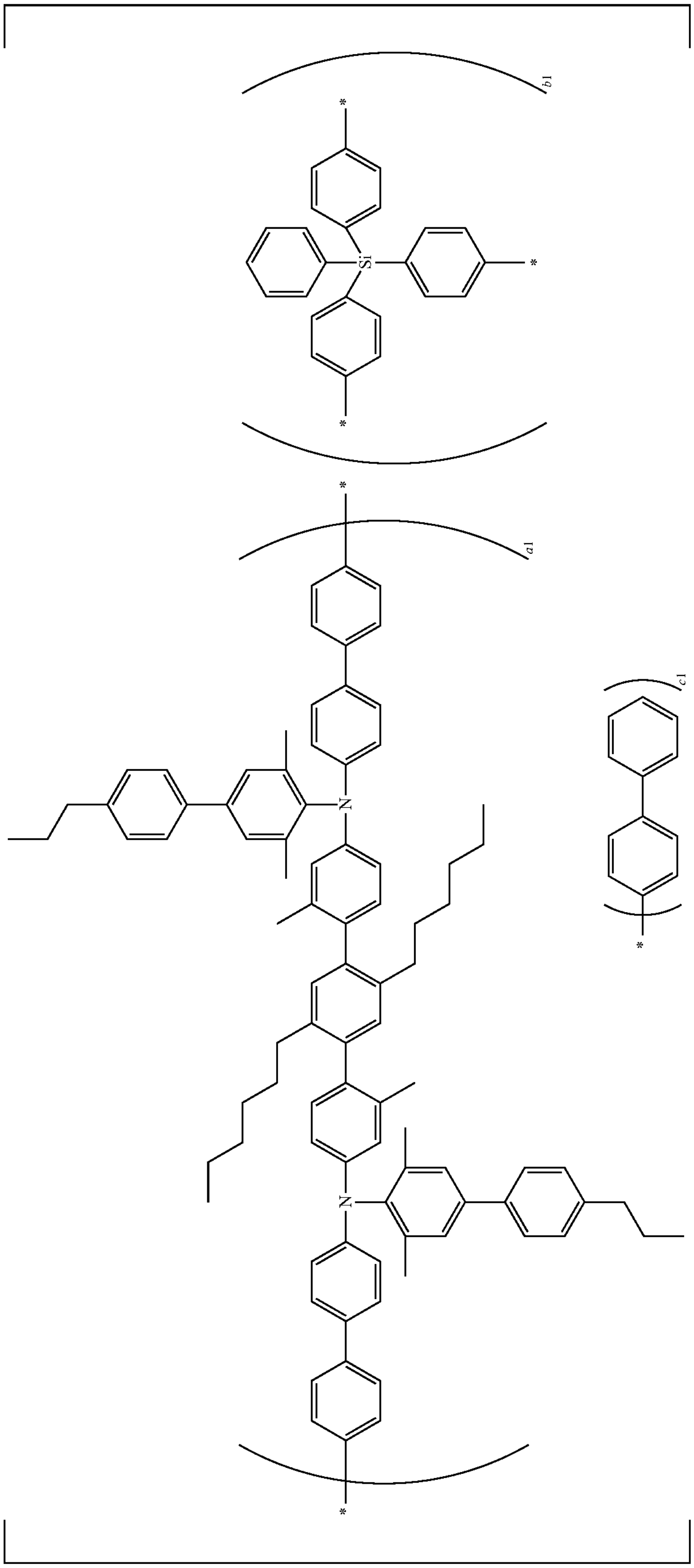

-continued
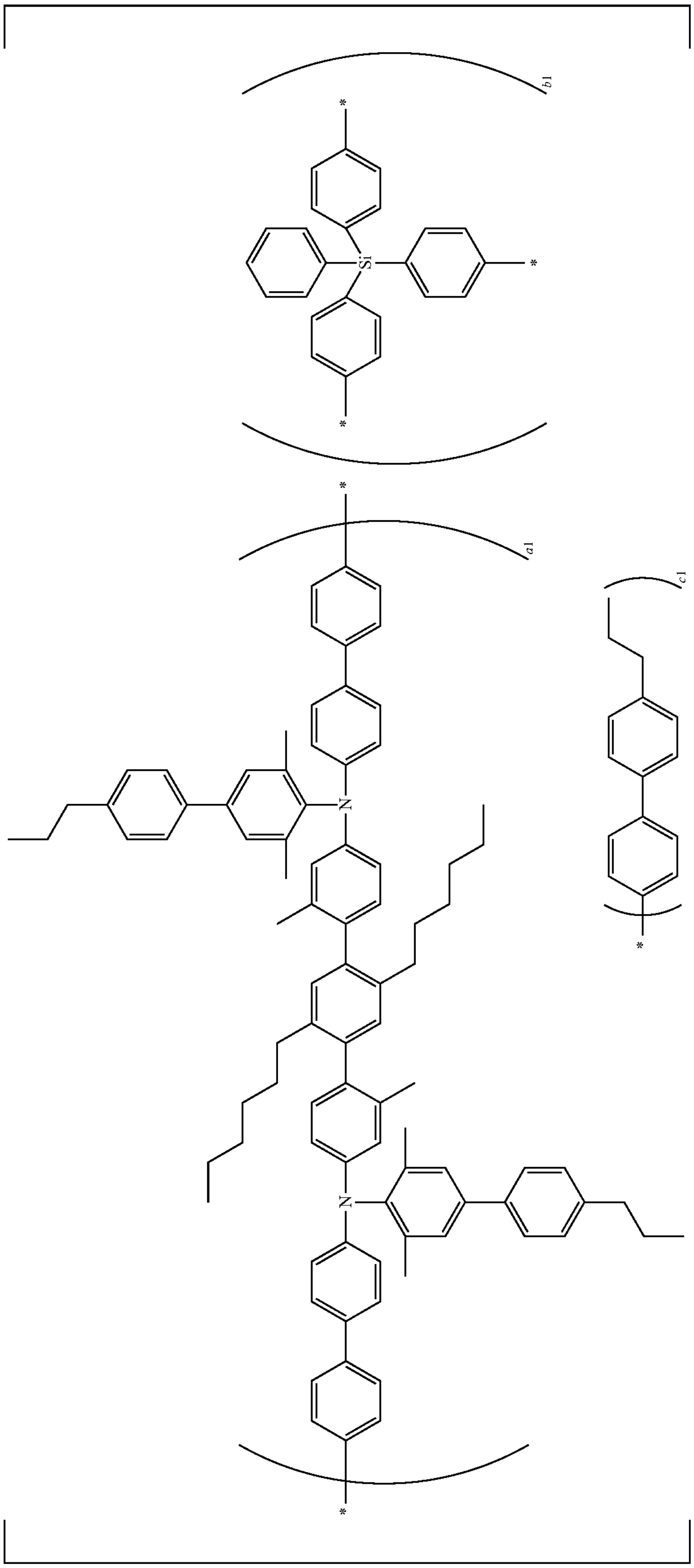

-continued
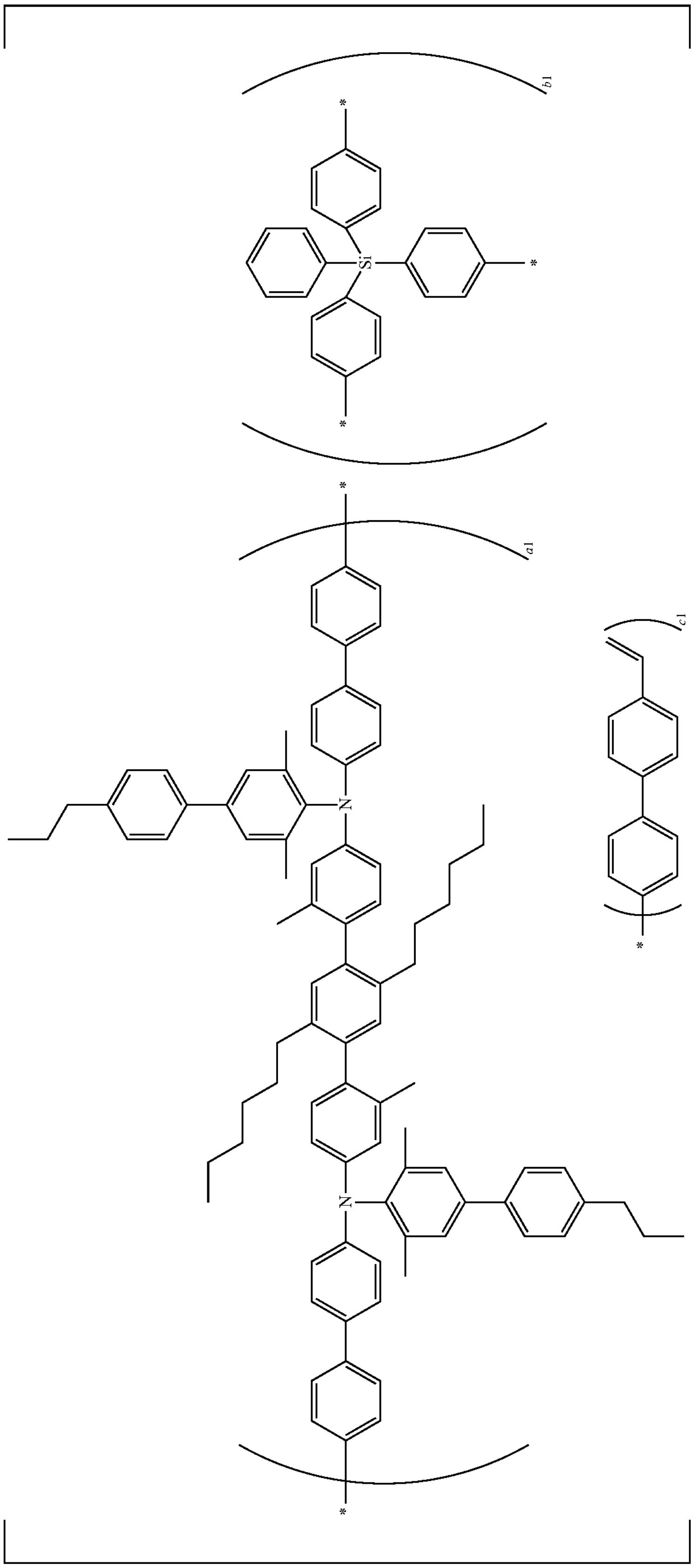

-continued
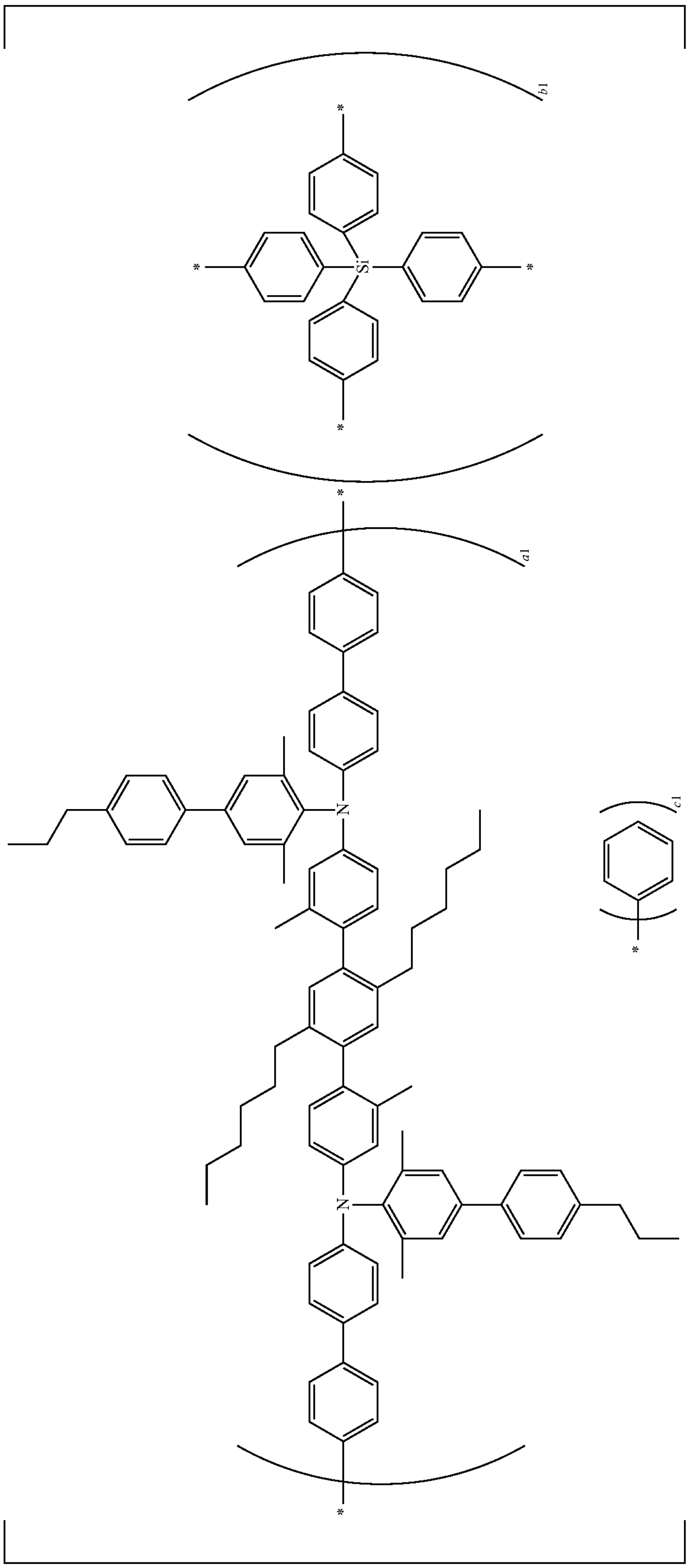

-continued
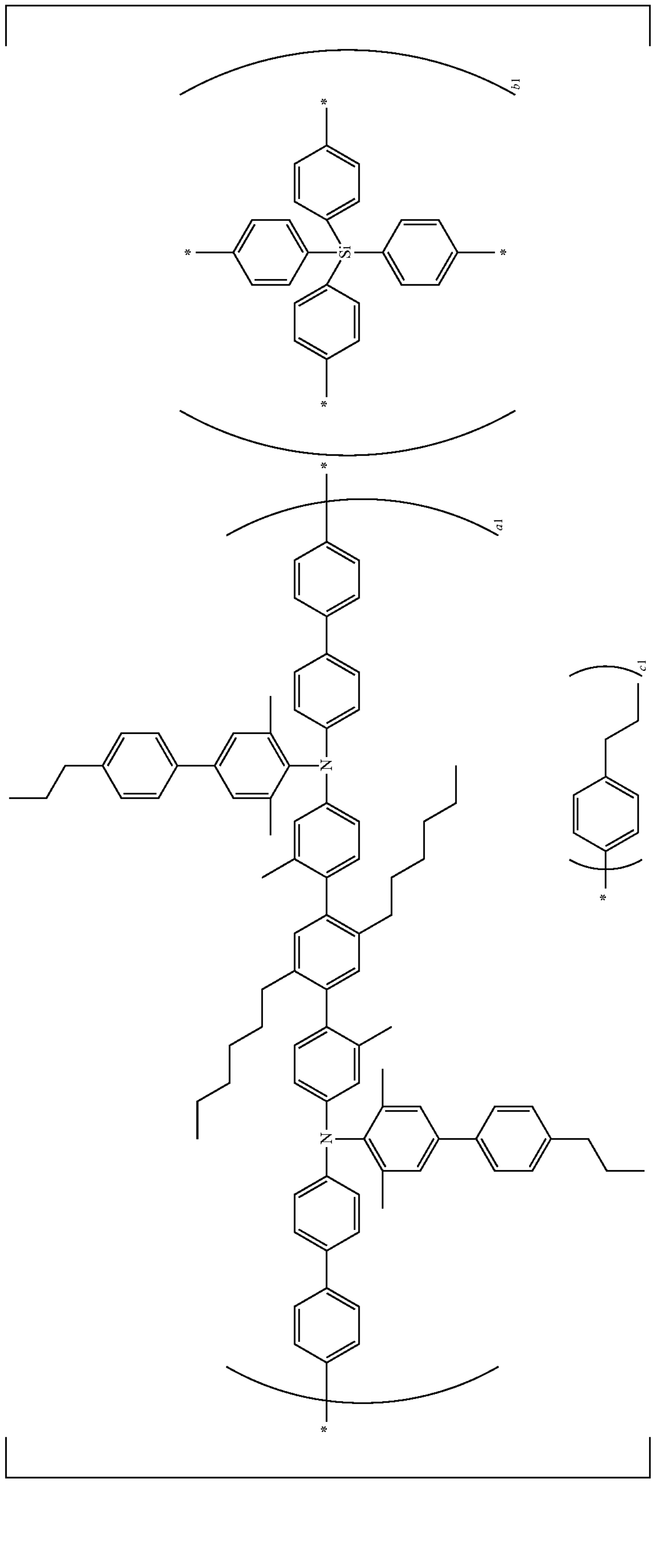

-continued
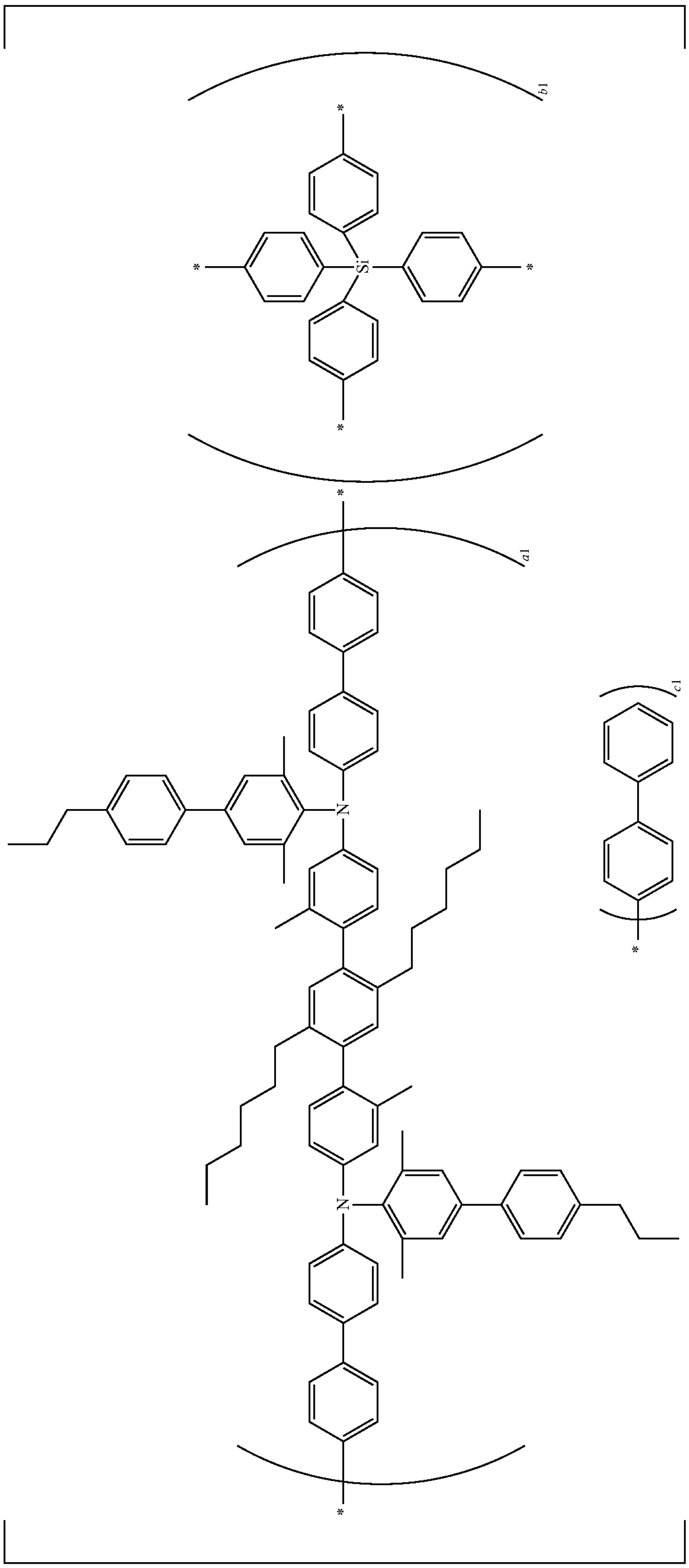

-continued
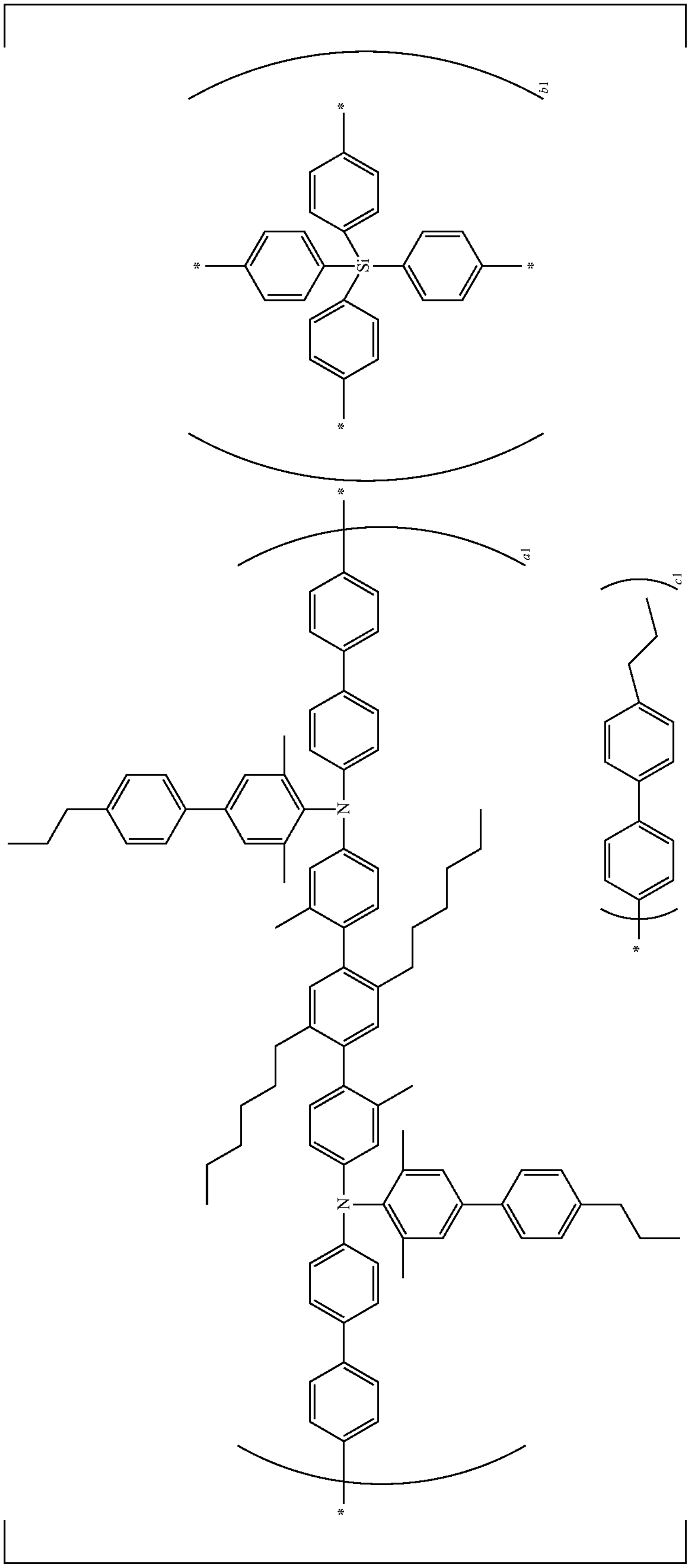

-continued
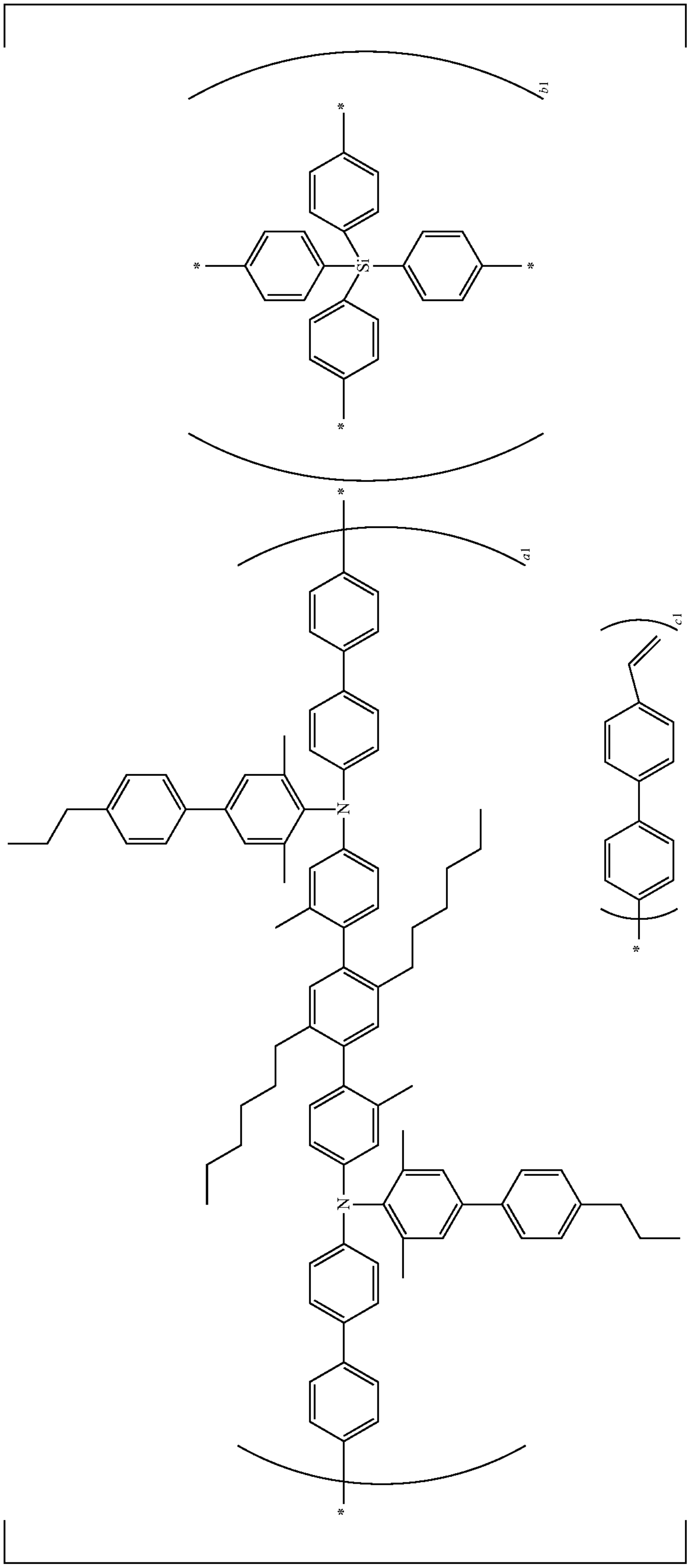

-continued
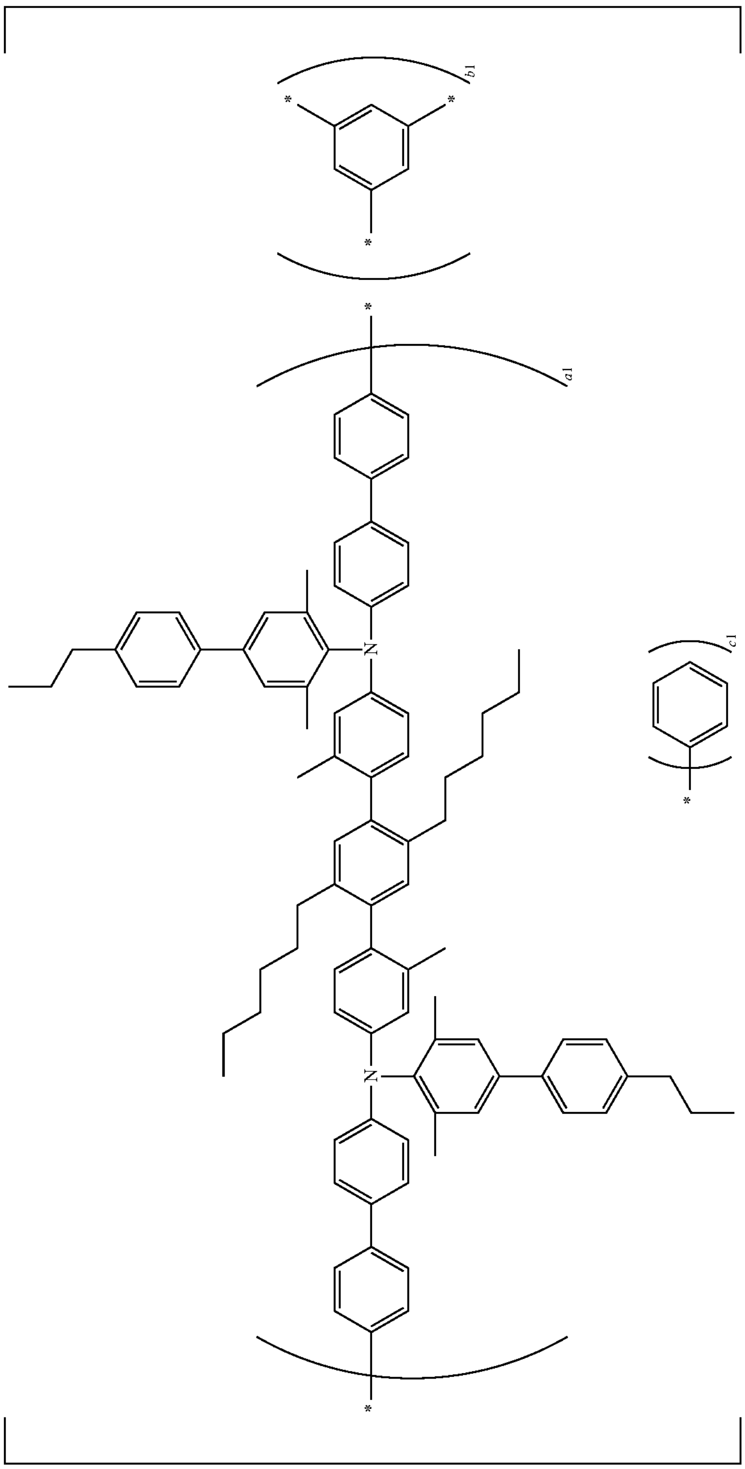

-continued
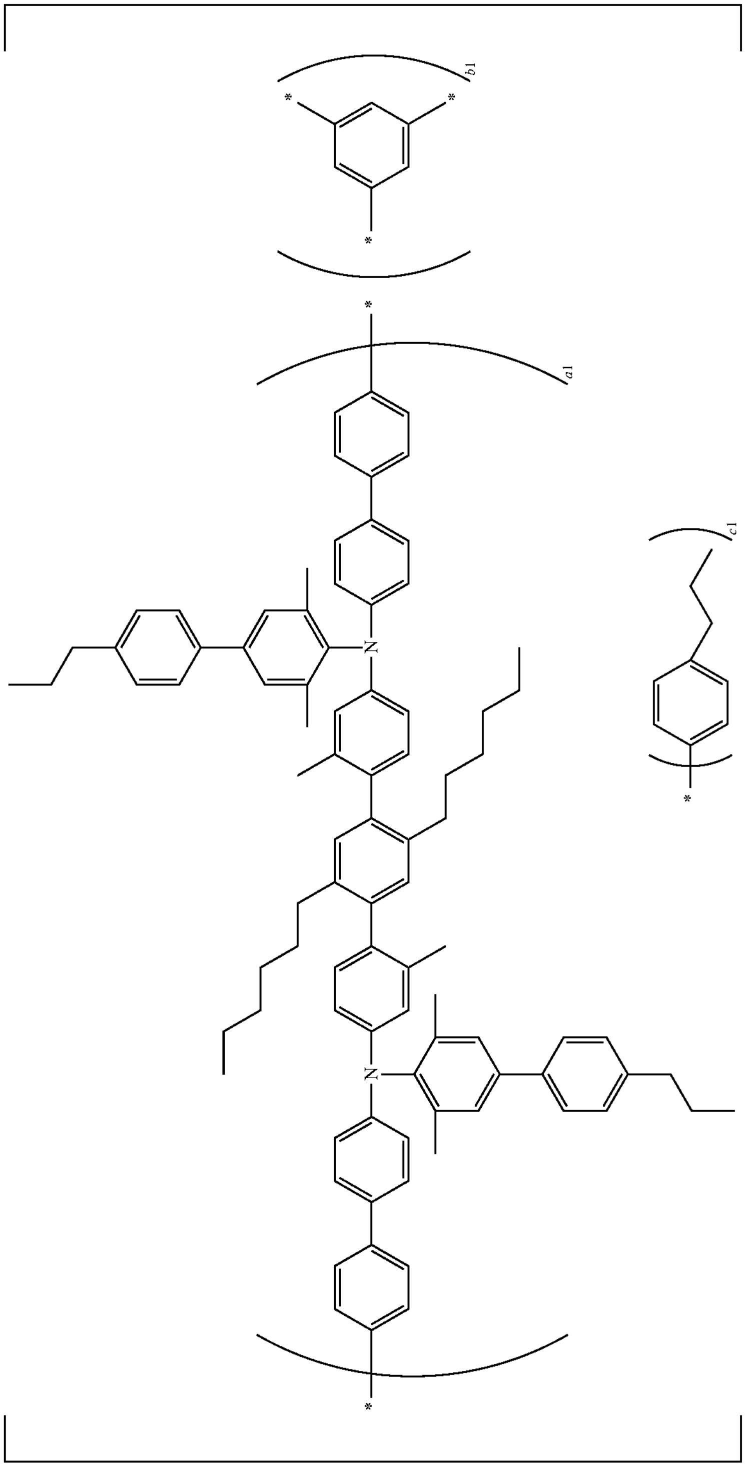

-continued
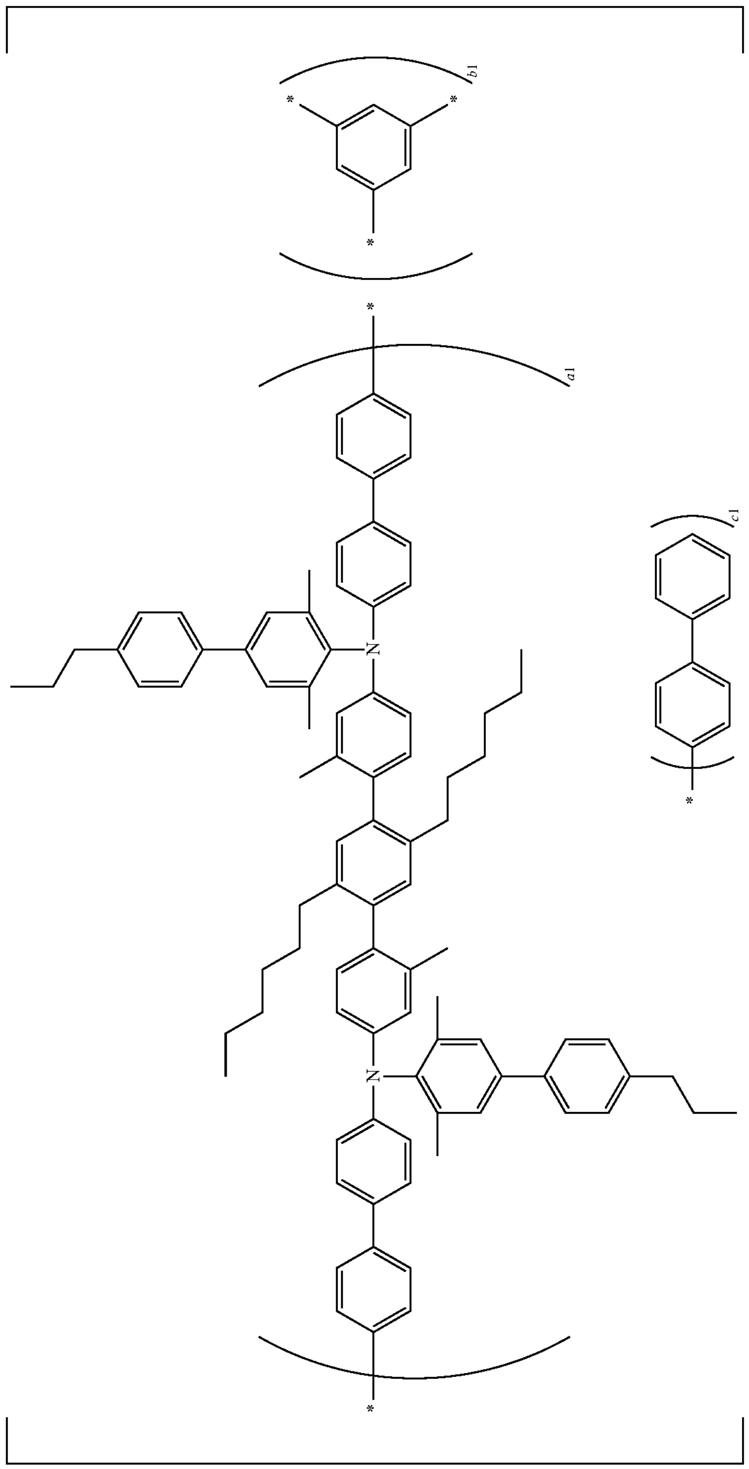

-continued
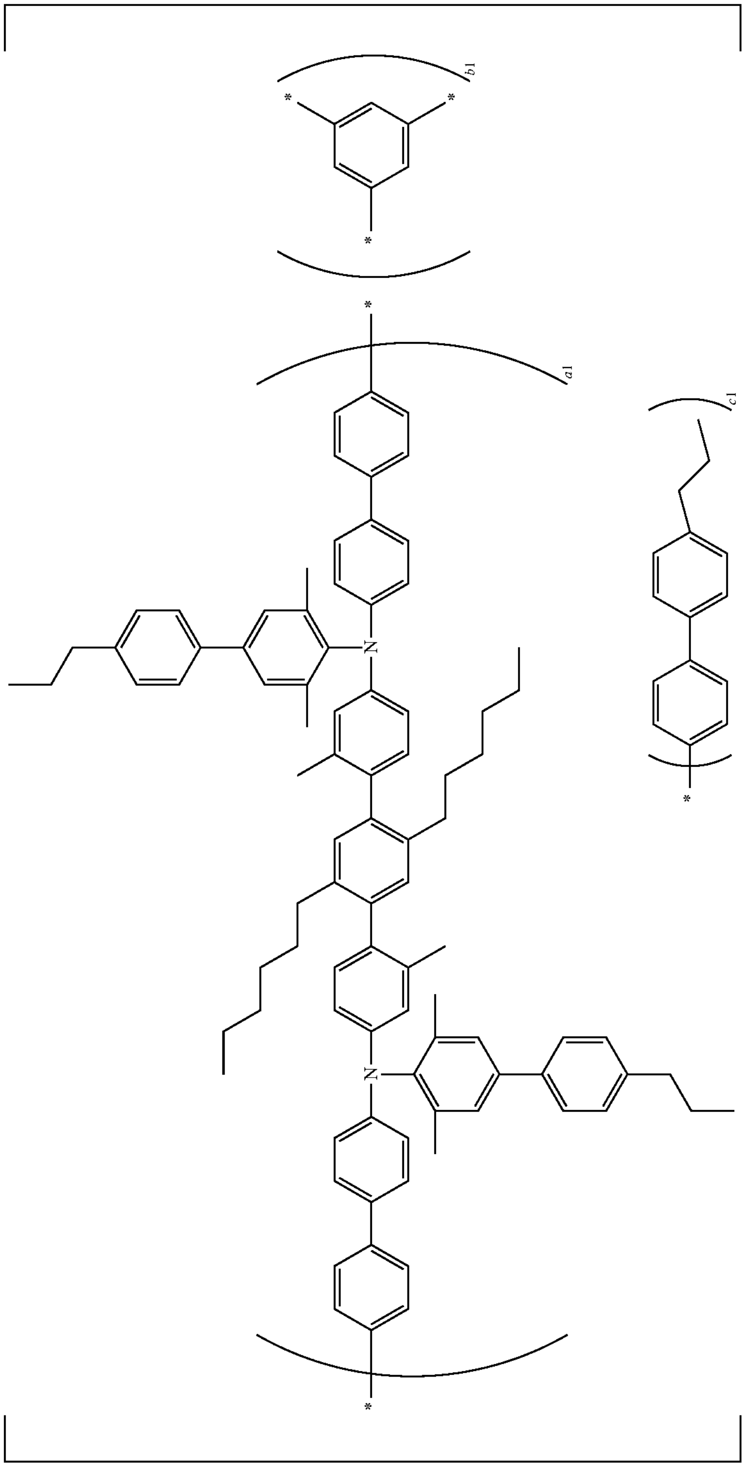

-continued
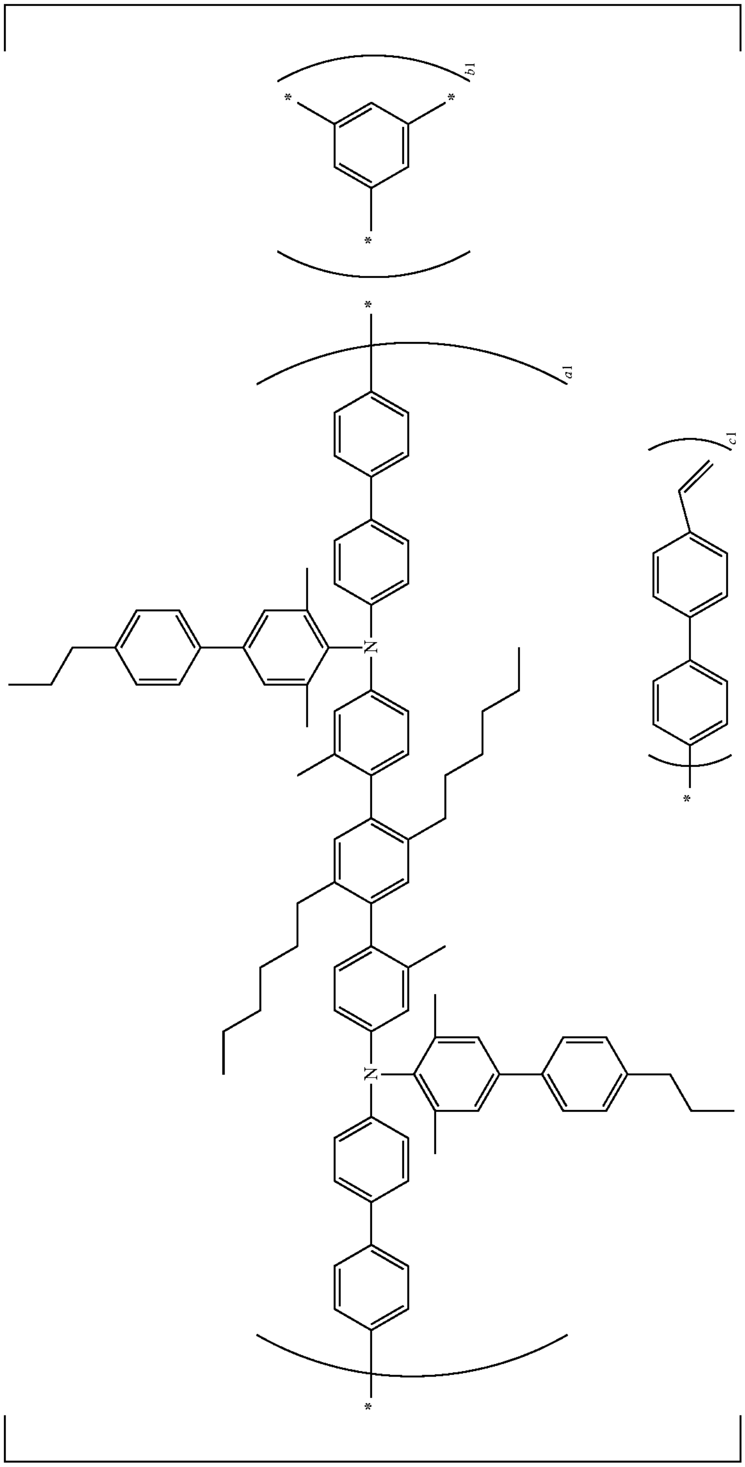

-continued
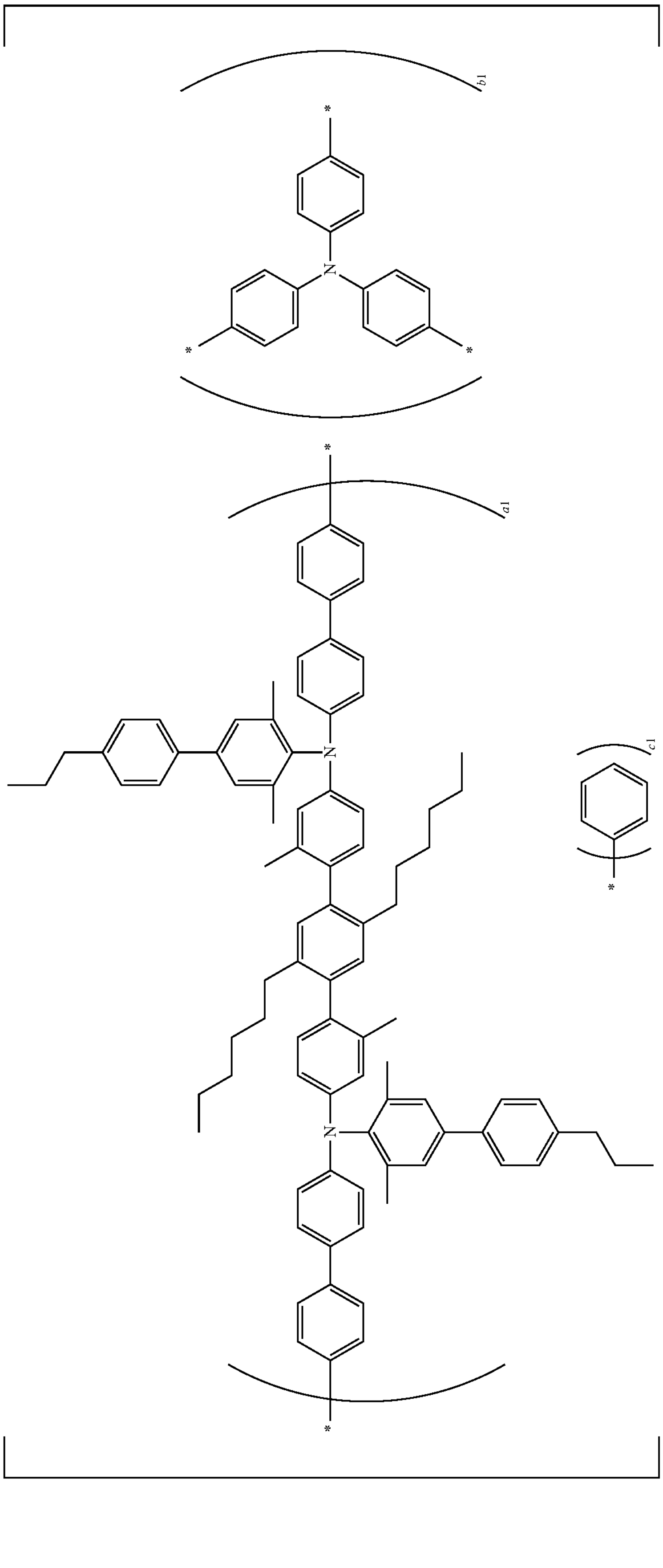

-continued
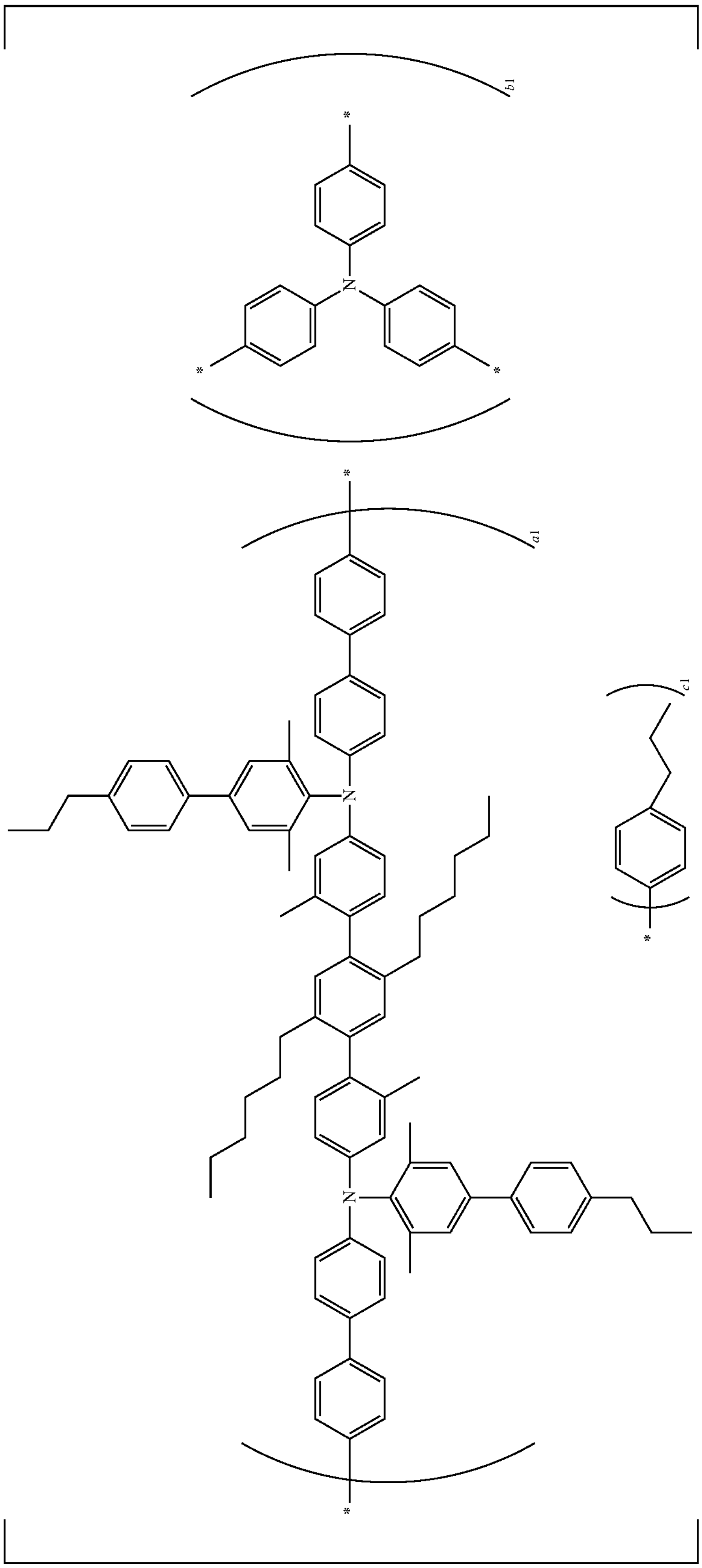

-continued
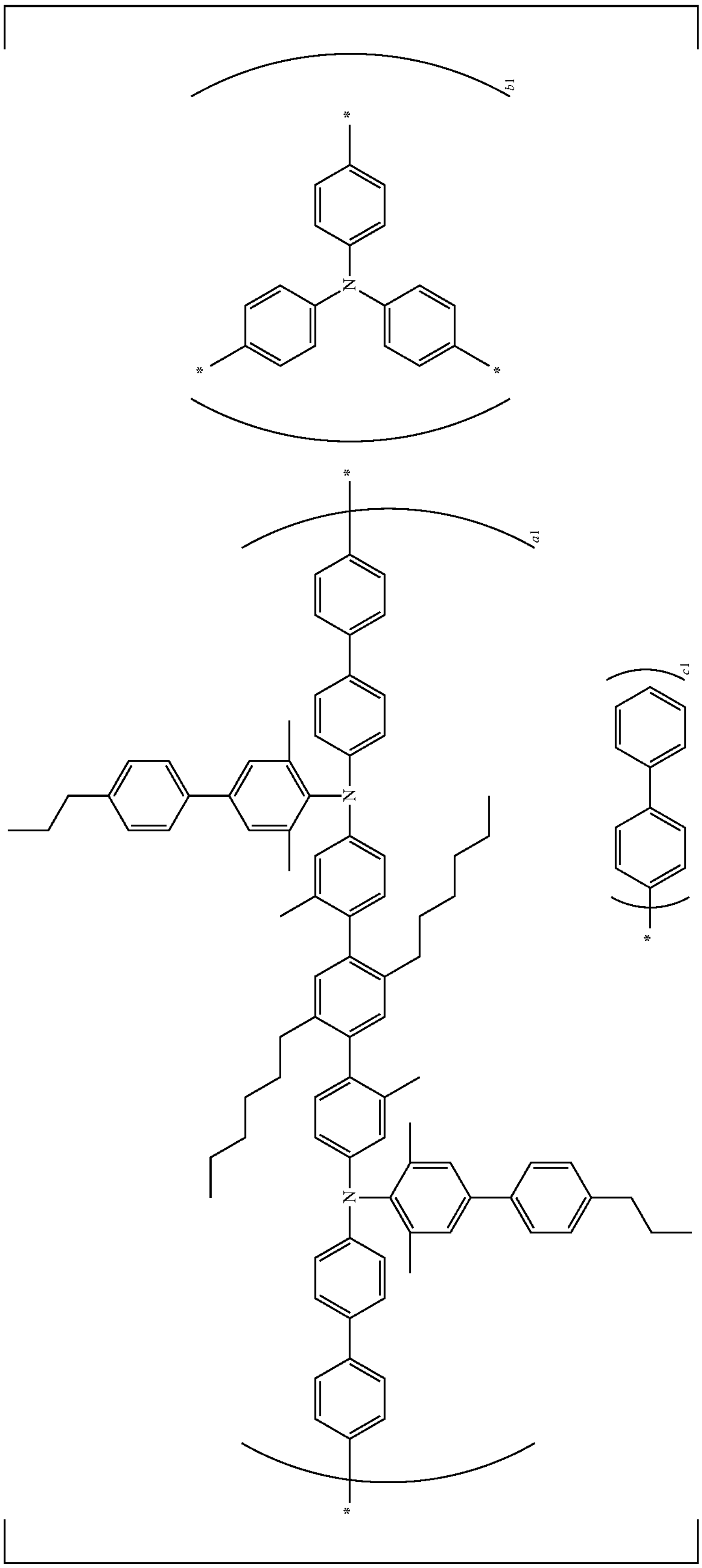

-continued
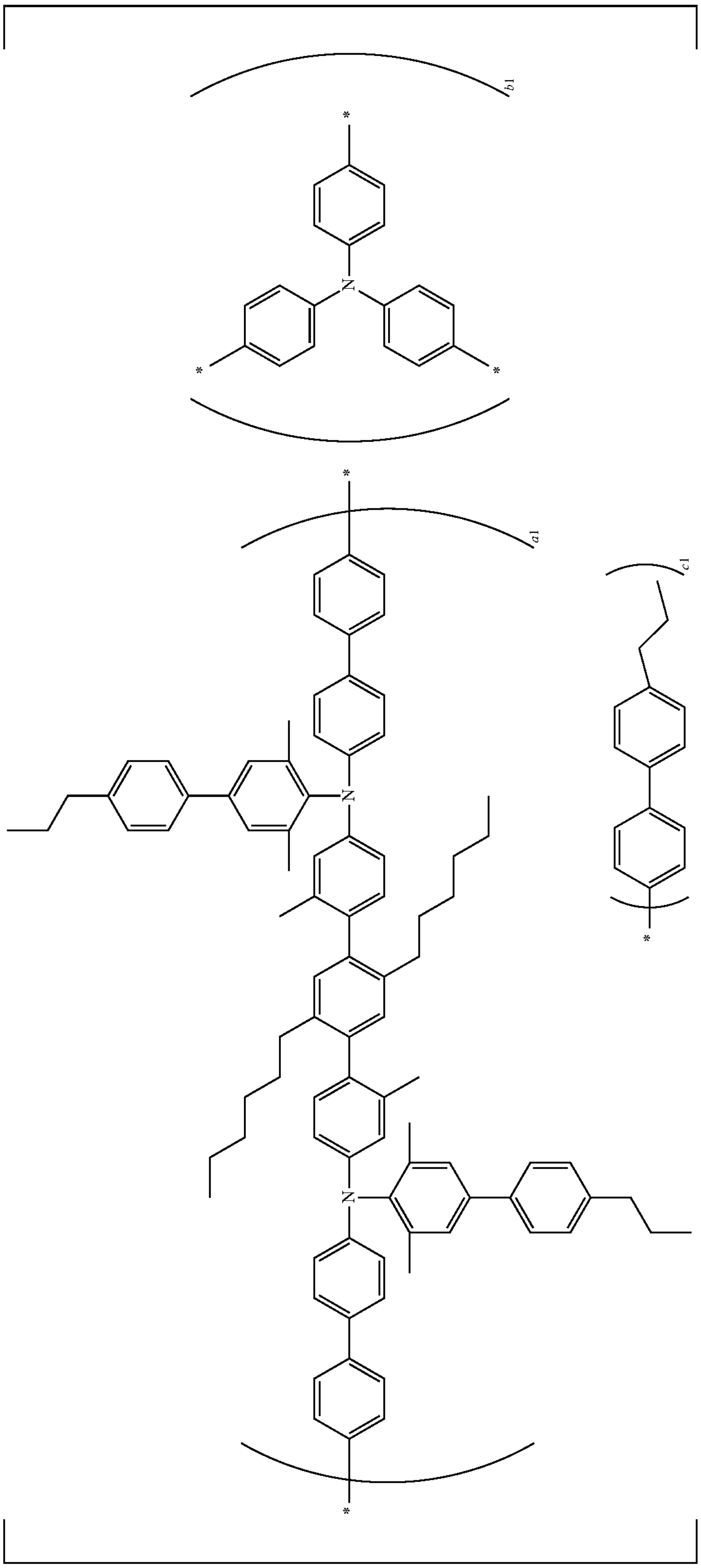

-continued
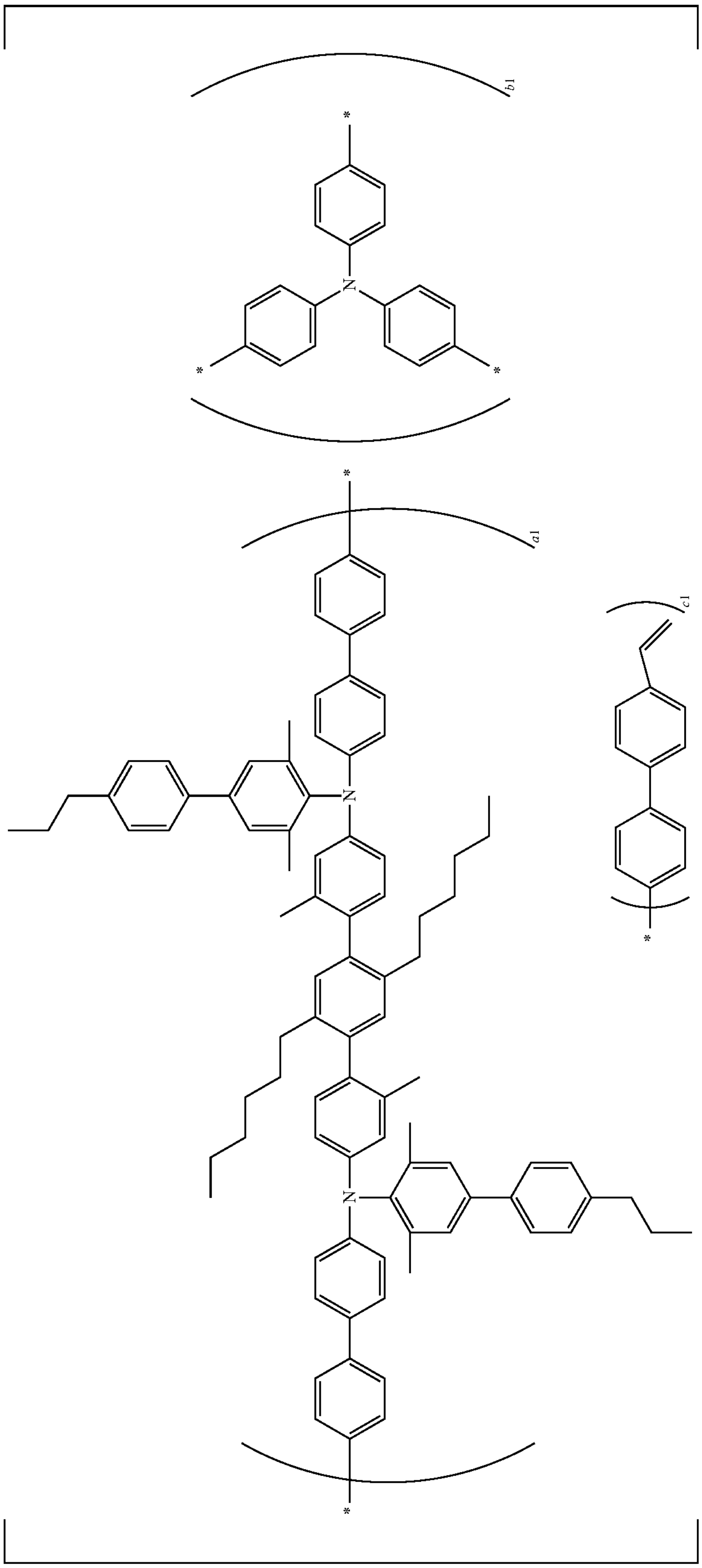

-continued
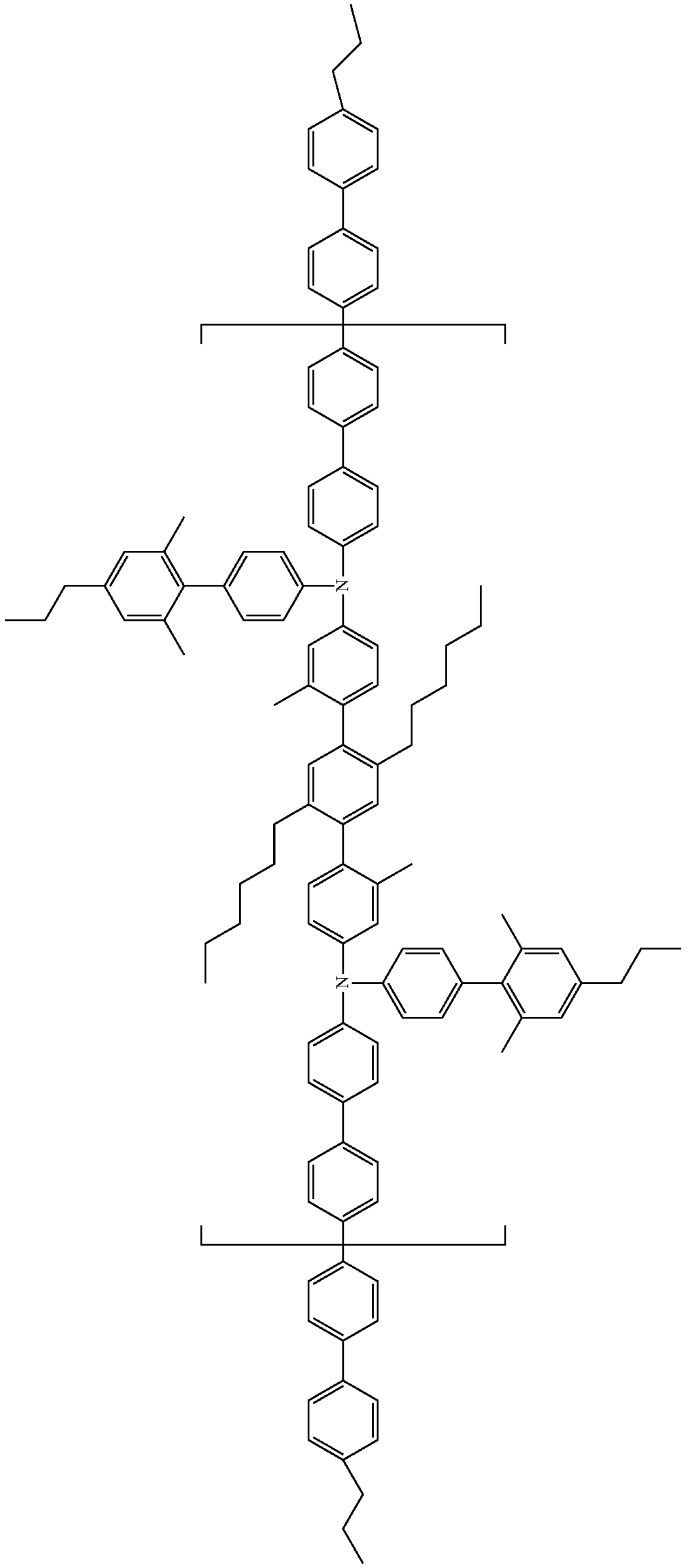

-continued
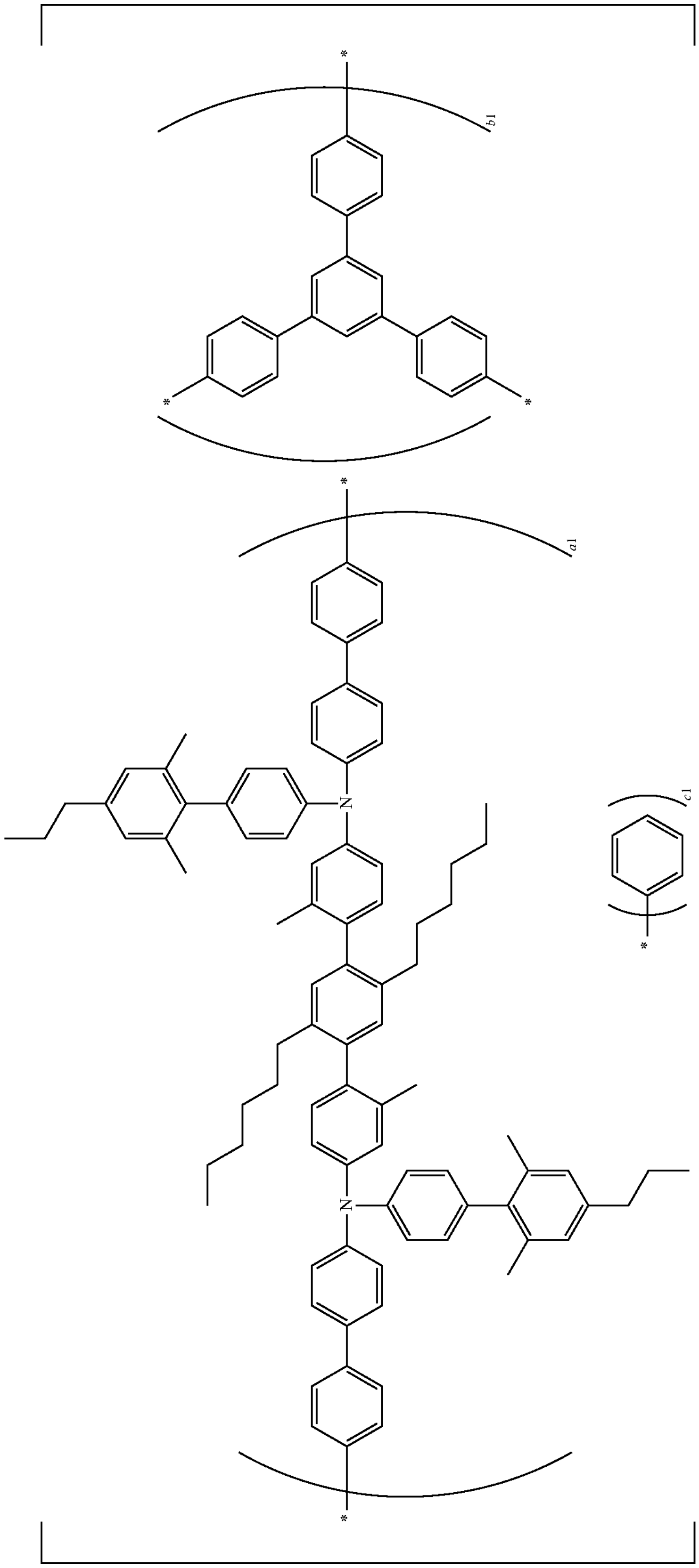

-continued
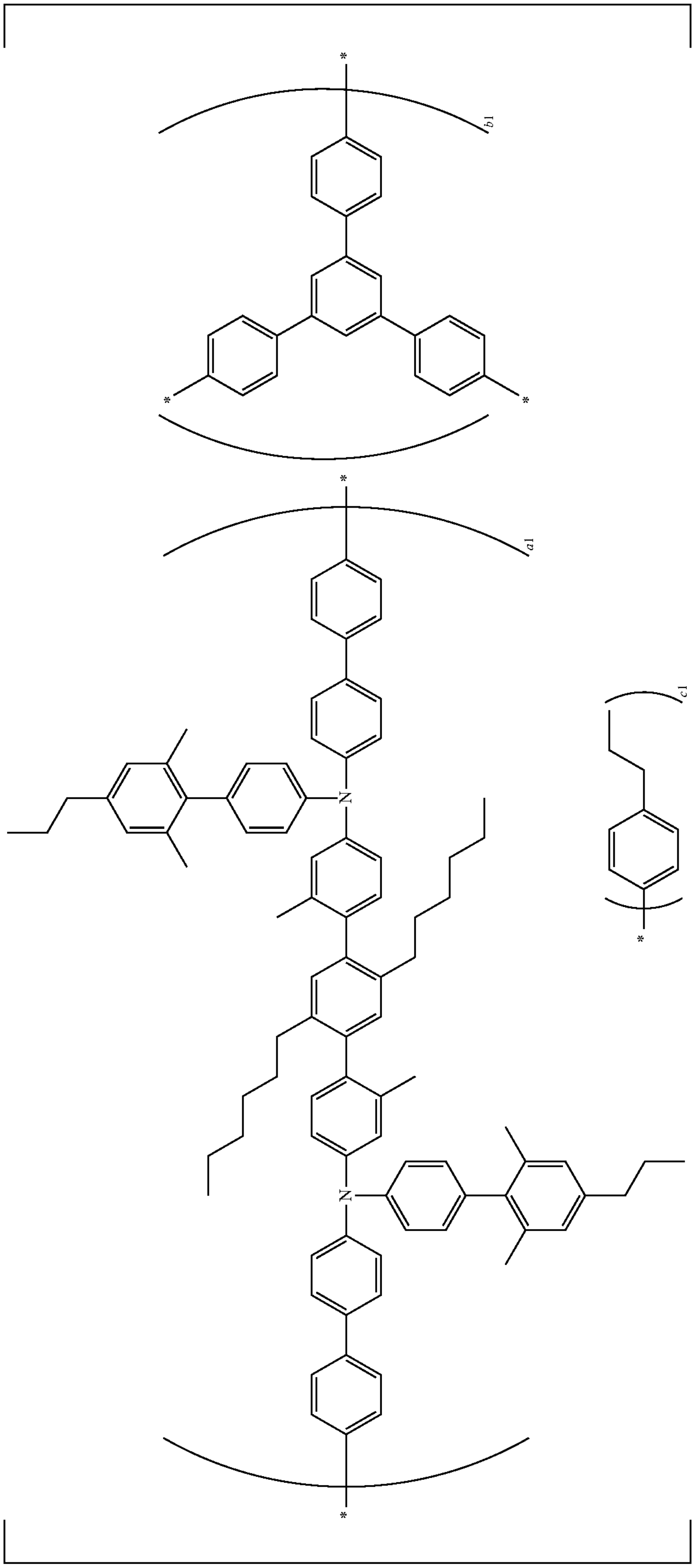

-continued
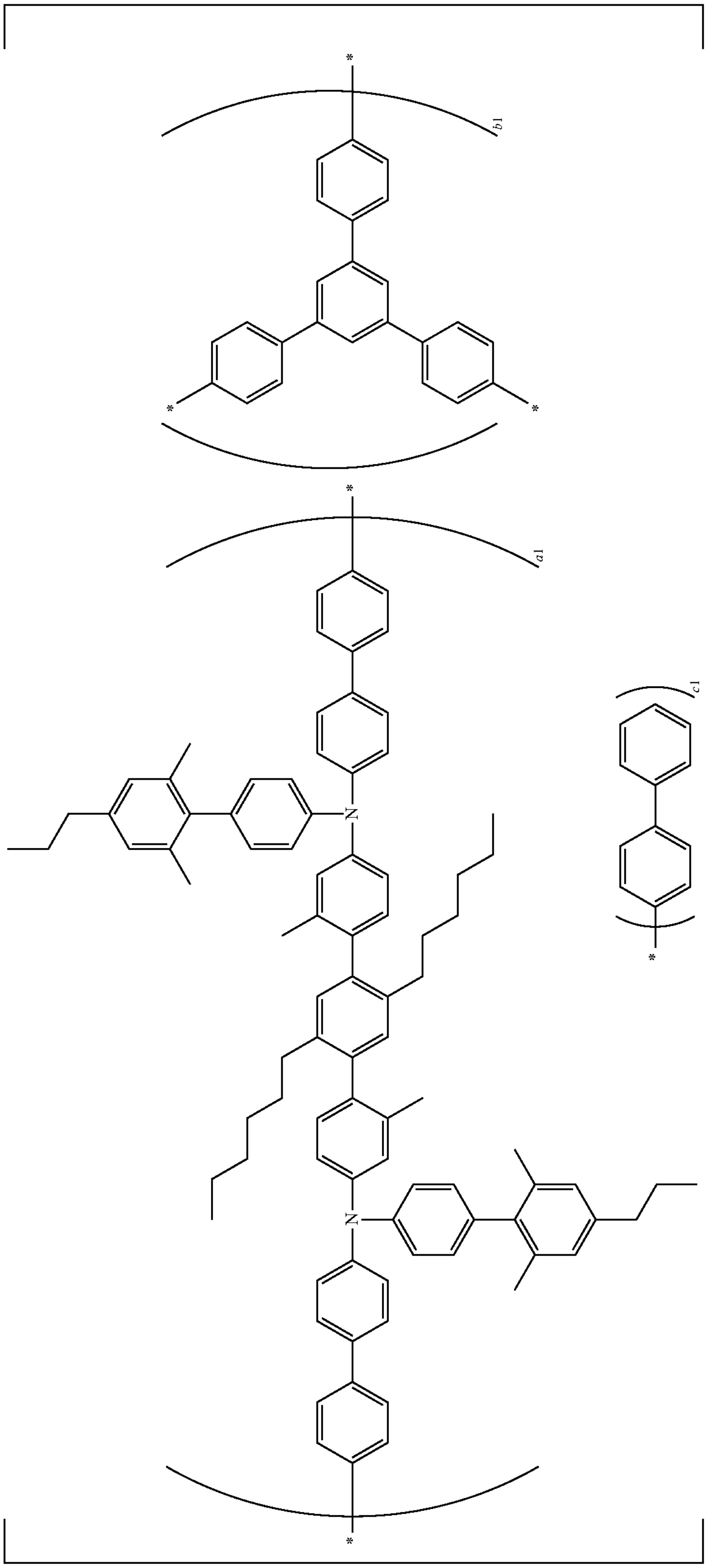

-continued
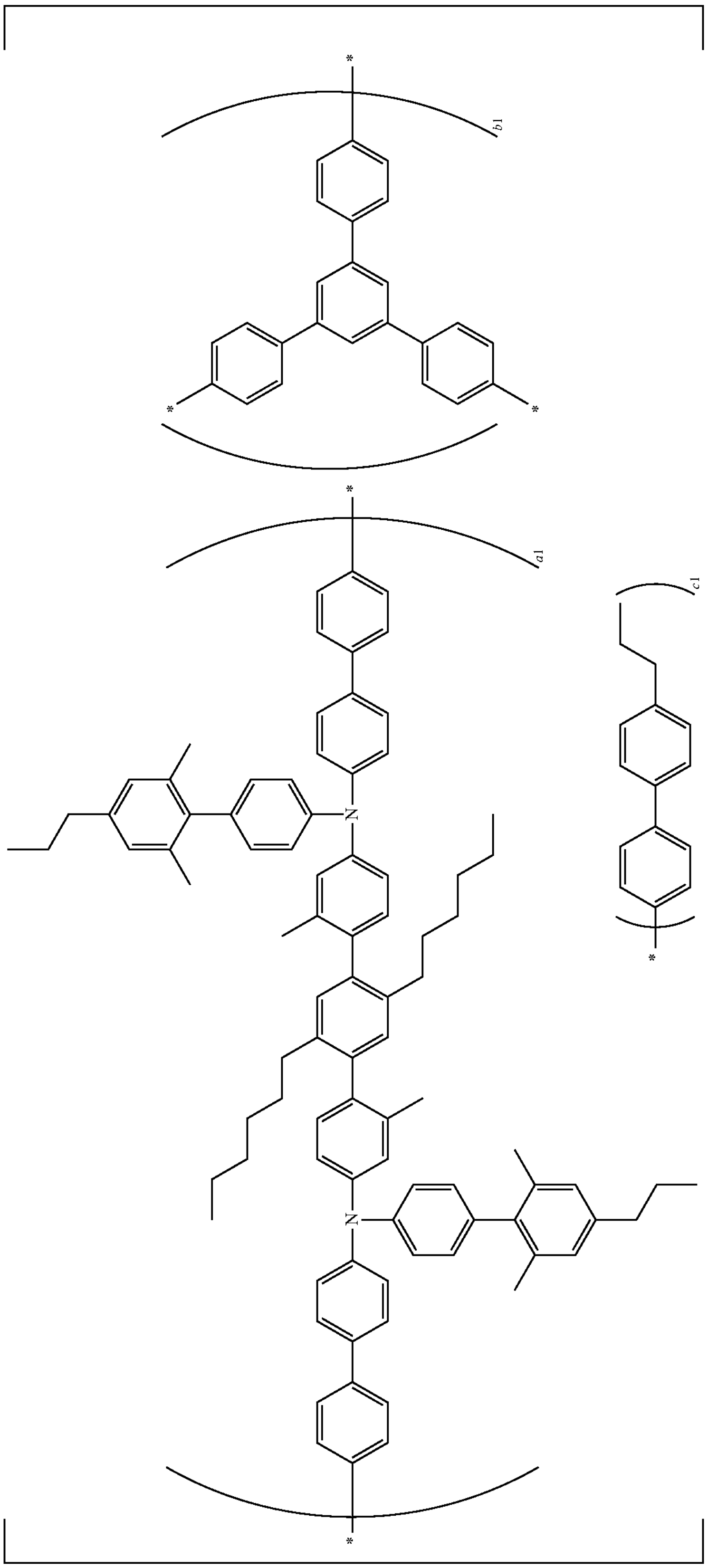

-continued
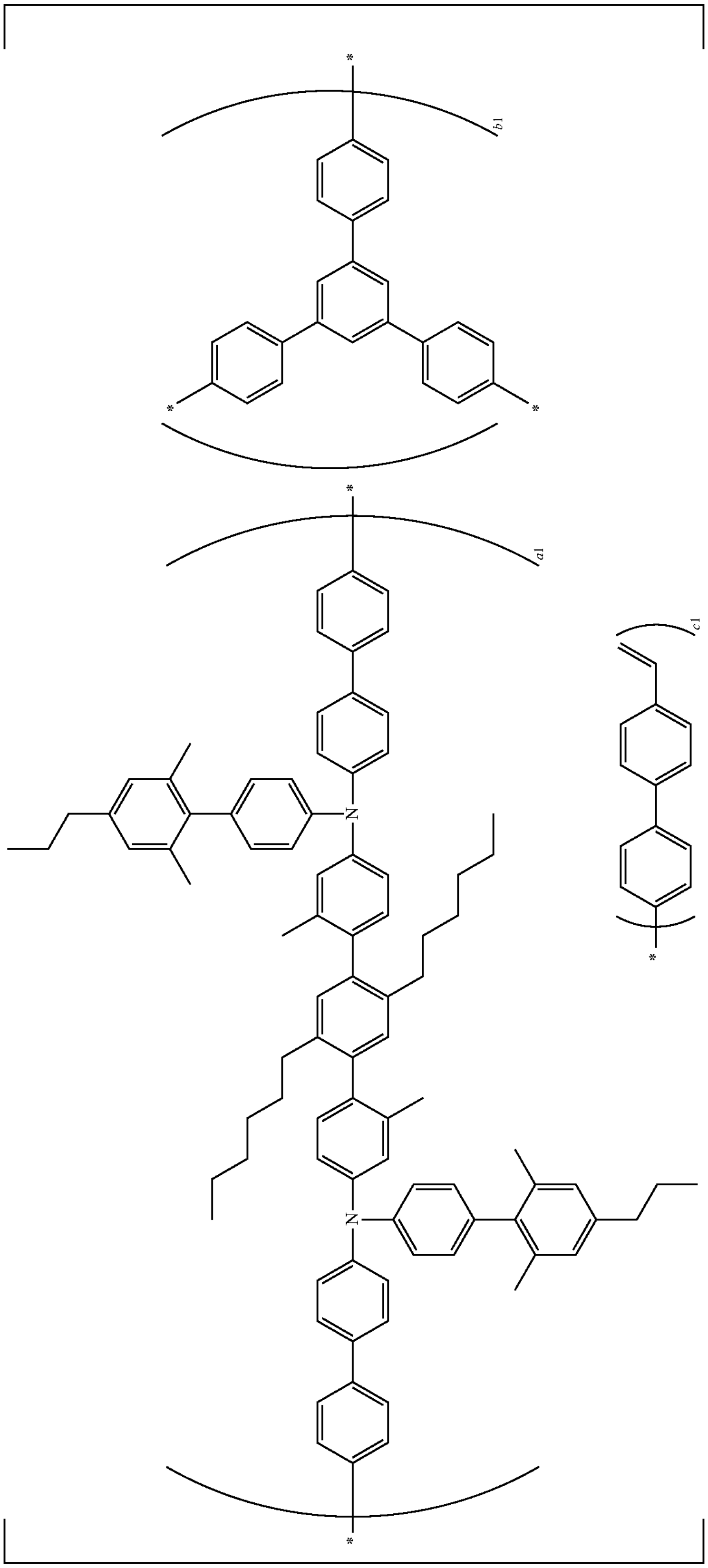

-continued
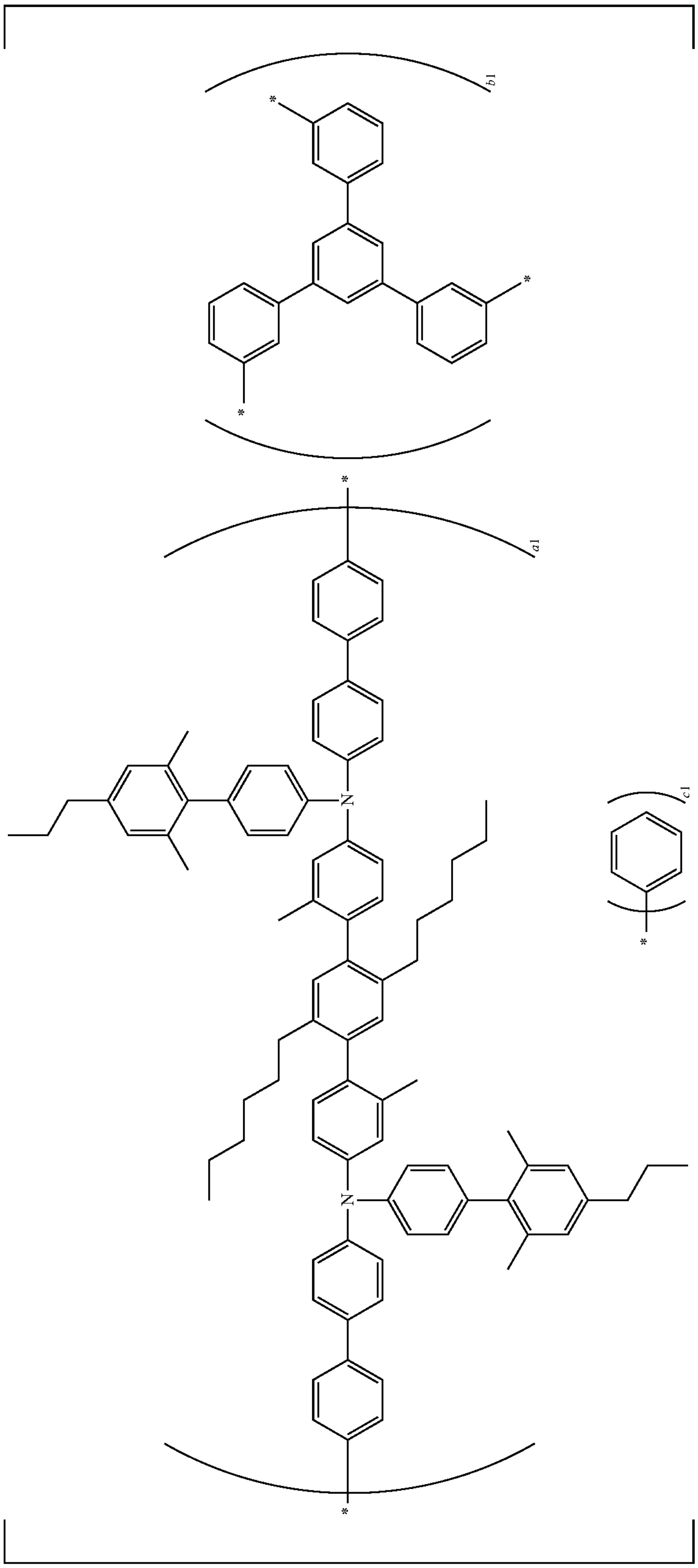

-continued
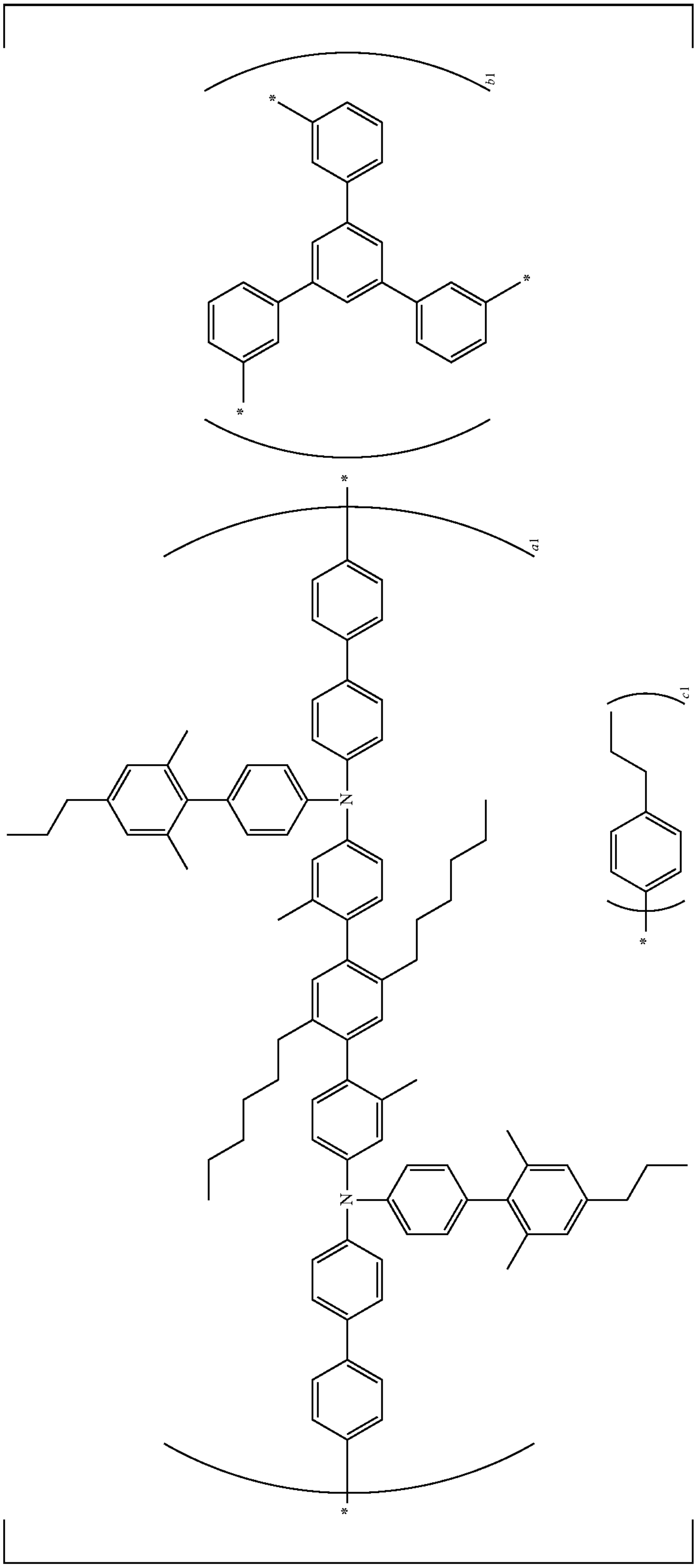

-continued
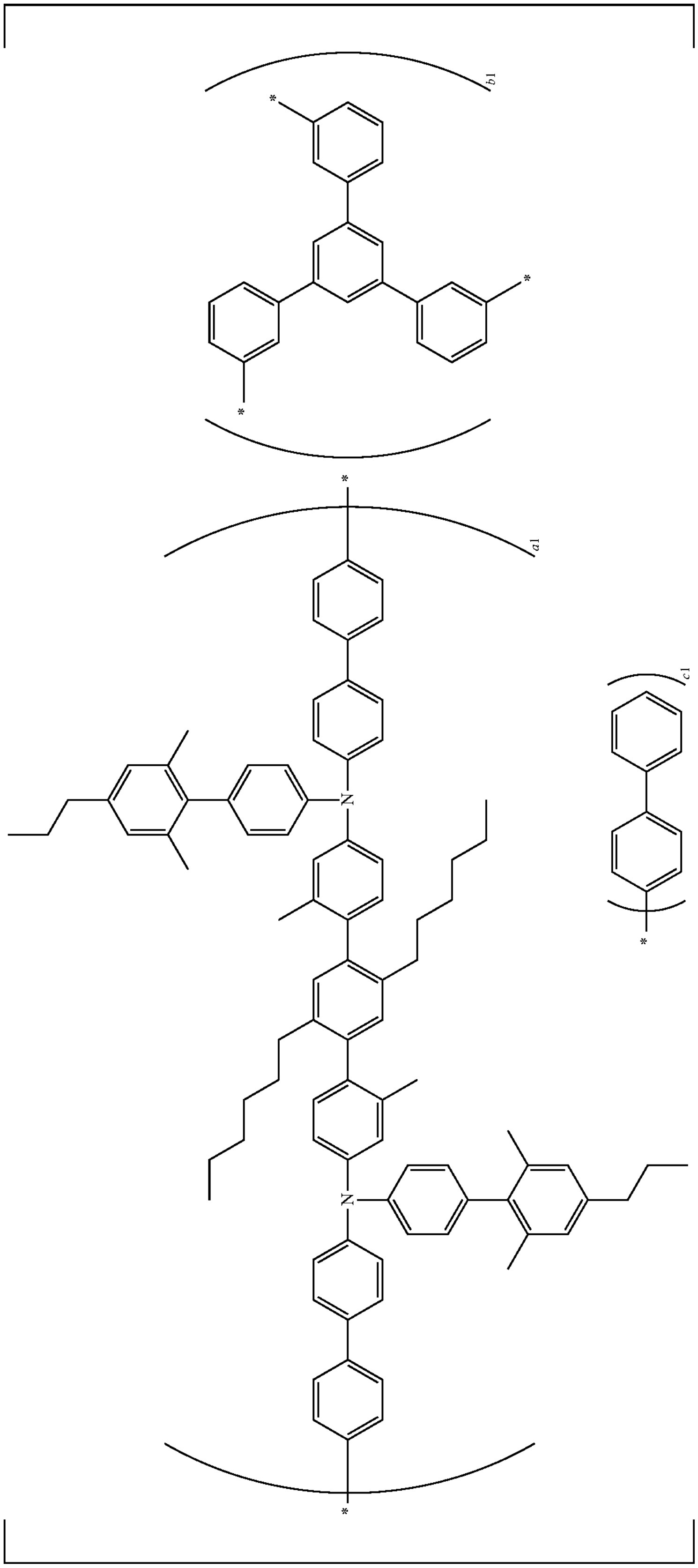

-continued
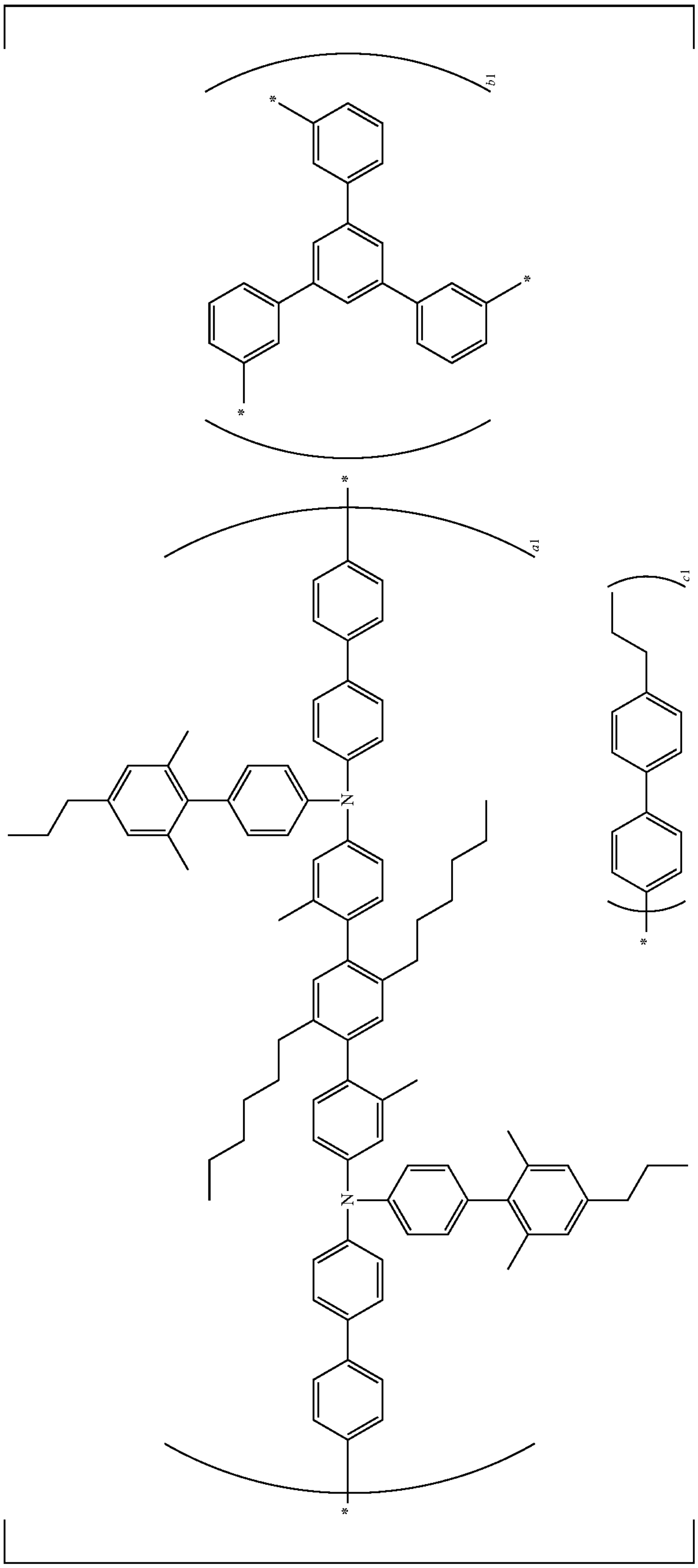

-continued
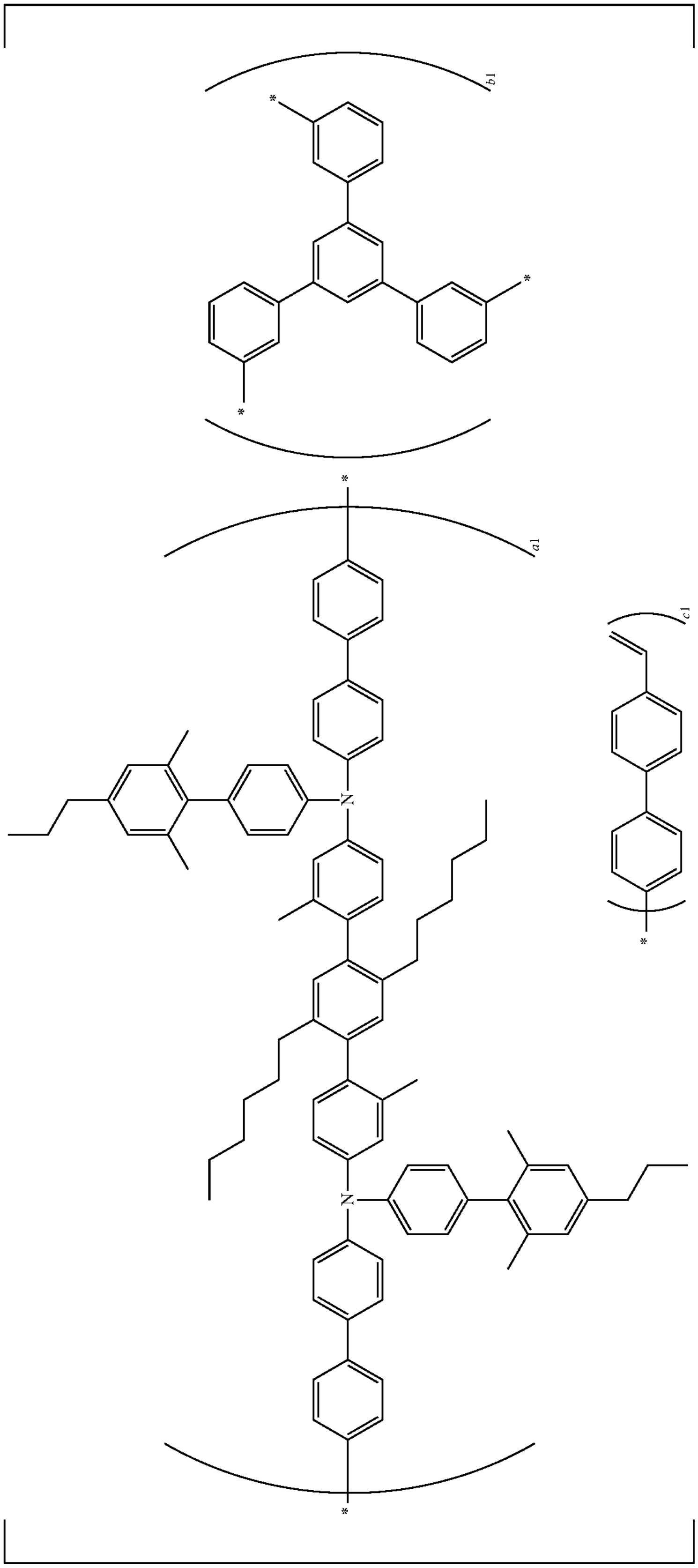

-continued
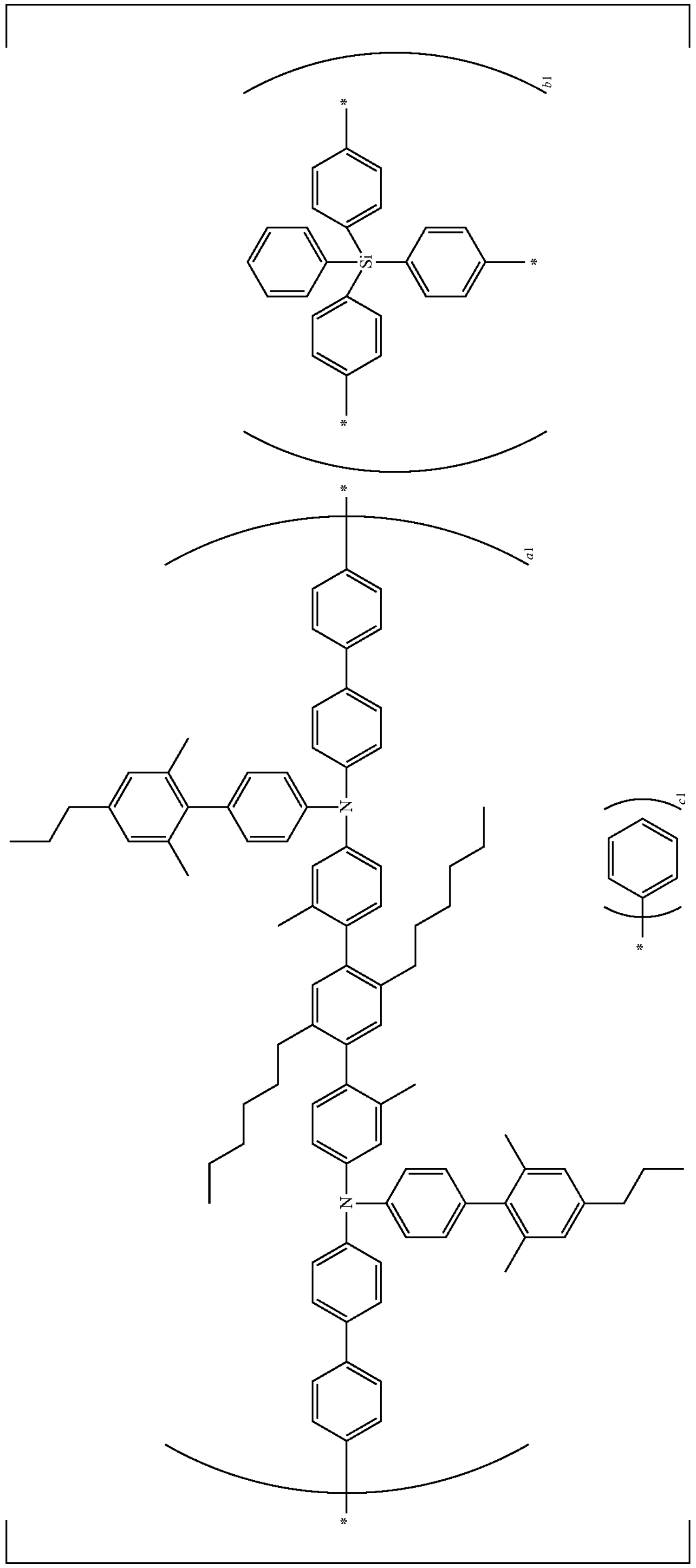

-continued
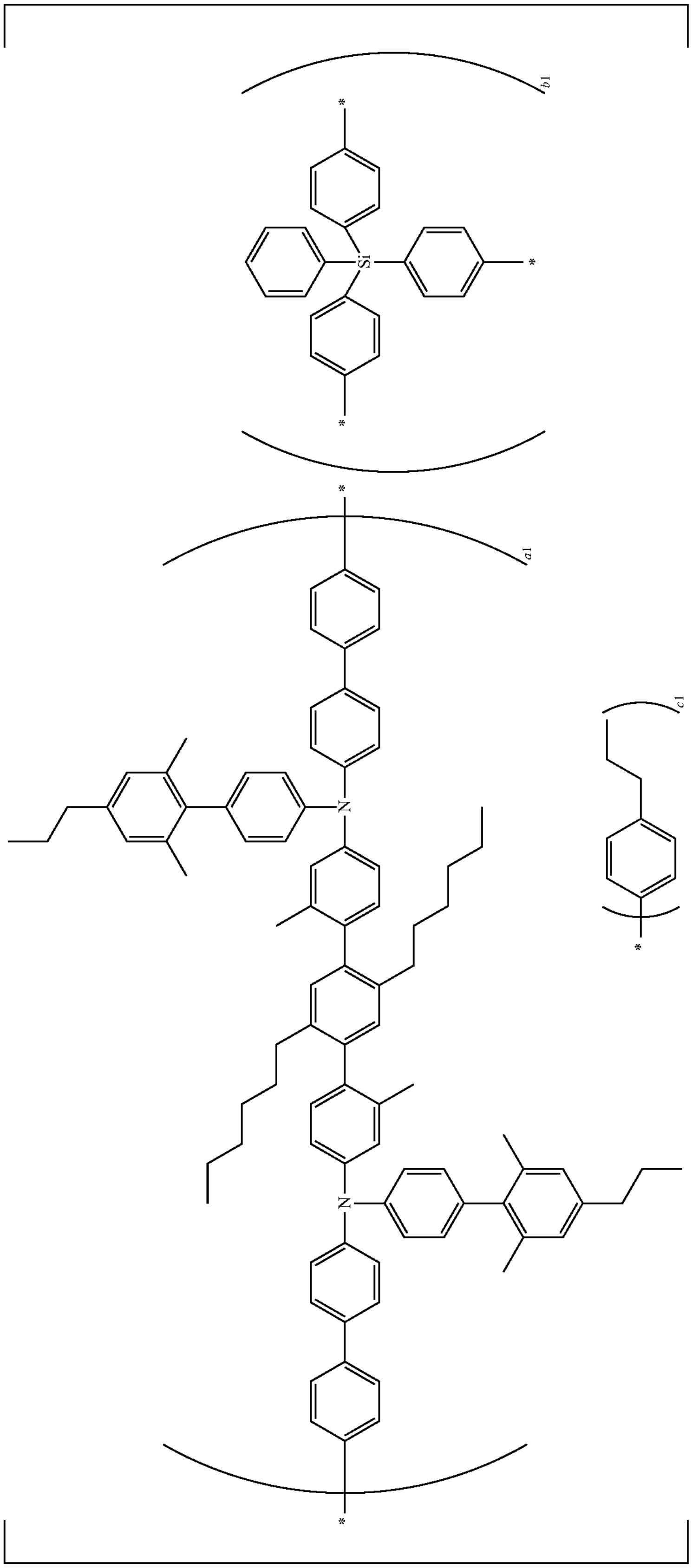

-continued
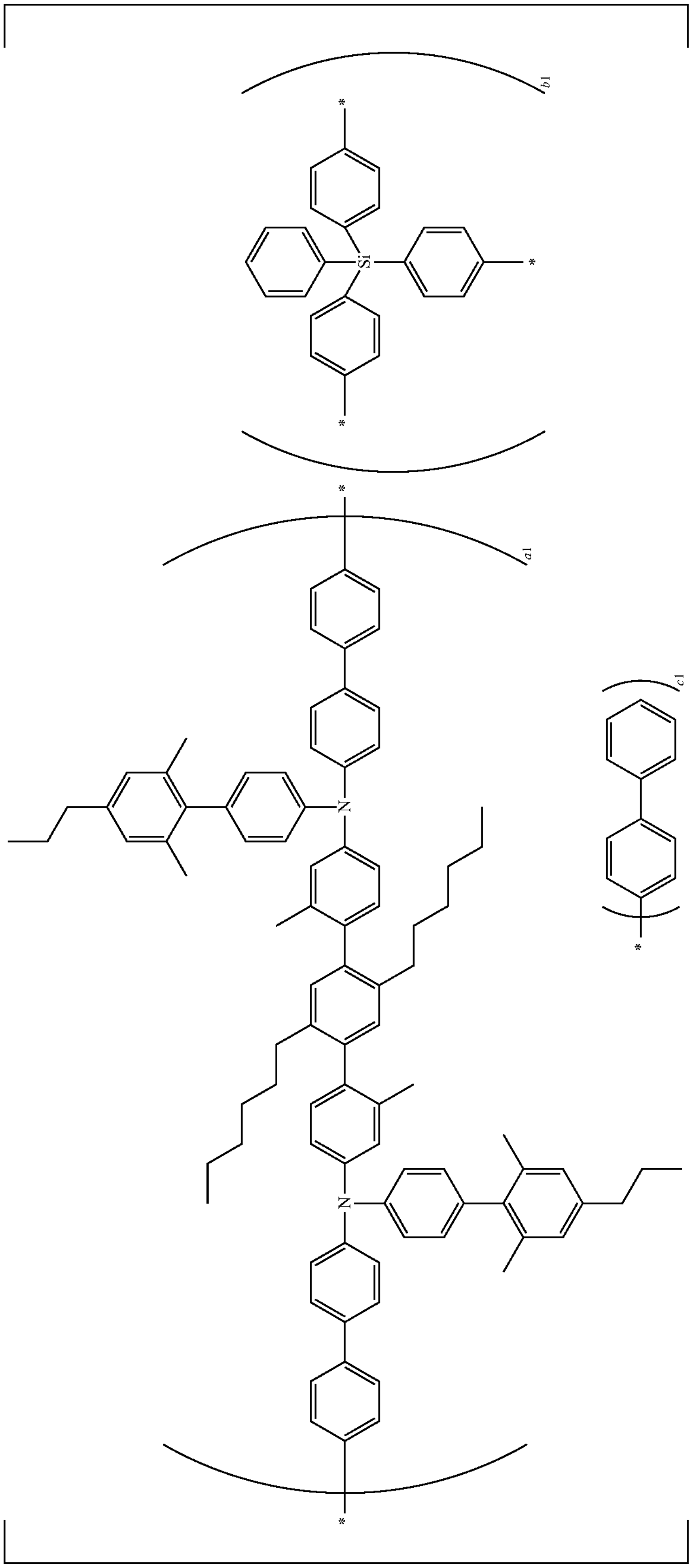

-continued
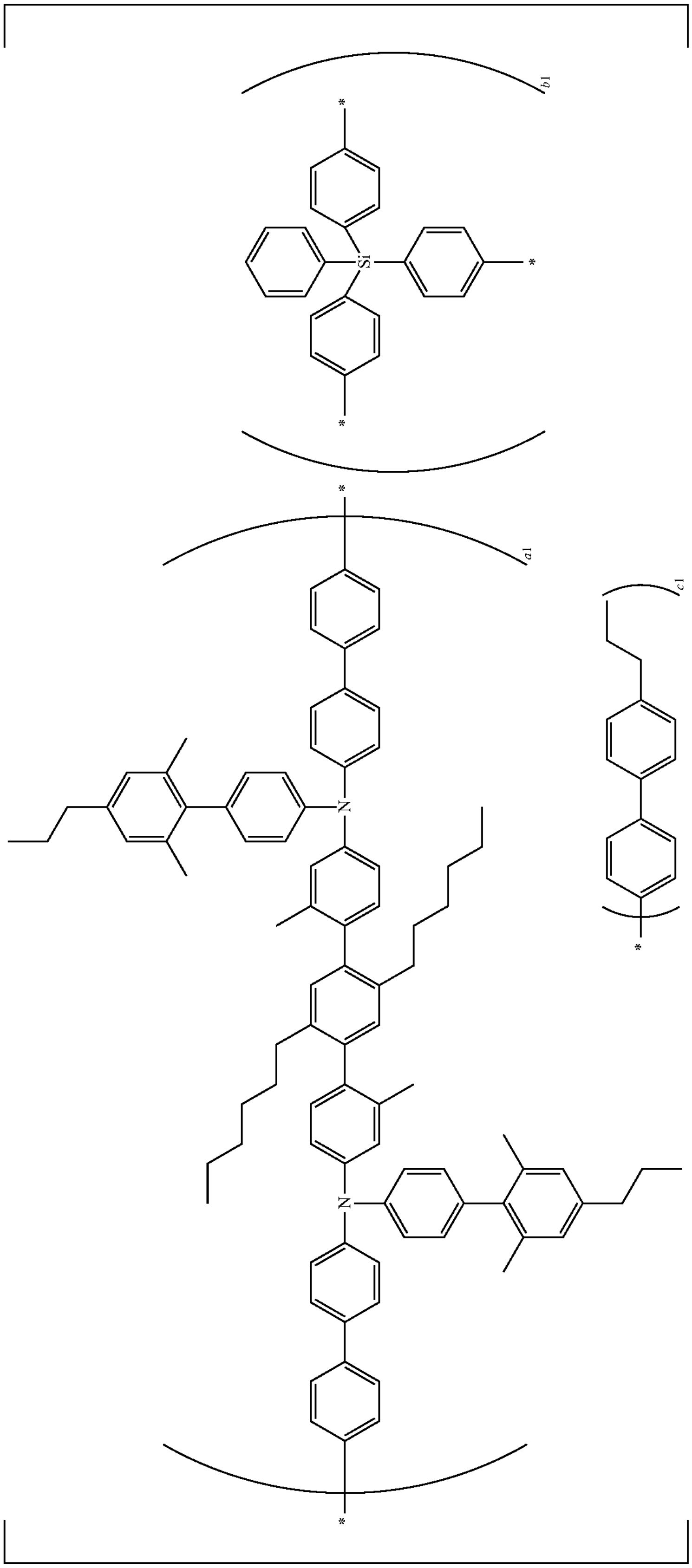

-continued
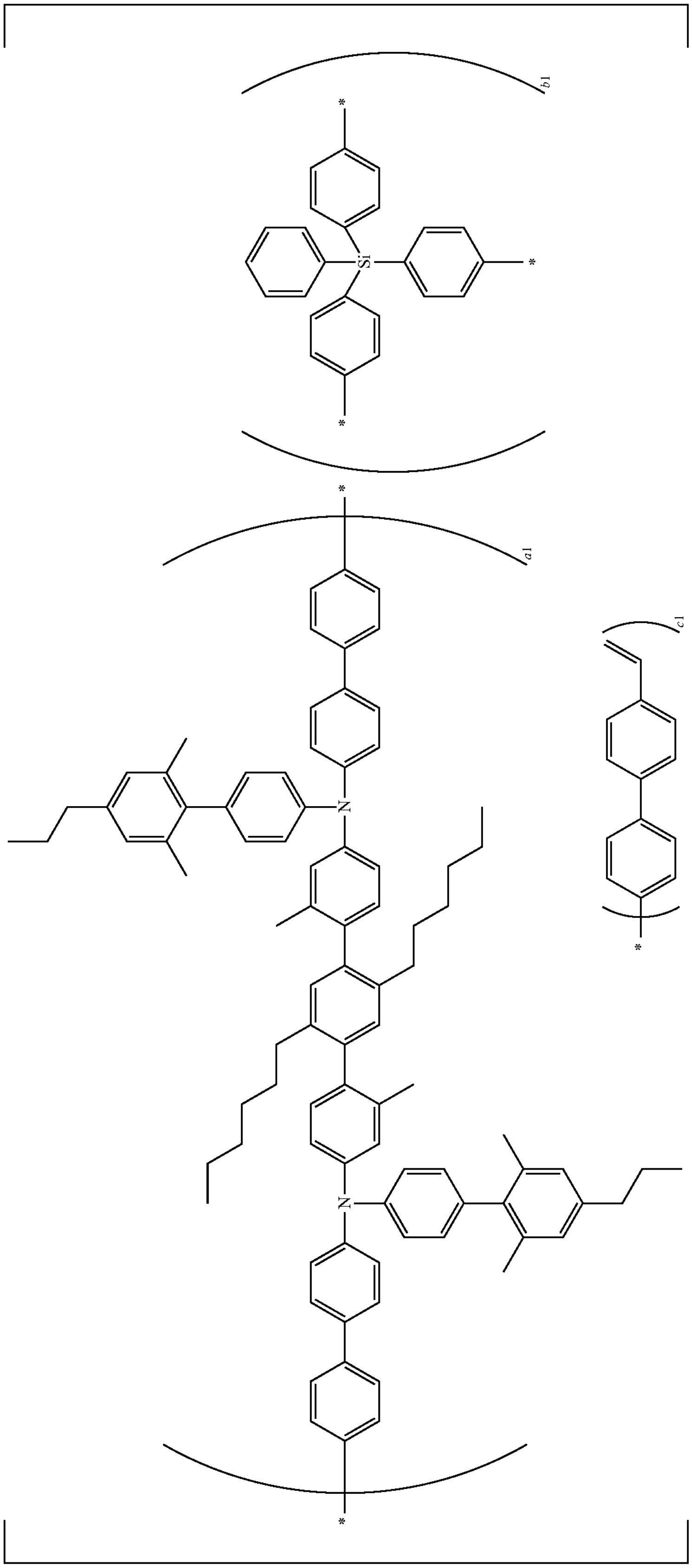

-continued
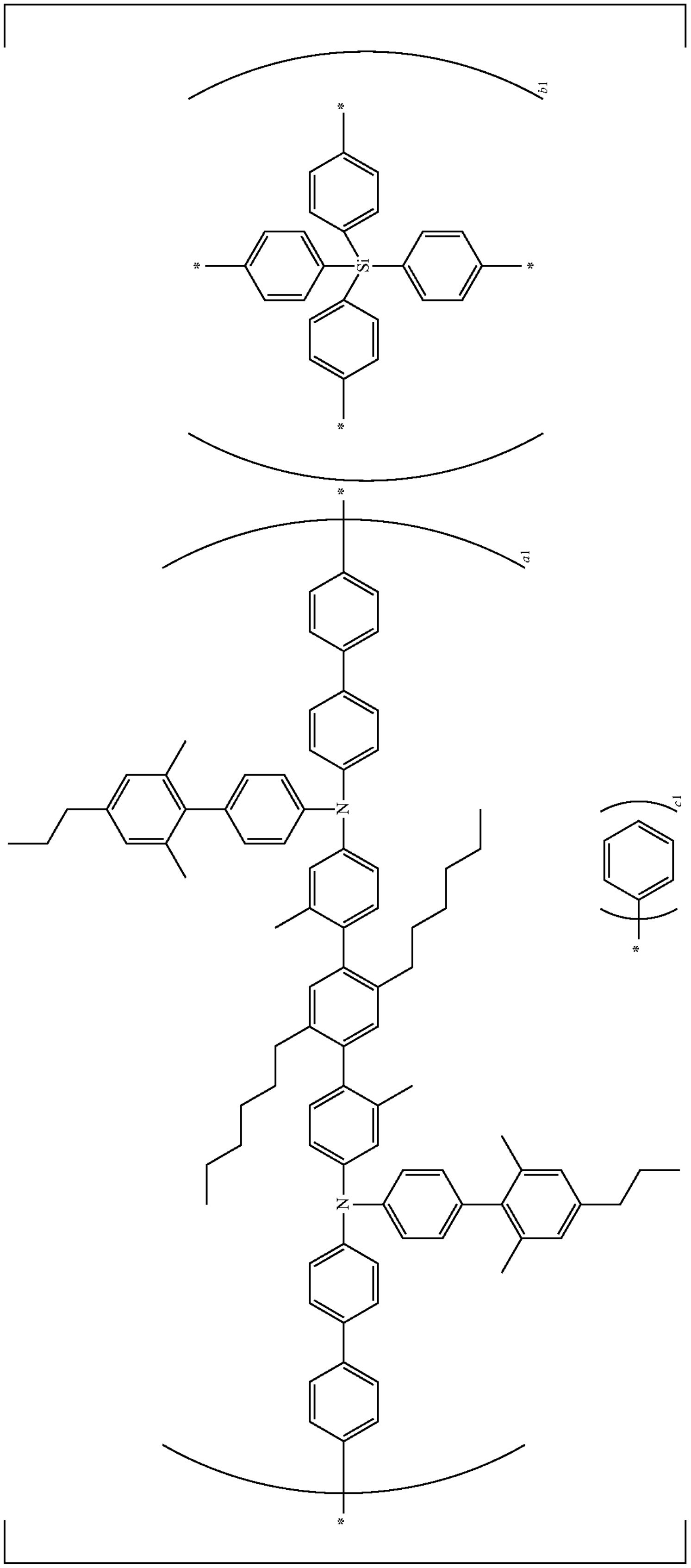

-continued
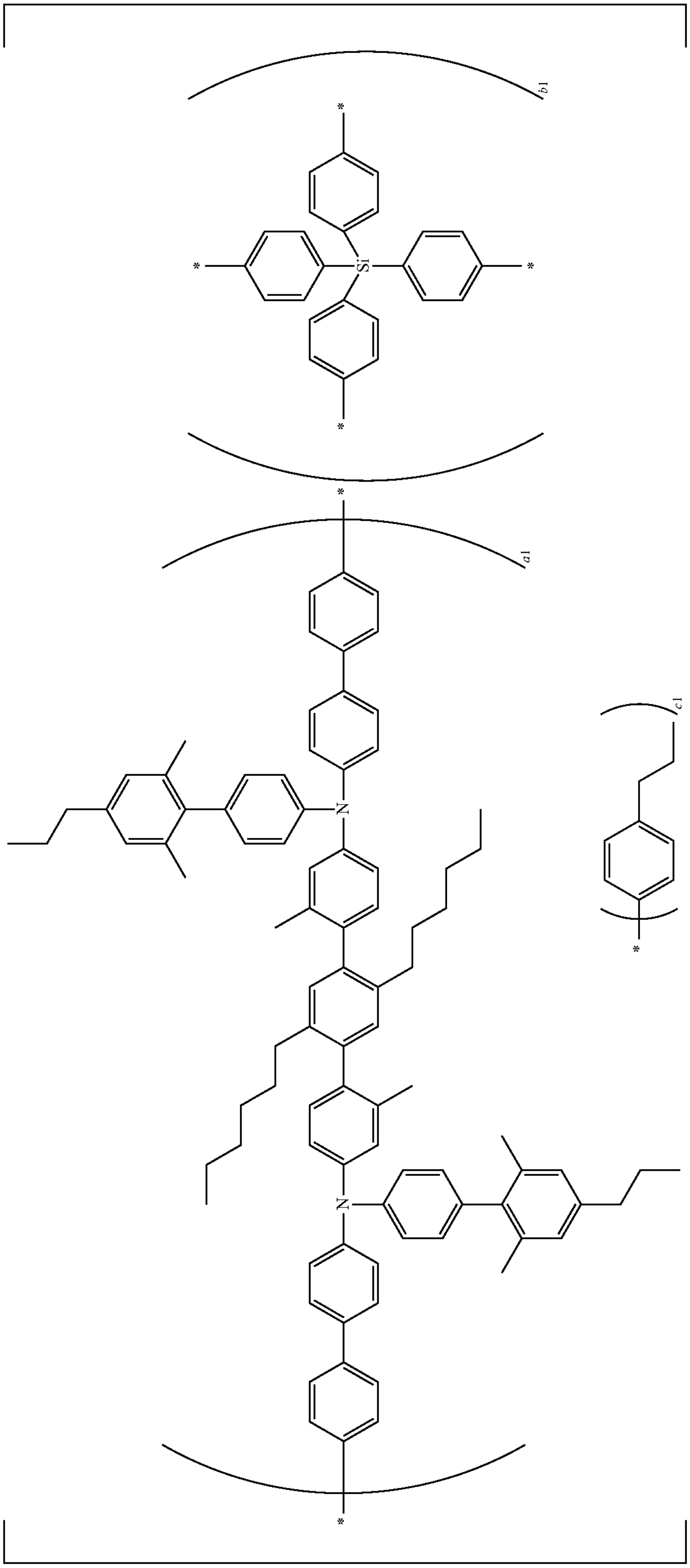

-continued
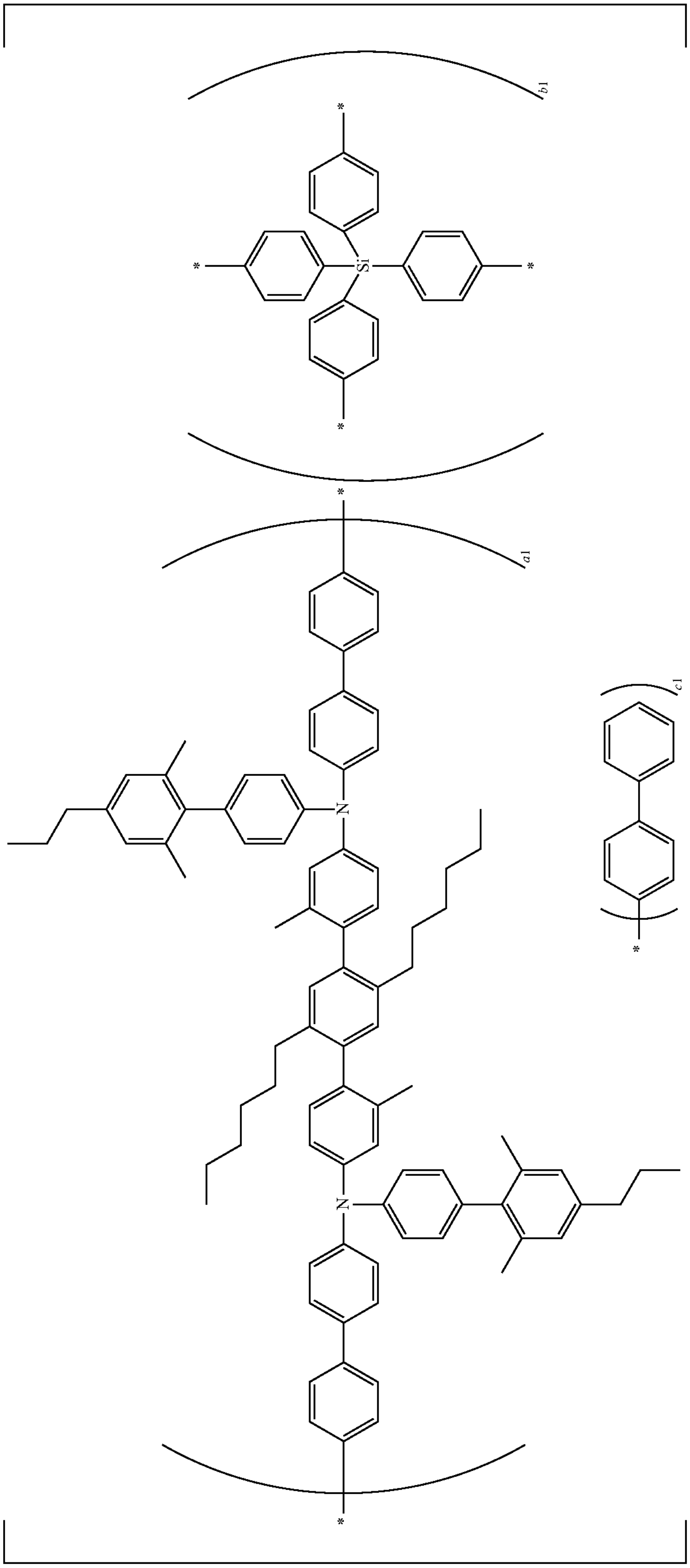

-continued
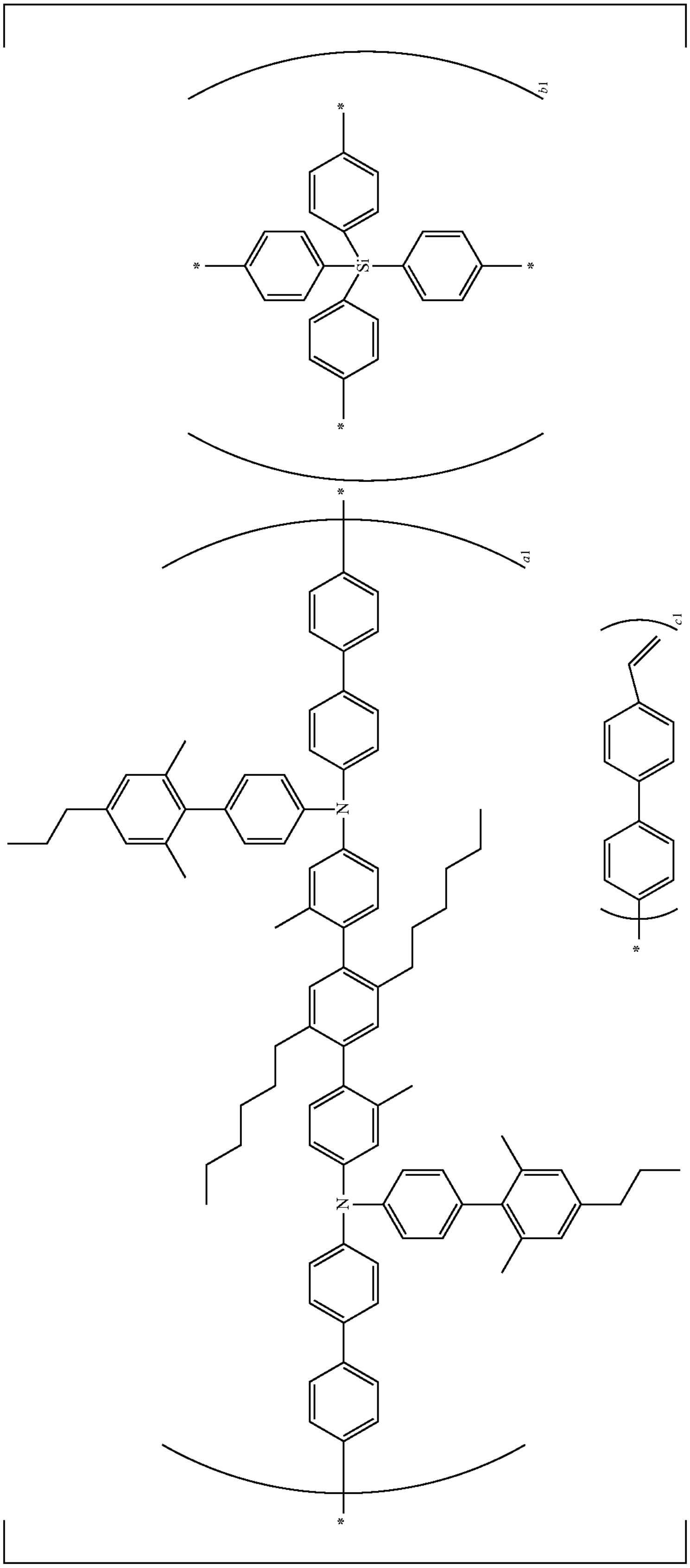

-continued
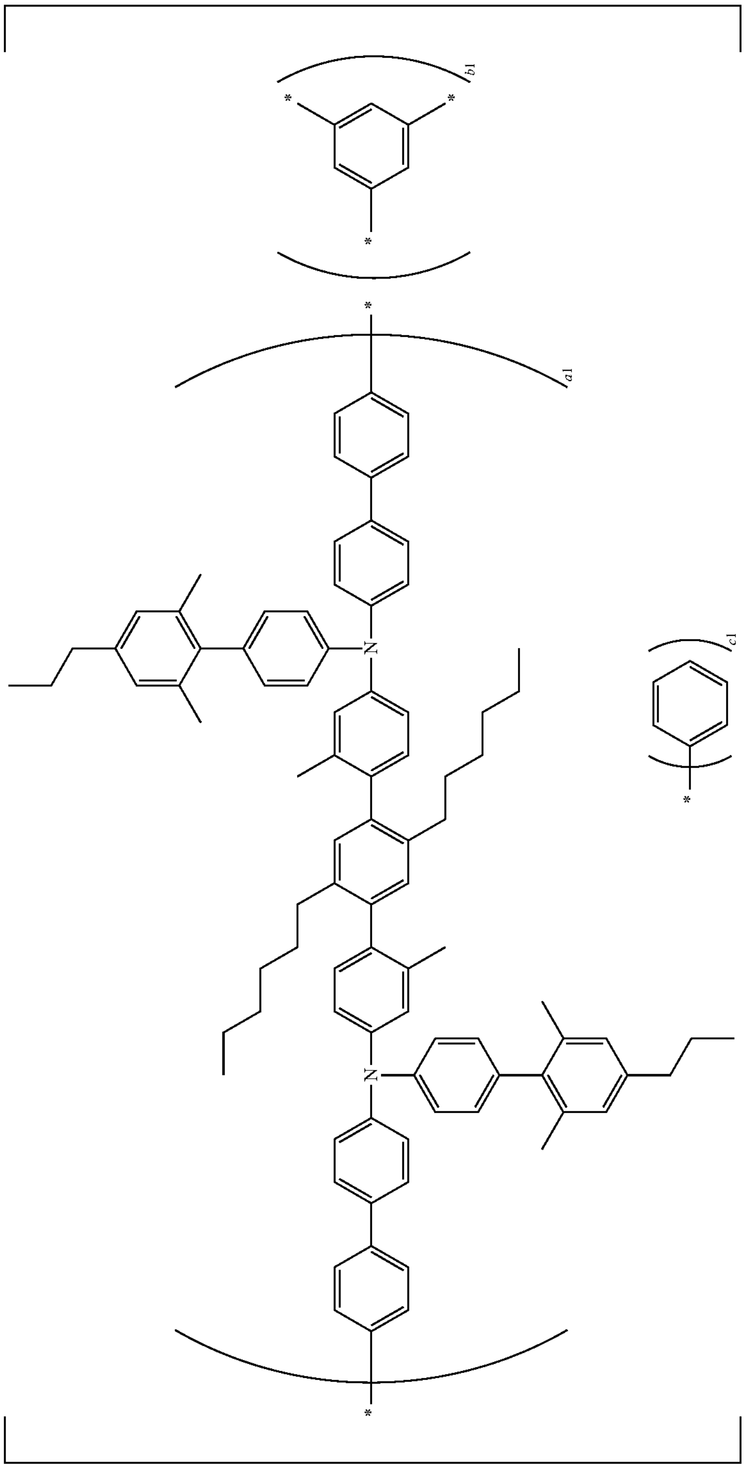

-continued
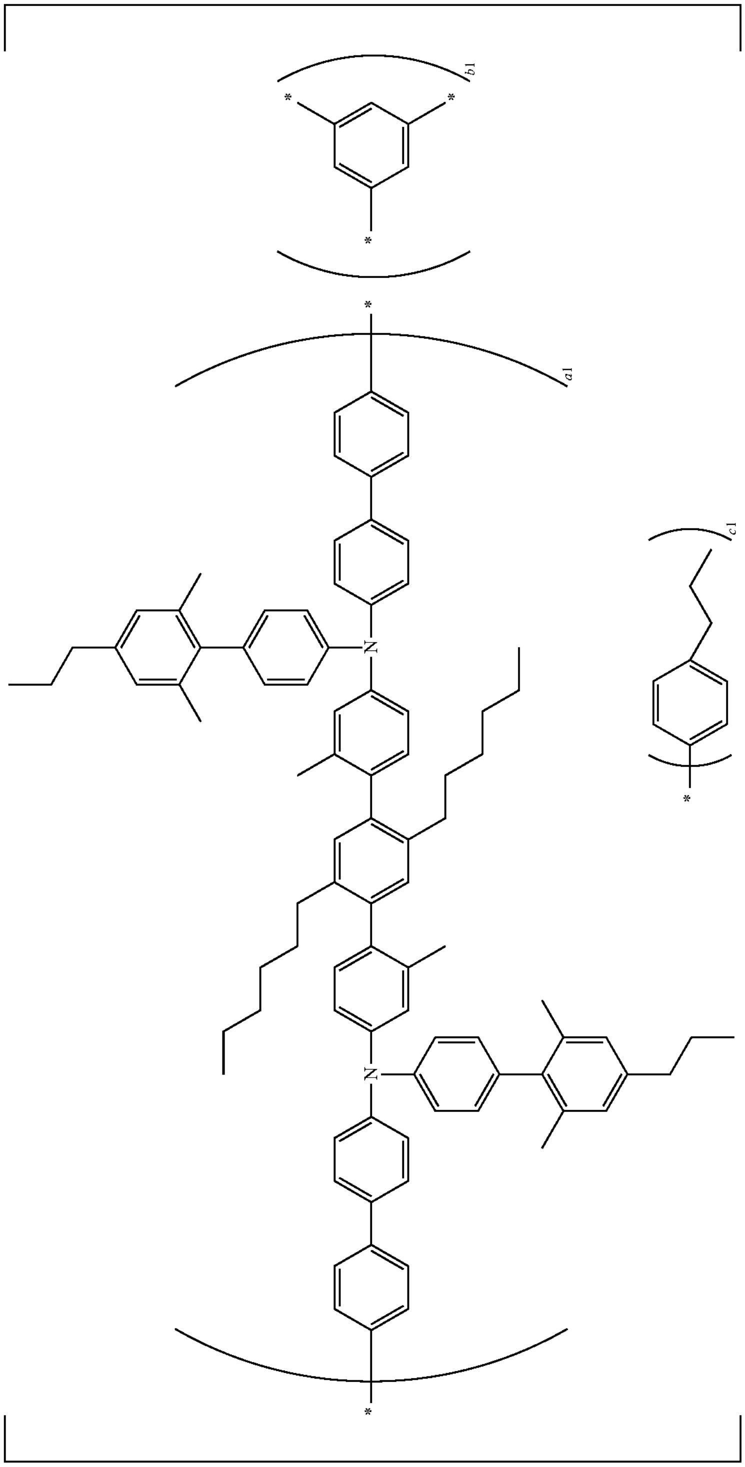

-continued
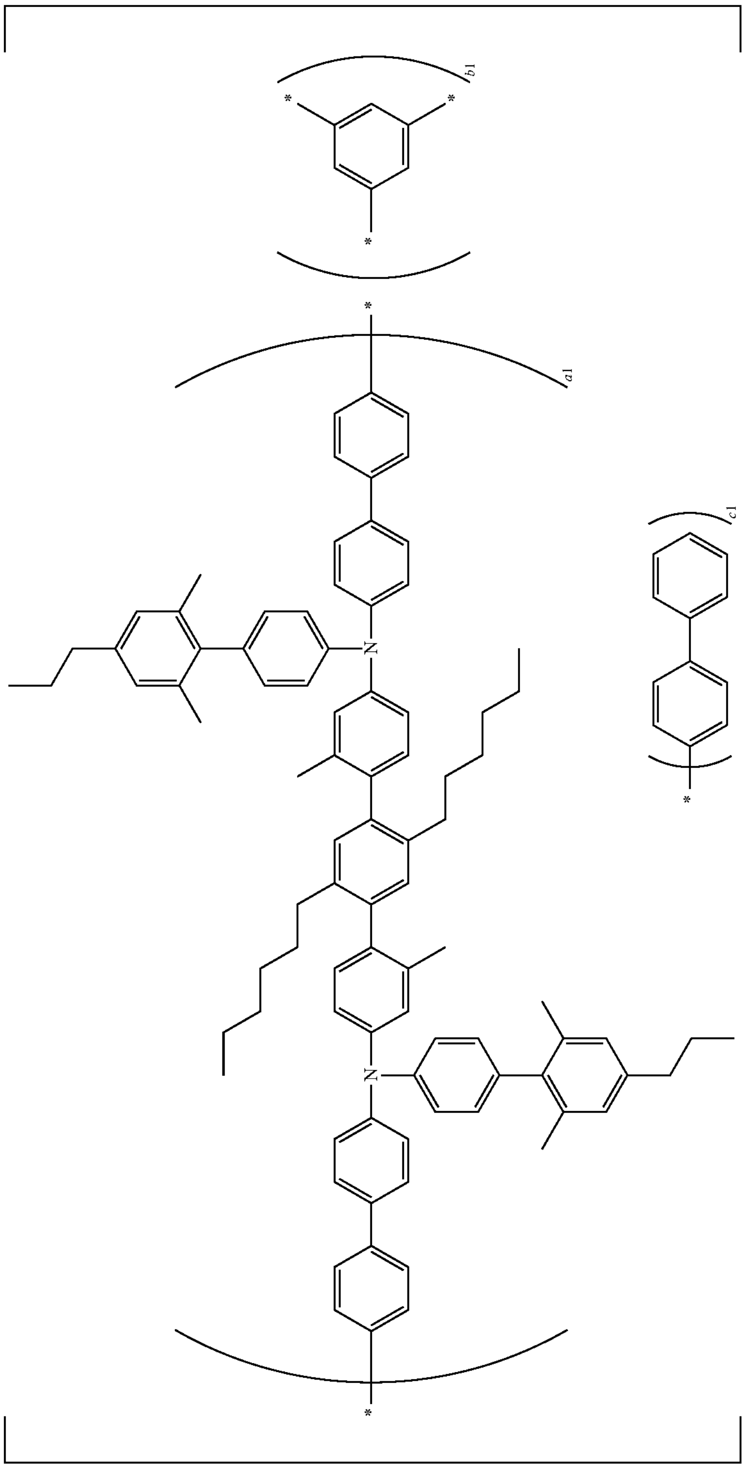

-continued
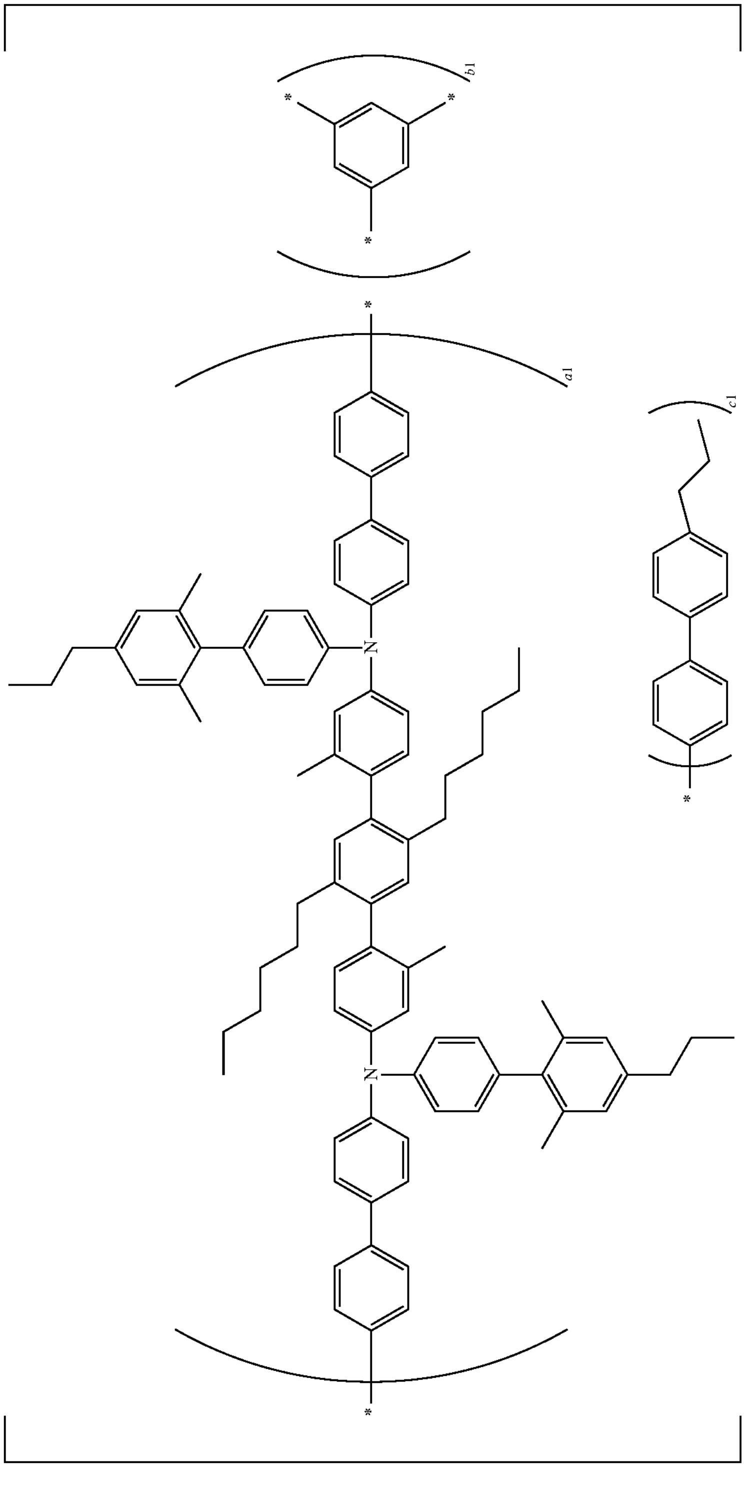

-continued
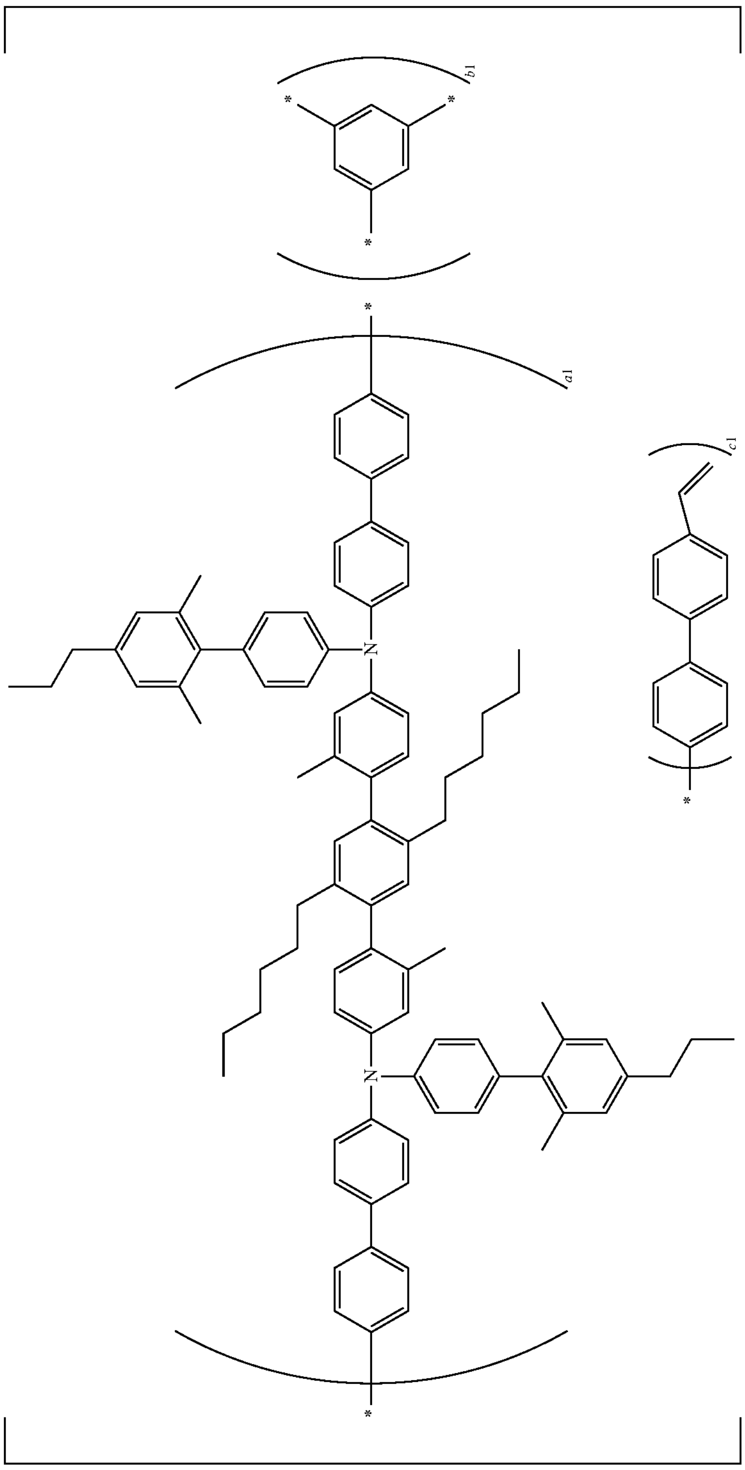

-continued
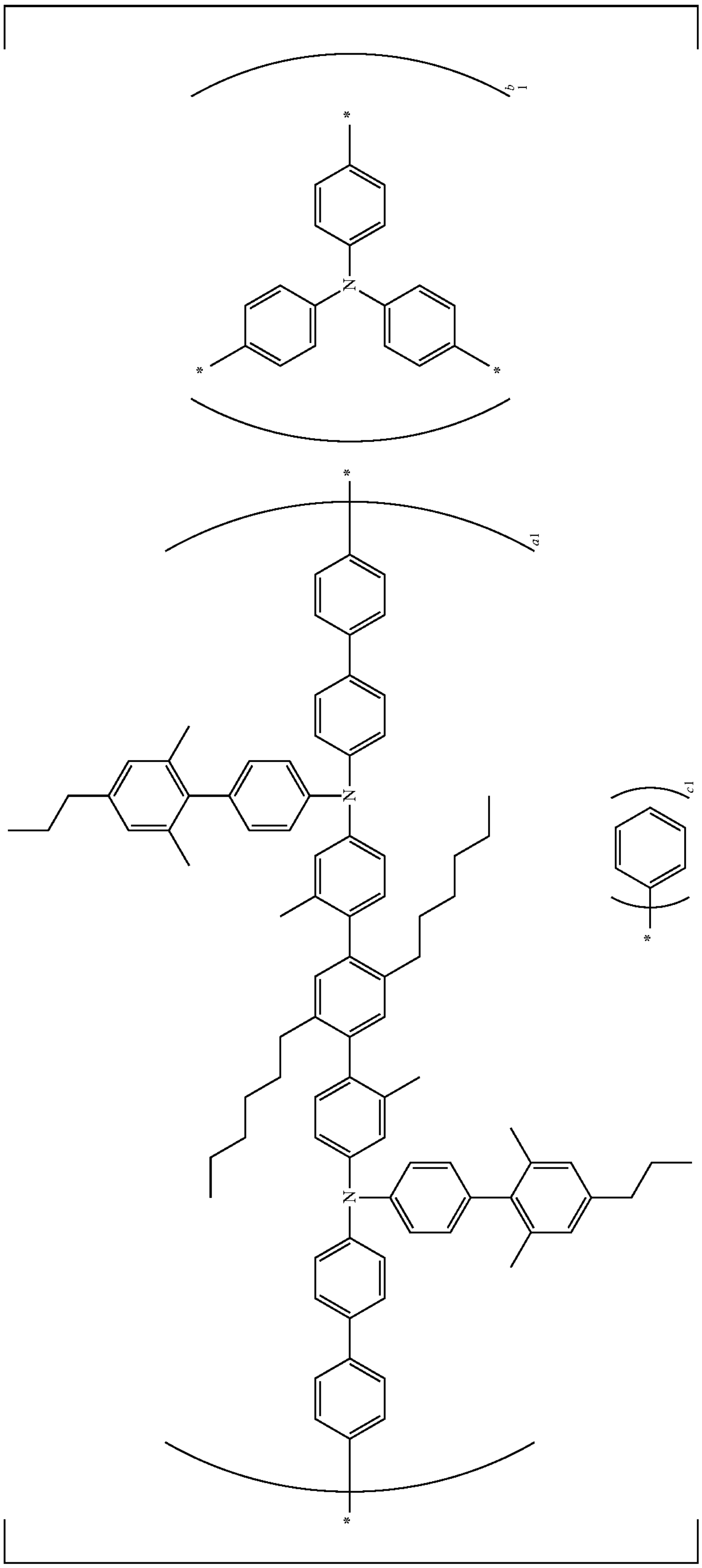

-continued
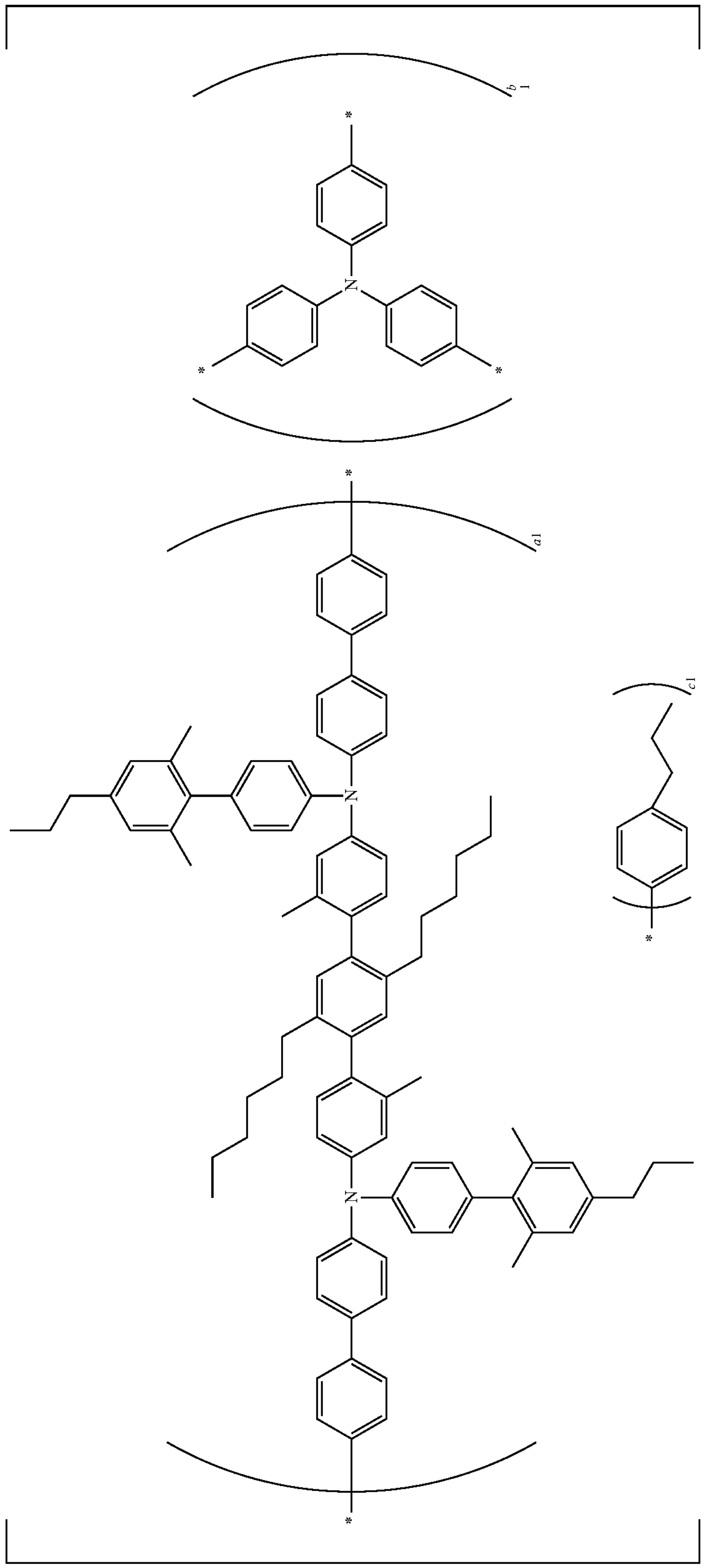

-continued
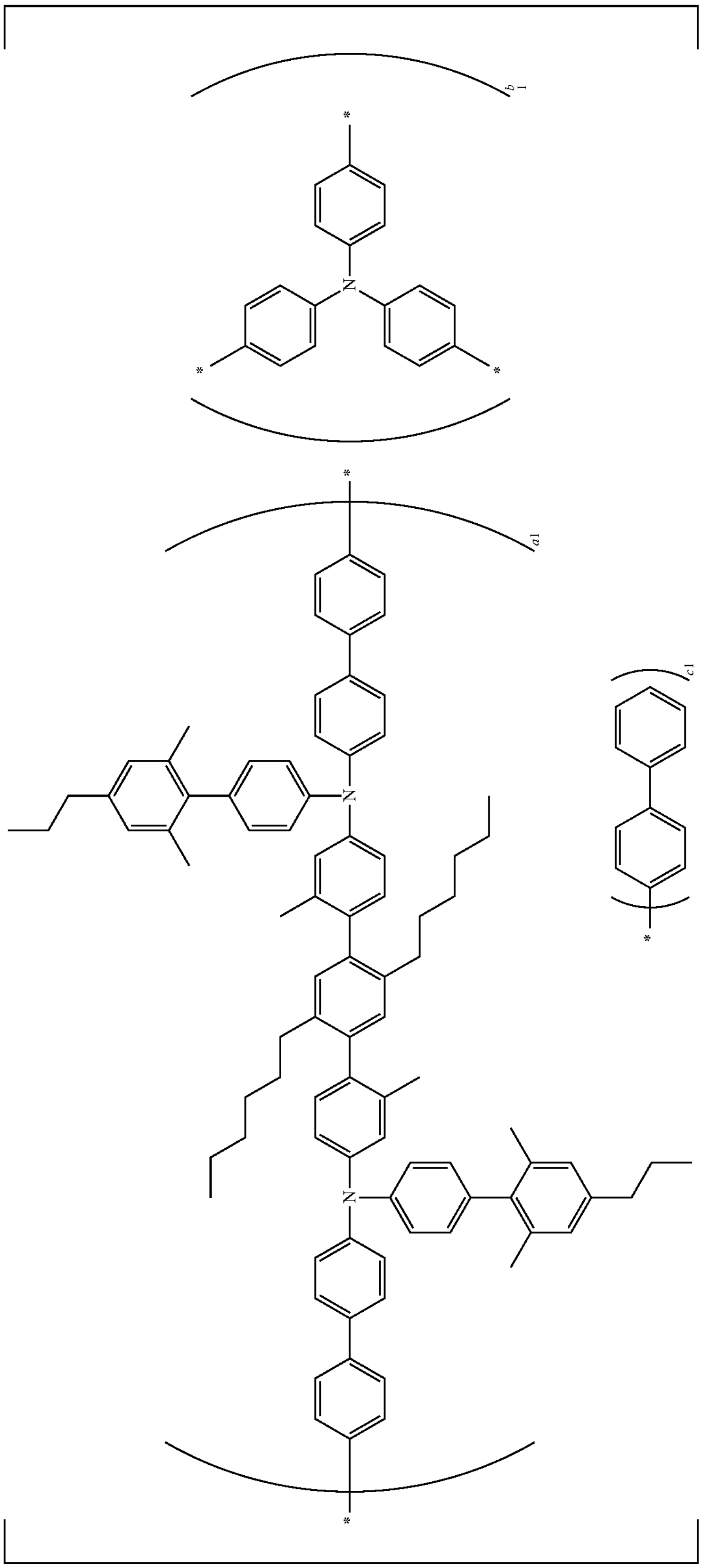

-continued
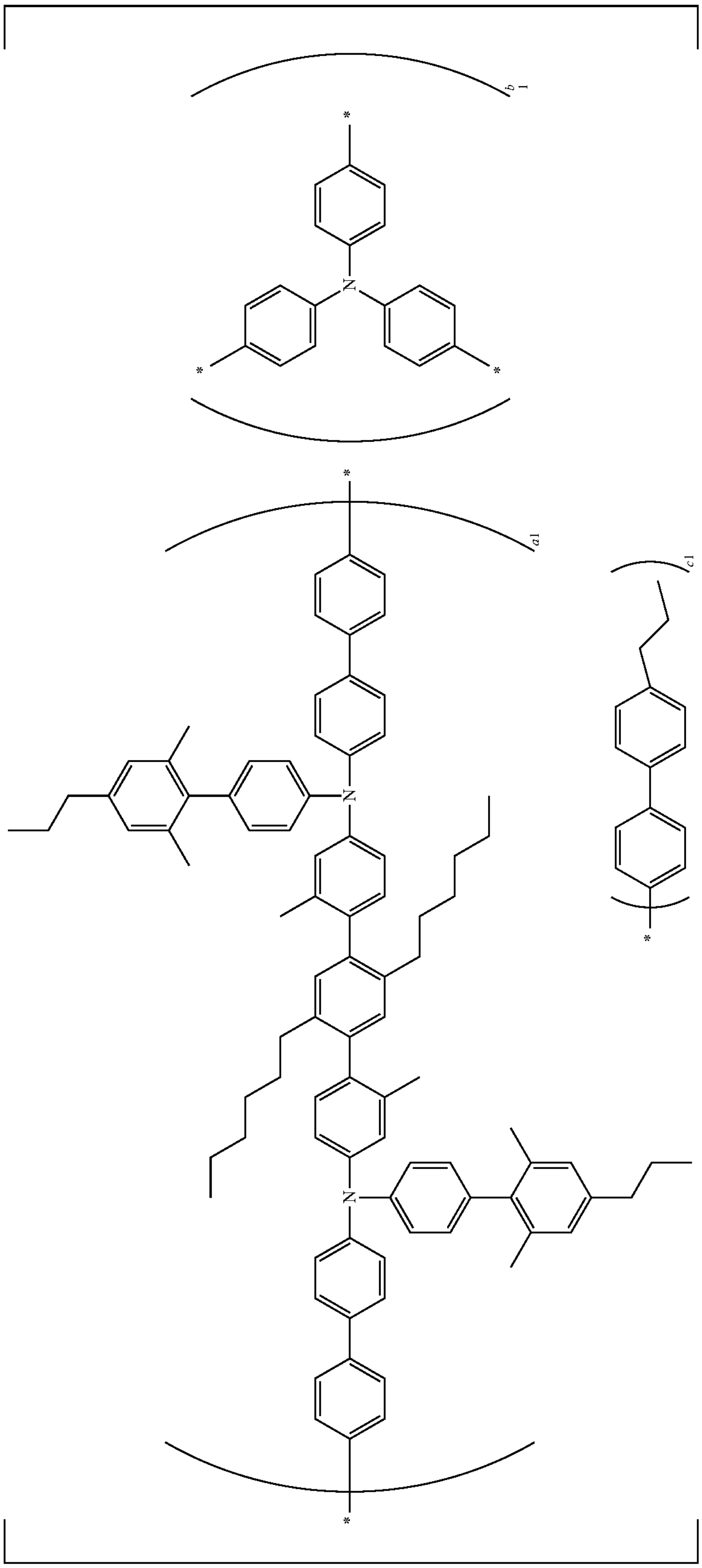

-continued
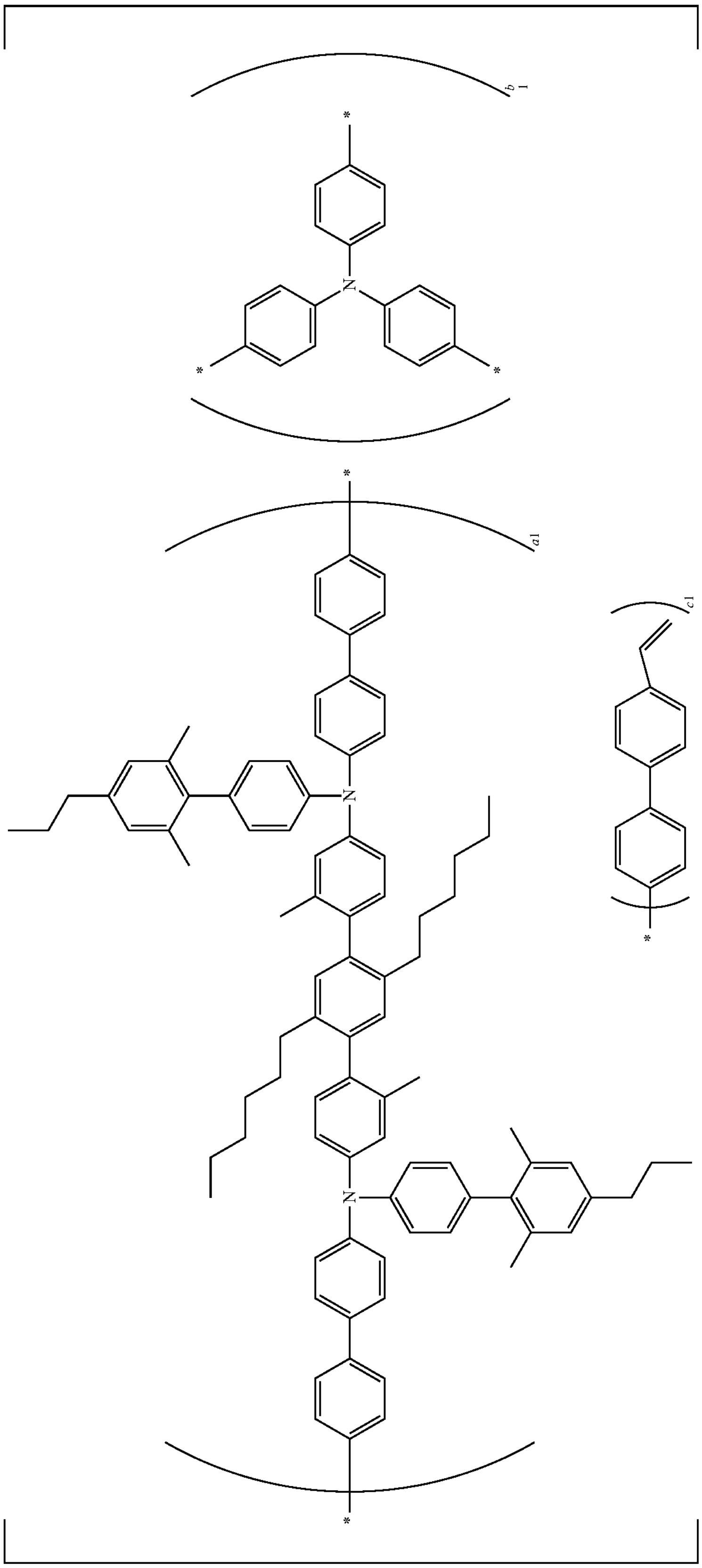

(Coating Composition)

The polymer according to the present disclosure can form an organic material layer, particularly a hole transport layer, of the organic light emitting device by a solution process. For this purpose, one embodiment of the present disclosure provides a coating composition including the above-mentioned polymer according to the present disclosure and a solvent.

The solvent is not particularly limited as long as it is a solvent capable of dissolving or dispersing the polymer according to the present disclosure. As one example, there may be mentioned chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Further, the viscosity of the coating composition is preferably 1 cP to 10 cP, and coating is easy within the above range. Further, in the coating composition, the concentration of the polymer according to the present disclosure is preferably 0.1 wt/v % to 20 wt/v %.

In addition, the coating composition may further include one or more additives selected from the group consisting of a thermal polymerization initiator and a photopolymerization initiator.

Examples of the thermal polymerization initiator may include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, or azo-based such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; thioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyl diphenylphosphine oxide, 2,4,6-trimethylbenzoyl phenylethoxyphosphine oxide, bis(2,4,6-trimethylbenzoyl)phenylphosphine oxide, and bis(2,4-dimethoxy benzoyl)-2,4,4-trimethylpentylphosphine oxide, but are not limited thereto.

In addition, those having a photopolymerization accelerating effect may be used either alone or as a combination with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

In another embodiment of the present disclosure, there is provided a method for forming a hole transport layer using the above-mentioned coating composition. Specifically, the method includes the steps of: coating the above-mentioned coating composition according to the present disclosure on the anode or on the hole injection layer formed on the anode by a solution process; and drying the coated coating composition.

The solution process uses the above-mentioned coating composition according to the present disclosure, and refers to spin coating, dip coating, doctor blading, inkjet printing, screen printing, spray method, roll coating, and the like, but is not limited thereto.

(Organic Light Emitting Device)

In another embodiment of the present disclosure, there is provided an organic light emitting device including the above-mentioned polymer according to the present disclosure. Specifically, the present disclosure provides an organic light emitting device including an anode; a cathode that is disposed opposite to the anode; a light emitting layer that is provided between the anode and the cathode; and a hole transport layer that is provided between the anode and the light emitting layer, wherein the hole transport layer includes the polymer according to the present disclosure.

The structure of an organic light emitting device according to an embodiment of the present disclosure is illustrated in FIGS. 1 and 2.

FIG. 1 shows an example of an organic light emitting device comprising a substrate 1, an anode 2, a hole transport layer 3, a light emitting layer 4, and a cathode 5. FIG. 2 shows an example of an organic light emitting device comprising a substrate 1, an anode 2, a hole injection layer 6, a hole transport layer 3, a light emitting layer 4, an electron transport layer 7, an electron injection layer 8, and a cathode 5.

The organic light emitting device according to the present disclosure may be manufactured by materials and methods known in the art, except that the hole transport layer includes the polymer according to the present disclosure and is manufactured according to the above-mentioned method.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device may be manufactured by sequentially depositing a cathode material, an organic material layer and an anode material on a substrate (International Publication WO2003/012890). However, the manufacturing method is not limited thereto.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene] (PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to a hole injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The light emitting material is preferably a material which may receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene)(PPV)-based polymer; a spiro compound; polyfluorene, lubrene, and the like, but are not limited thereto.

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

The dopant material includes an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron transport layer is a layer which receives electrons from an electron injection layer and transports the electrons to a light emitting layer, and an electron transport material is suitably a material which may receive electrons well from a cathode and transfer the electrons to a light emitting layer, and has a large mobility for electrons. Specific examples of the electron transport material include: an Al complex of 8-hydroxyquinoline; a complex including $Alq_3$; an organic radical compound; a hydroxyflavone-metal complex, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples of the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1- naphtholato)aluminum, bis(2-methyl-8-quinolinato)(2-naphtholato)gallium, and the like, but are not limited thereto.

The organic light emitting device according to the present disclosure may be a bottom emission device, a top emission device, or a double-sided light emitting device, and particularly, may be a bottom emission device that requires relatively high luminous efficiency.

In addition, the compound according to the present disclosure may be included in an organic solar cell or an organic transistor in addition to an organic light emitting device.

The preparation of the polymer according to the present disclosure and the organic light emitting device containing the same will be described in detail in the following examples. However, these examples are presented for illustrative purposes only, and are not intended to limit the scope of the present disclosure.

PREPARATION EXAMPLE

Preparation Example 1: Preparation of Monomer A

1) Preparation of Compound 1-a

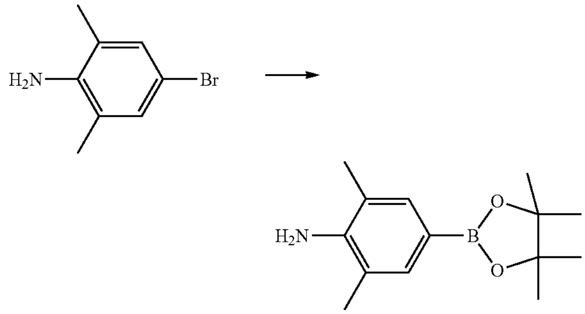

a-1

In a round flask equipped with a condenser, Compound 4-bromo-2,6-dimethylaniline (30 g, 1.00 eq) and bis(pinacolato)diboron (41.8 g, 1.10 eq) were dissolved in 1,4-dioxane (300 mL). When the dissolution was completely performed, potassium acetate (29.4 g, 2.00 eq) and Pd(dppf)$Cl_2$ (5.48 g, 0.05 eq) were added thereto, and the mixture was refluxed at 90° C. for 12 hours. After the reaction was terminated through distilled water, the organic solvent was extracted and then dried to obtain Compound a-1 (31.2 g) in a solid state.

MS: $[M+H]^+$=247

2) Preparation of Compound a-2

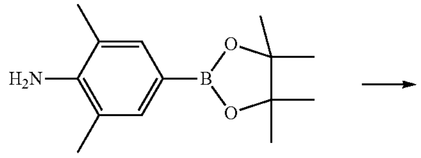

a-1

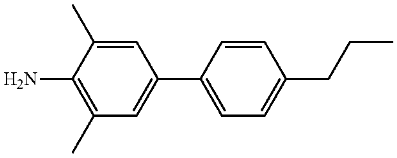

a-2

In a round flask equipped with a condenser, the previously prepared Compound a-1 (25.5 g, 1.00 eq) and 1-bromo-4-propylbenzene (27.7 g, 1.35 eq) were dissolved in tetrahydrofuran (300 mL). When the dissolution was completely performed, 2M aqueous sodium carbonate solution (100 mL) and bis(di-tert-butyl (4-dimethylaminophenyl)phosphine)dichloropalladium (II) (0.78 g, 0.015 eq) were added thereto, and the mixture was refluxed at 65° C. for 4 hours. After the reaction was terminated through distilled water, the organic solvent was extracted and then dried to obtain Compound a-2 (20.25 g) in a solid state.

MS: $[M+H]^+$=239

3) Preparation of Compound a-3

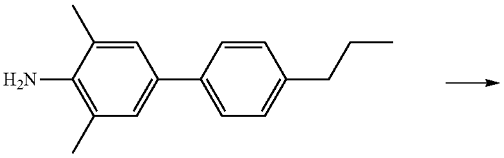

a-2

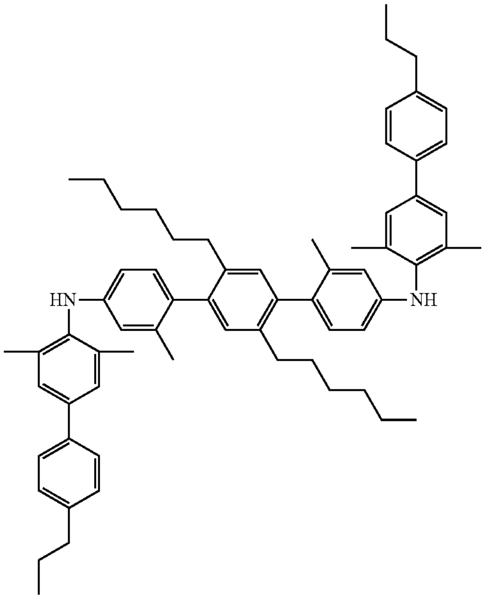

a-3

In a round flask equipped with a condenser, the previously prepared Compound a-2 (14.38 g, 3.00 eq) and 4,4"-dichloro-2',5'-dihexyl-2,2"-dimethyl-1,1':4',1"-terphenyl (14.38 g, 1.00 eq) were dissolved in xylene (200 mL). When the dissolution was completely performed, sodium tert-butoxide (13.94 g, 5.00 eq) and bis(tri-tert-butylphosphine)palladium(0) (0.74 g, 0.05 eq) were added thereto, and the mixture was refluxed at 120° C. for 3 hours, After the reaction was terminated through distilled water, the organic solvent was extracted with ethyl acetate and distilled water, and precipitated with toluene and hexane to obtain Compound a-3 (18.2 g) as a white solid.

MS: $[M+H]^+$=900

4) Preparation of Monomer A

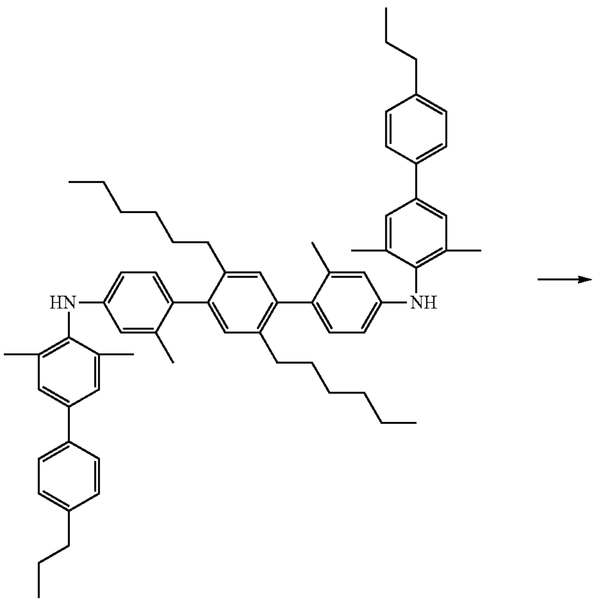

a-3

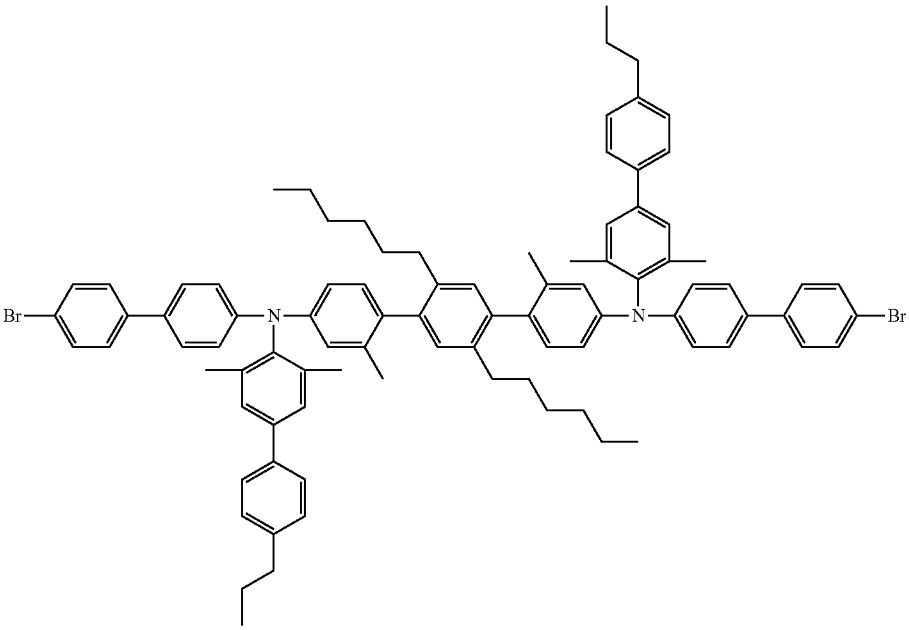

Monomer A

In a round flask equipped with a condenser, the previously prepared Compound a-3 (16.2 g, 1.00 eq), 4-bromo-4'-iodo-1,1'-biphenyl (19.35 g, 3.00 eq) and sodium tert-butoxide (5.18 g, 3.00 eq) were dissolved in toluene (200 mL). When the dissolution was completely performed, tris(dibenzylideneacetone)dipalladium(0) (0.32 g, 0.02 eq) and 1,1'-bis(diphenylphosphino)ferrocene (0.39 g, 0.04 eq) were added thereto, and the mixture was refluxed at 90° C. for 8 hours. After the reaction was terminated through distilled water, the organic solvent was extracted with ethyl acetate and distilled water, and subjected to column chromatography to obtain Monomer A (19.1 g) with a purity of 99.7%.

MS: $[M+H]^+$=1360

Preparation Example 2: Preparation of Monomer B

1) Preparation of Compound b-1

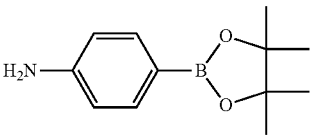

+

-continued

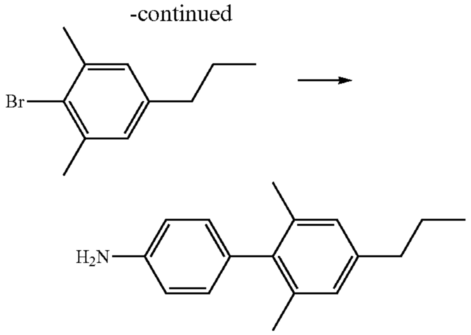

b-1

In a round flask equipped with a condenser, 4-(4,4,5,5-tetramethyl-1,3,2-dioxoborolan-2-yl)aniline (25.0 g, 1.00 eq) and 2-bromo-1,3-dimethyl-5-propylbenzene (28.0 g, 1.35 eq) were dissolved in tetrahydrofuran (300 mL). When the dissolution was completely performed, 2M aqueous sodium carbonate solution (100 mL) and bis(di-tert-butyl(4-dimethylaminophenyl)phosphine)dichloropalladium (II) (0.78 g, 0.015 eq) were added thereto, and the mixture was refluxed at 65° C. for 4 hours. After the reaction was terminated through distilled water, the organic solvent was extracted and then dried to obtain Compound b-1 (22.1 g) in a solid state.

2) Preparation of Compound b-2

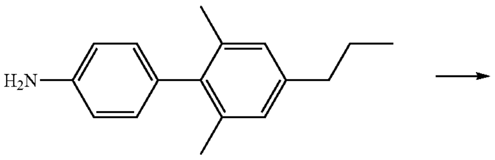

b-1

-continued

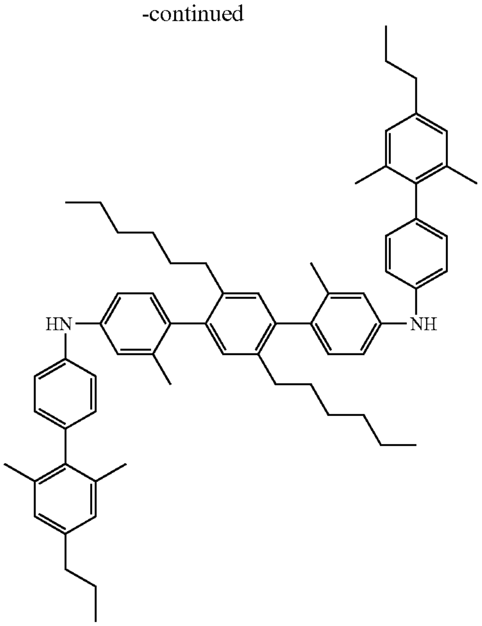

b-2

In a round flask equipped with a condenser, the previously prepared Compound b-1 (15.13 g, 3.00 eq) and 4,4"-di-chloro-2',5'-dihexyl-2,2"-dimethyl-1,1':4',1"-terphenyl (14.94 g, 1.00 eq) were dissolved in xylene (200 mL). When the dissolution was completely performed, sodium tert-butoxide (13.94 g, 5.00 eq) and bis(tri-tert-butylphosphine) palladium (0) (0.74 g, 0.05 eq) were added thereto, and the mixture was refluxed at 120° C. for 3 hours. After the reaction was terminated through distilled water, the organic solvent was extracted with ethyl acetate and distilled water, and precipitated with toluene and hexane to obtain Compound b-2 (19.1 g) as a white solid.

3) Preparation of Monomer B

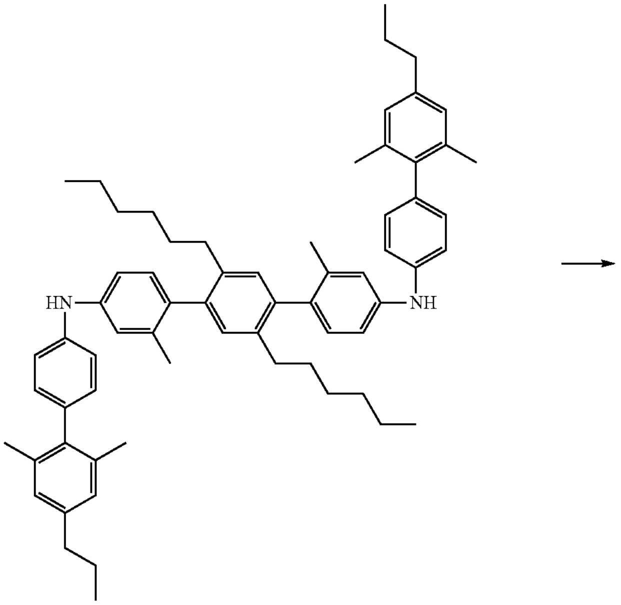

b-2

-continued

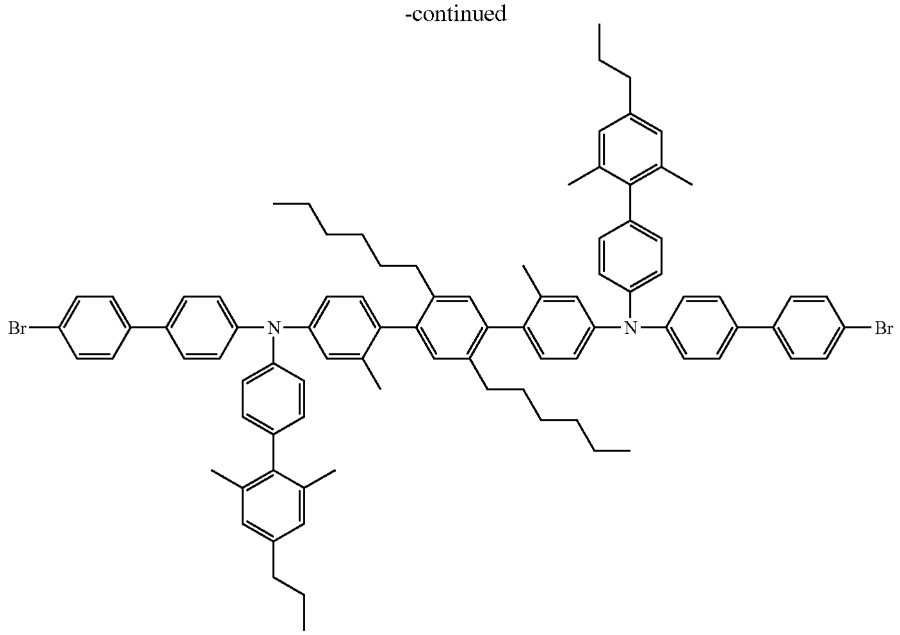

B

In a round flask equipped with a condenser, the previously prepared Compound b-2 (17.3 g, 1.00 eq), 4-bromo-4'-iodo-1,1"-biphenyl (20.12 g, 3.00 eq) and sodium tert-butoxide (5.18 g, 3.00 eq) were dissolved in toluene (200 mL). When the dissolution was completely performed, tris(dibenzylideneacetone)dipalladium(0) (0.32 g, 0.02 eq) and 1,1'-bis (diphenylphosphino)ferrocene (0.39 g, 0.04 eq) were added thereto, and the mixture was refluxed at 90° C. for 8 hours. After the reaction was terminated through distilled water, the organic solvent was extracted with ethyl acetate and distilled water, and subjected to column chromatography to obtain Monomer B (18.4 g) with a purity of 99.7%.

MS: $[M+H]^+$=1360

EXAMPLE

Example 1: Preparation of Polymer

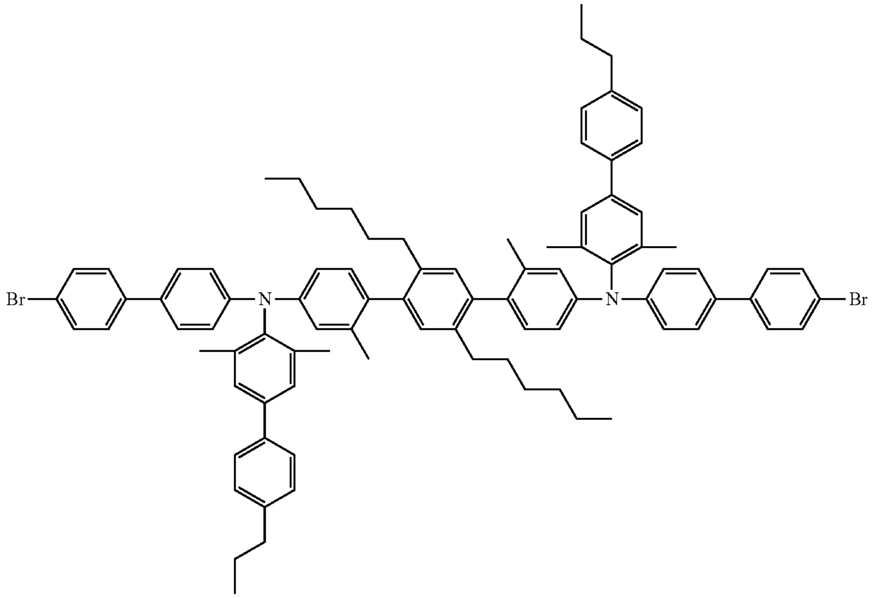

+

Monomer A

-continued

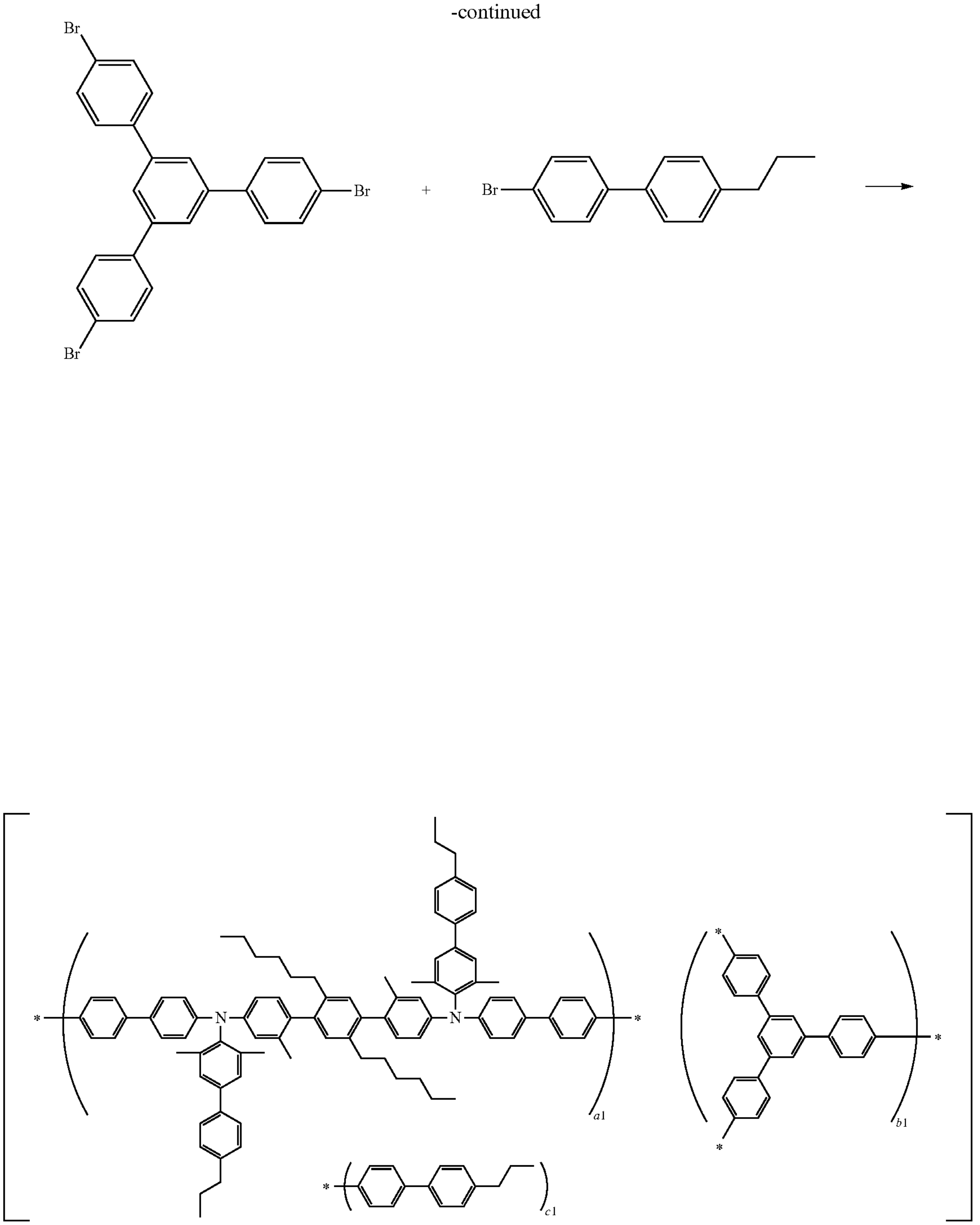

Polymer 1

Monomer A (0.765 mmol), 4,4"-dibromo-5'-(4-bromophenyl)-1,1':3',1"-terphenyl (0.158 mmol) and 4-bromo-4'-propyl-1,1'-biphenyl (0.369 mmol) were added to a round flask and dissolved in toluene (11 mL) to prepare a first solution.

Bis(1,5-cyclooctadiene)nickel(0) (2.42 mmol) was added to a 50 mL Schlenk tube, and 2,2'-dipyridyl (2.42 mmol) and 1,5-cyclooctadiene (2.42 mmol) were added to a scintillation vial, and then dissolved in N,N'-dimethylformamide (5.5 mL) and toluene (11 mL) to prepare a second solution.

The second solution was added to a Schlenk tube and stirred at 50° C. for 30 minutes. The first solution was further added to a Schlenk tube and stirred at 50° C. for 3 hours. HCl and methanol (methanol:HCl=10:1 (v:v)) was slowly added dropwise to the reaction. After the reaction was completed, the mixture was stirred for 45 minutes, and the resulting solid was filtered. The dried solid was dissolved in toluene (1% wt/v) and purified through a column containing silica gel and basic aluminum oxide (6 g each). The obtained toluene solution was triturated in acetone to prepare Polymer 1 (5.2 g).

Example 2: Preparation of Polymer 2
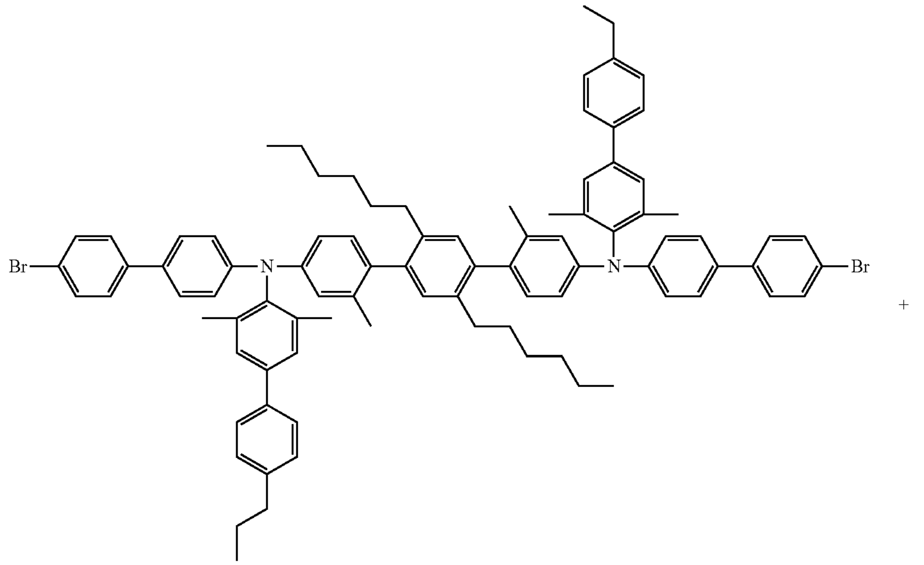
Monomer A
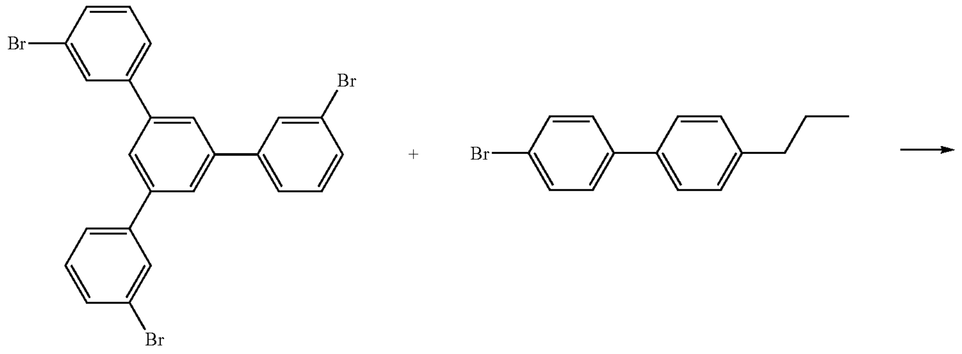
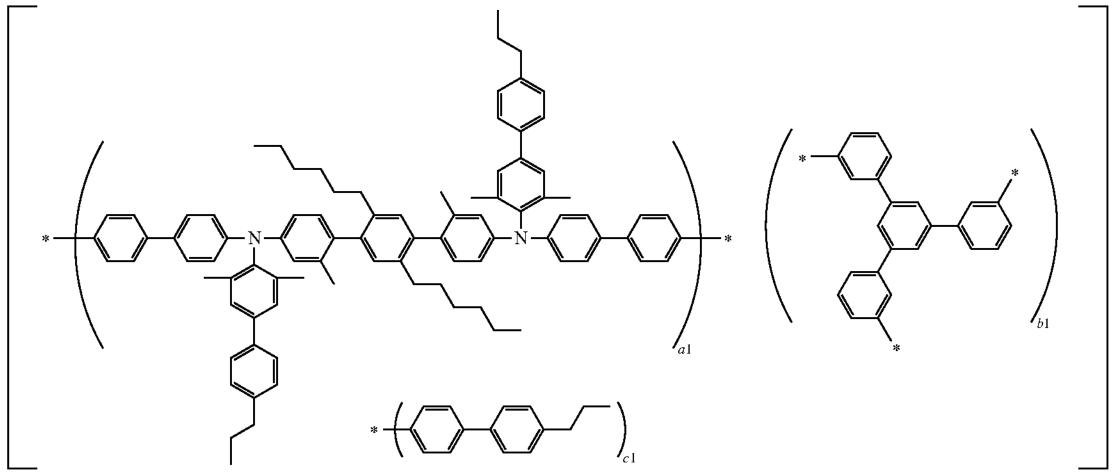
Polymer 2

Polymer 2 was prepared in the same manner as in Example 1, except that 3,3"-dibromo-5'-(3-bromophenyl)-1,1':3',1"-terphenyl was used instead of 4,4"-dibromo-5'-(4-bromophenyl)-1,1':3',1"-terphenyl.
Example 3: Preparation of Polymer 3
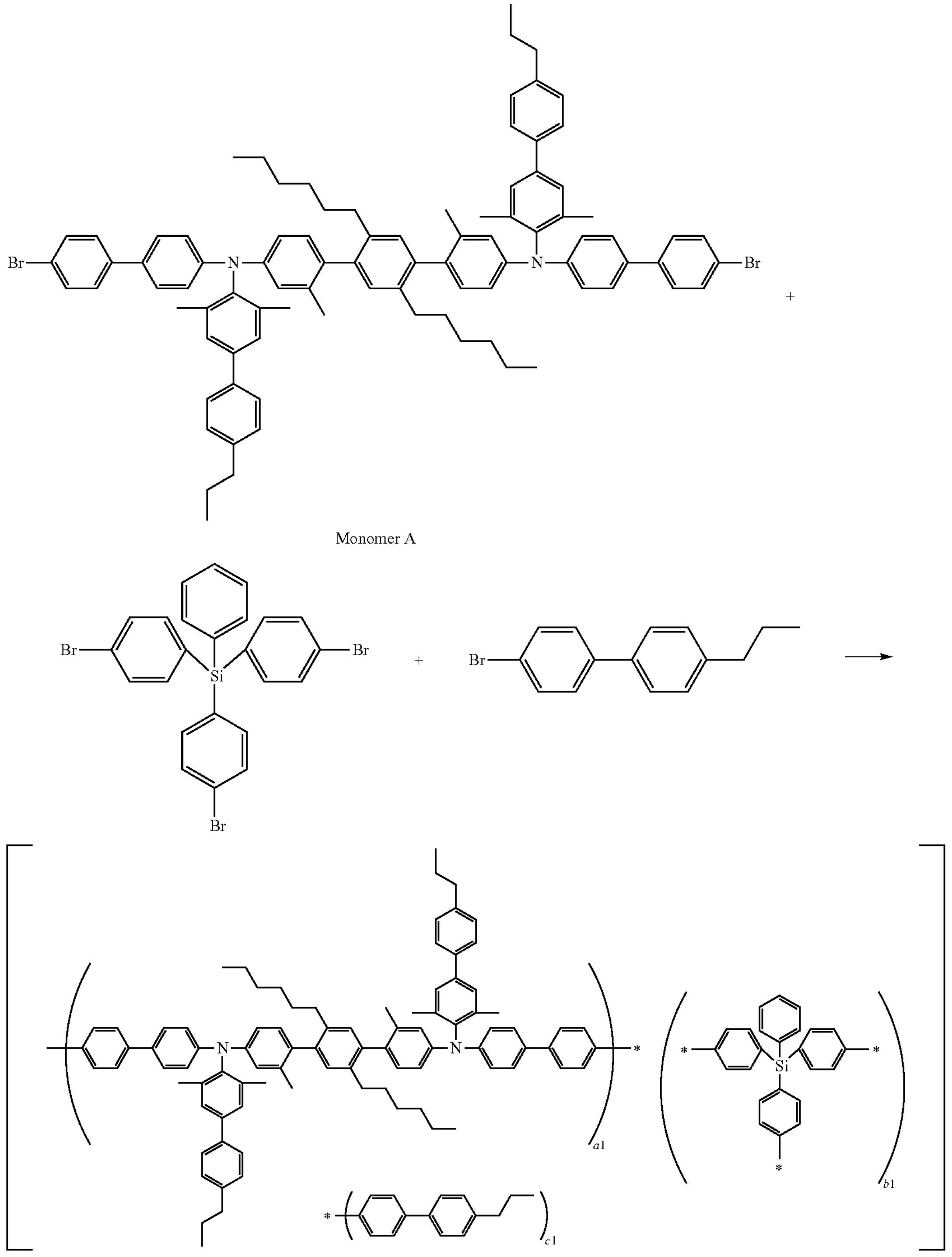
Monomer A
Polymer 3

Polymer 3 was prepared in the same manner as in Example 1, except that tris(4-bromophenyl)(phenyl)silane was used instead of 4,4"-dibromo-5'-(4-bromophenyl)-1,1':3',1"-terphenyl.
Example 4: Preparation of Polymer 4
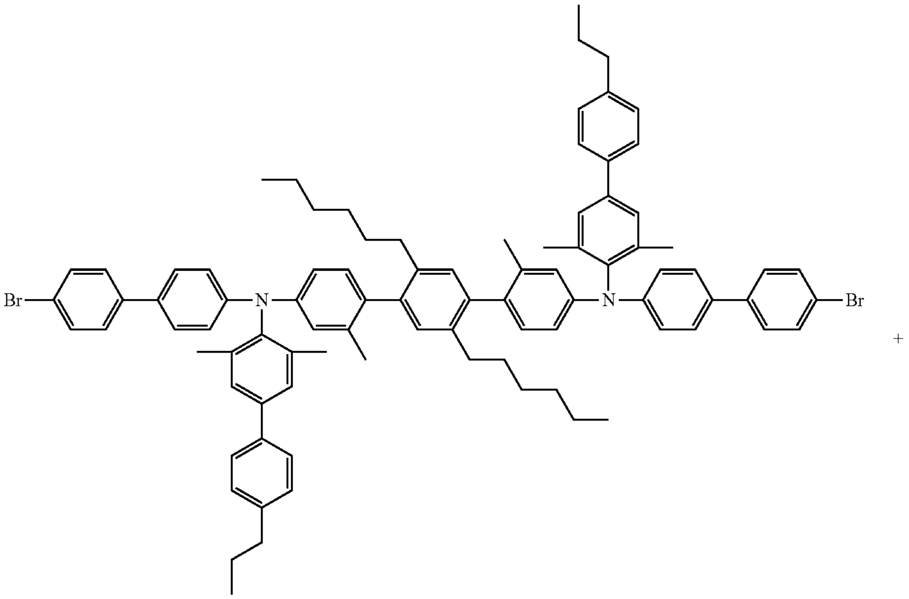
Monomer A
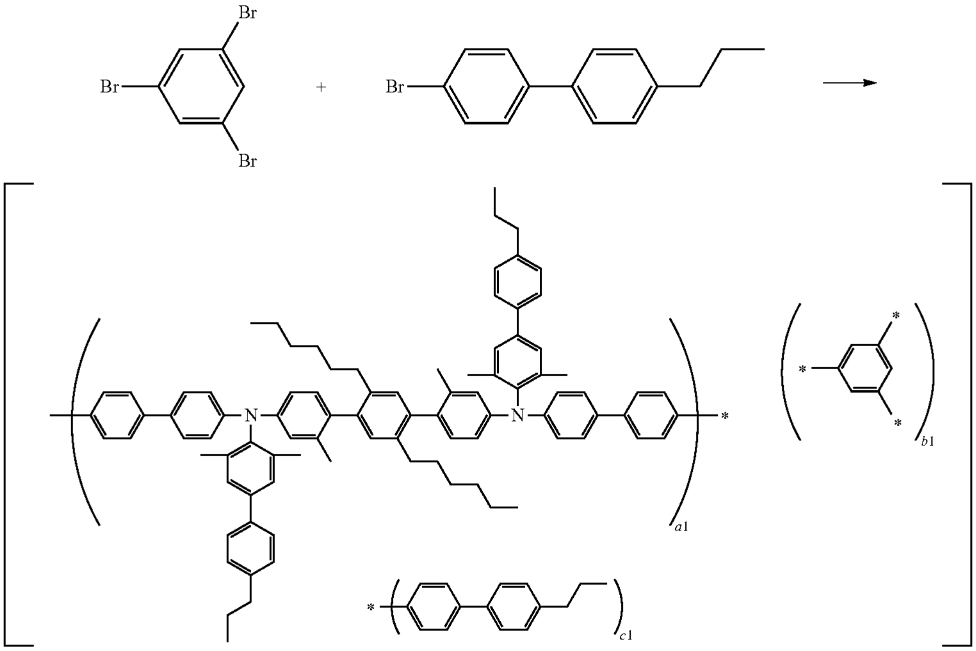
Polymer 4

Polymer 4 was prepared in the same manner as in Example 1, except that 1,3,5-tribromobenzene was used instead of 4,4"-dibromo-5'-(4-bromophenyl)-1,1':3'1"-terphenyl.
Example 5: Preparation of Polymer 5
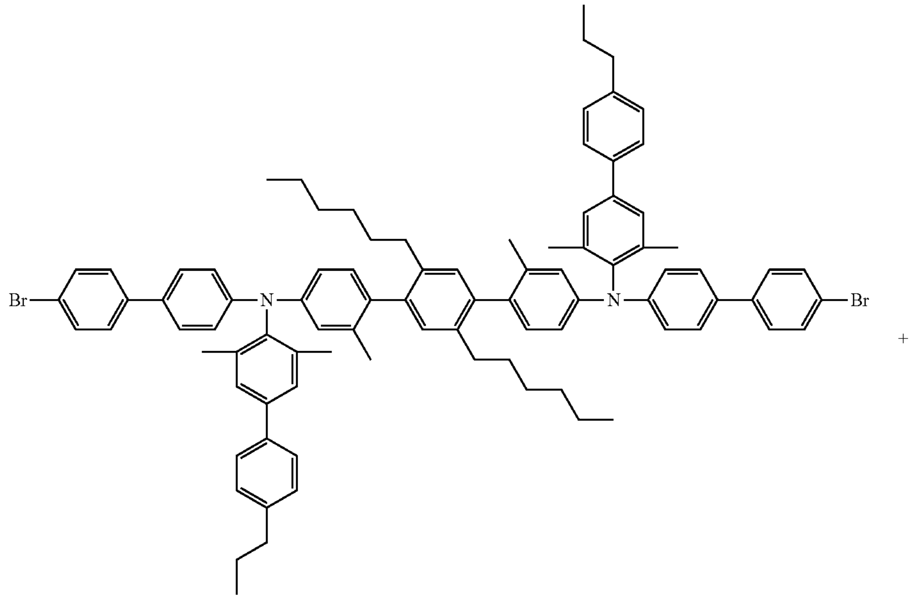
Monomer A
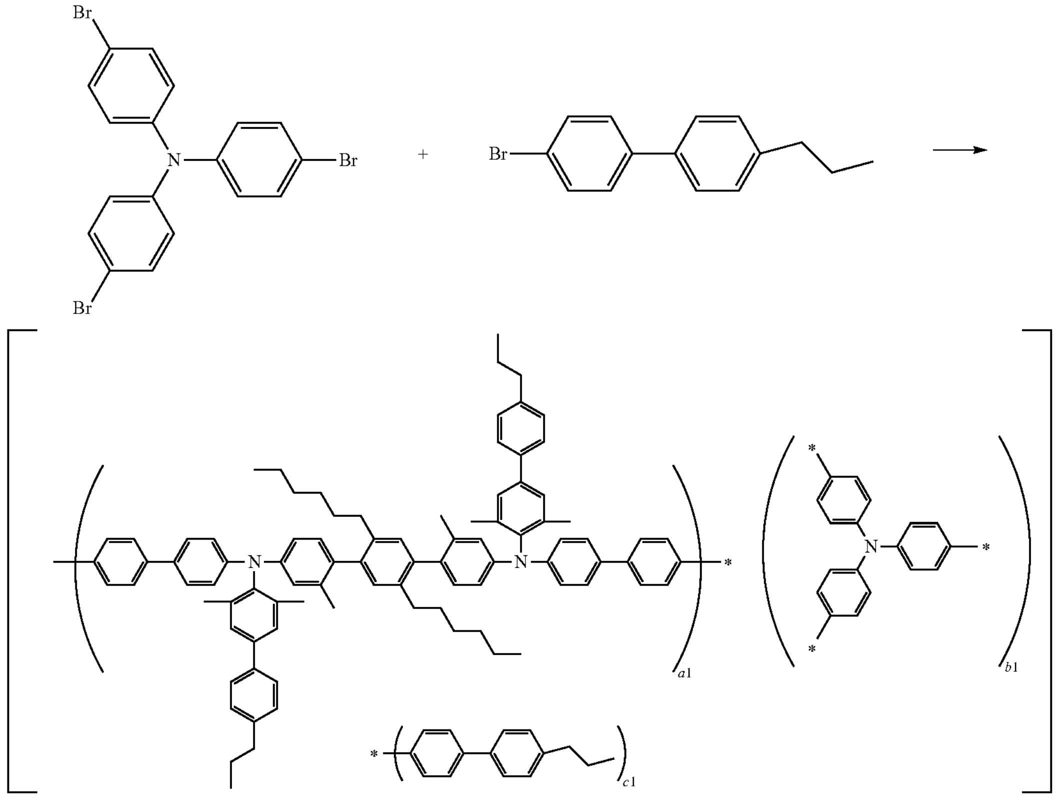
Polymer 5

Polymer 5 was prepared in the same manner as in Example 1, except that tris(4-bromophenyl)amine was used instead of 4,4"-dibromo-5'-(4-bromophenyl)-1,1':3',1"-terphenyl.
Example 6: Preparation of Polymer 6
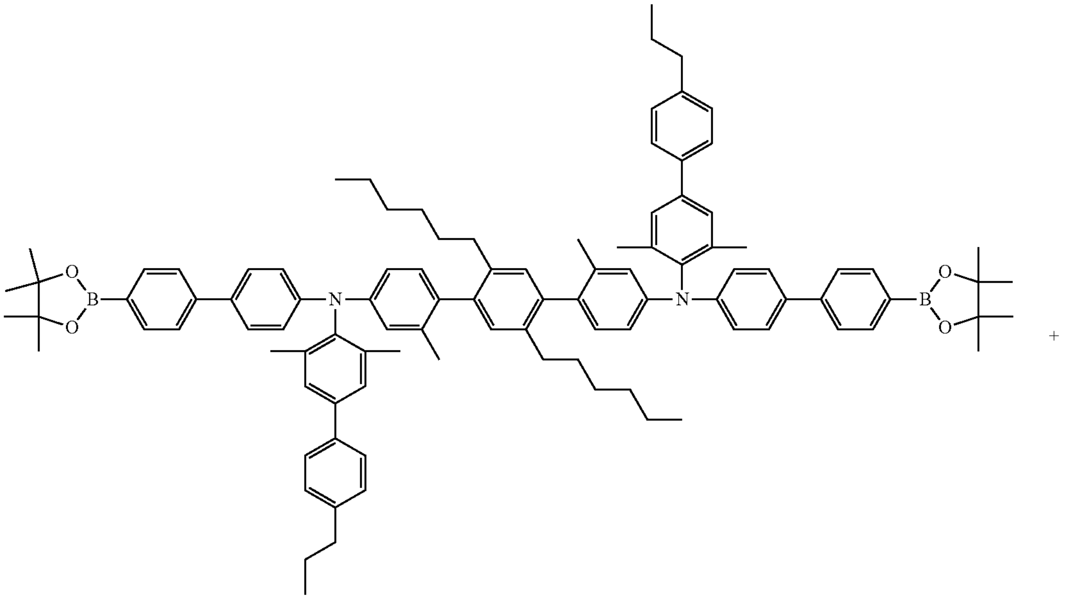
Monomer A′
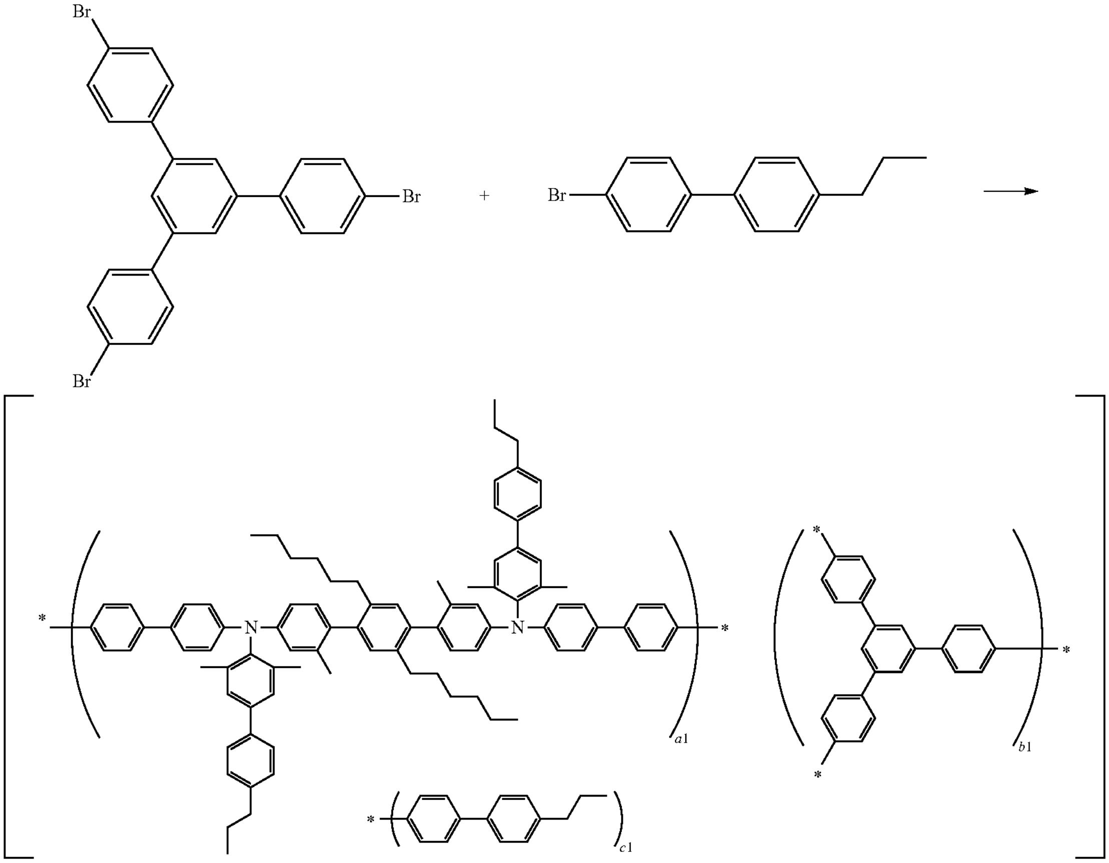
Polymer 6

Monomer A' (0.765 mmol), 4,4"-dibromo-5'-(4-bromophenyl)-1,1':3',1"-terphenyl (0.158 mmol) and 4-bromo-4'-propyl-1,1'-biphenyl (0.369 mmol) was added to a round flask and dissolved in toluene (11 mL). Then, $Pd(PPh_3)_4$ (0.05 mmol), 2M $K_2CO_3$ solution (5 mL), and Aliquit336 (0.1 mL) as a phase transfer catalyst were injected, and then was refluxed at 100° C. for 12 hours. Methanol was slowly added dropwise to the reaction. After the reaction was completed, the mixture was stirred for 45 minutes, and the resulting solid was filtered. The dried solid was dissolved in toluene (1% wt/v) and purified through a column containing silica gel and basic aluminum oxide (6 g each). The prepared toluene solution was triturated in acetone to prepare Polymer 6 (5.2 g).

Example 7: Preparation of Polymer 7

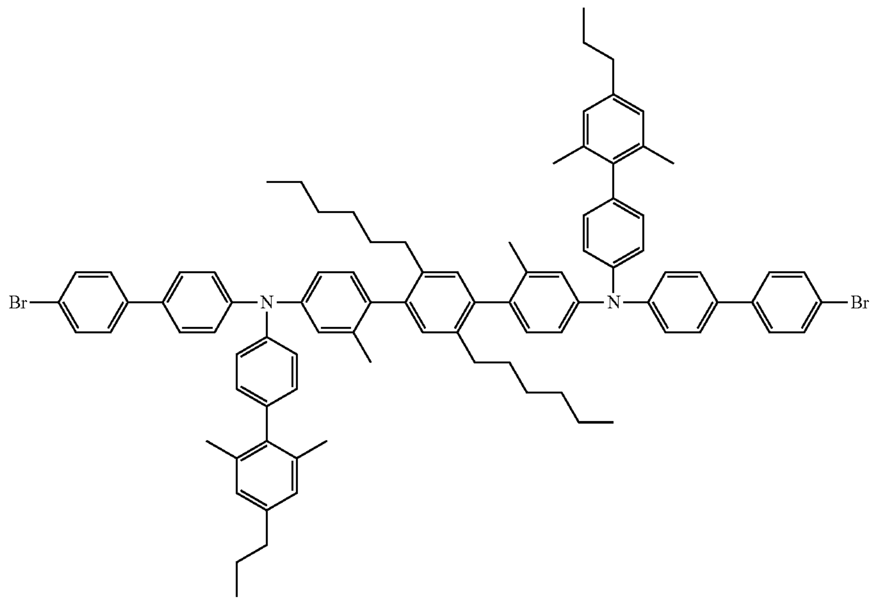

Monomer B

+

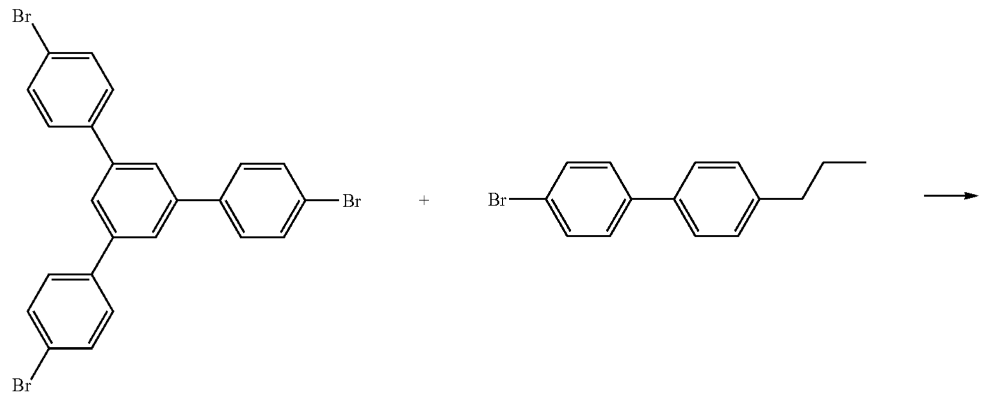

+

-continued
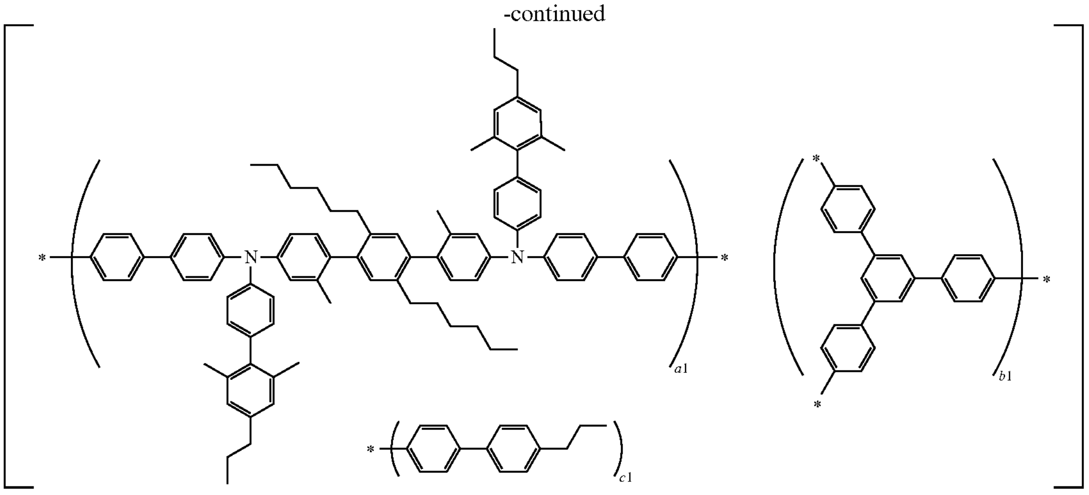
Polymer 7
Polymer 7 was prepared in the same manner as in Example 1, except that Monomer B was used instead of Monomer A.
Example 8: Preparation of Polymer 8
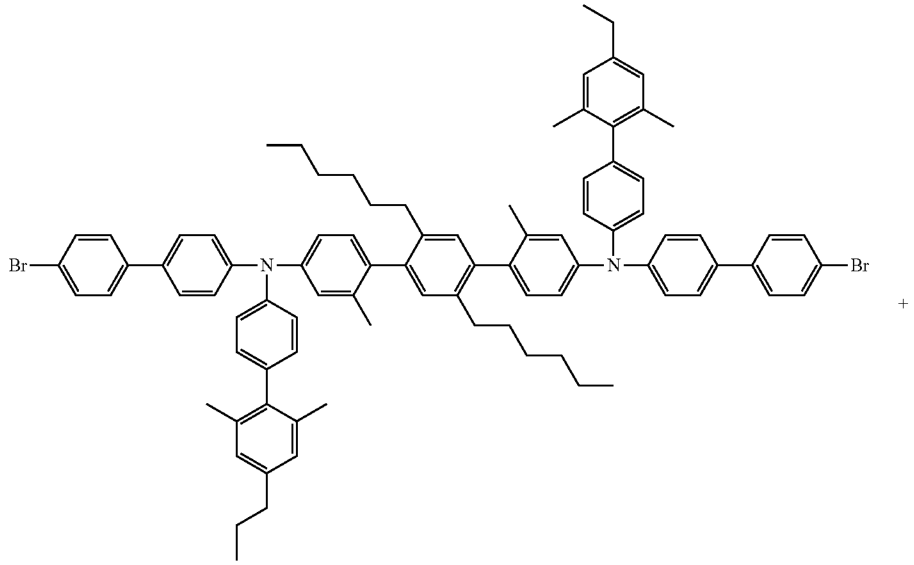
Monomer B
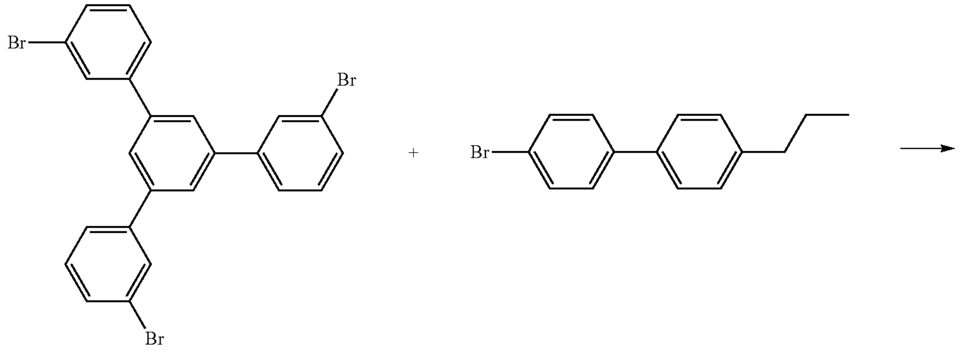

-continued
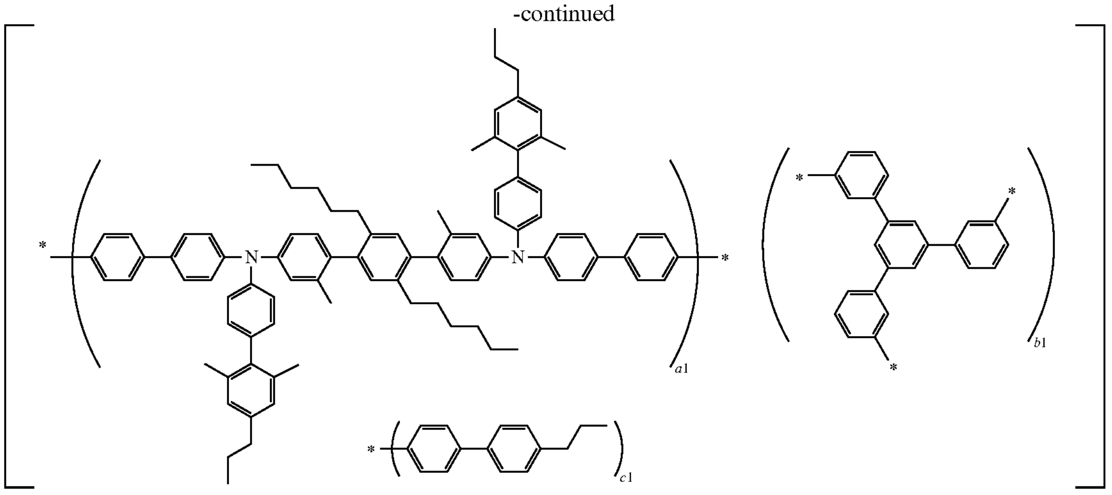
Polymer 8
Polymer 8 was prepared in the same manner as in Example 7, except that 3,3"-dibromo-5'-(3-bromophenyl)-1,1':3',1"-terphenyl was used instead of 4,4"-dibromo-5'-(4-bromophenyl)-1,1':3',1"-terphenyl.
Example 9: Preparation of Polymer 9
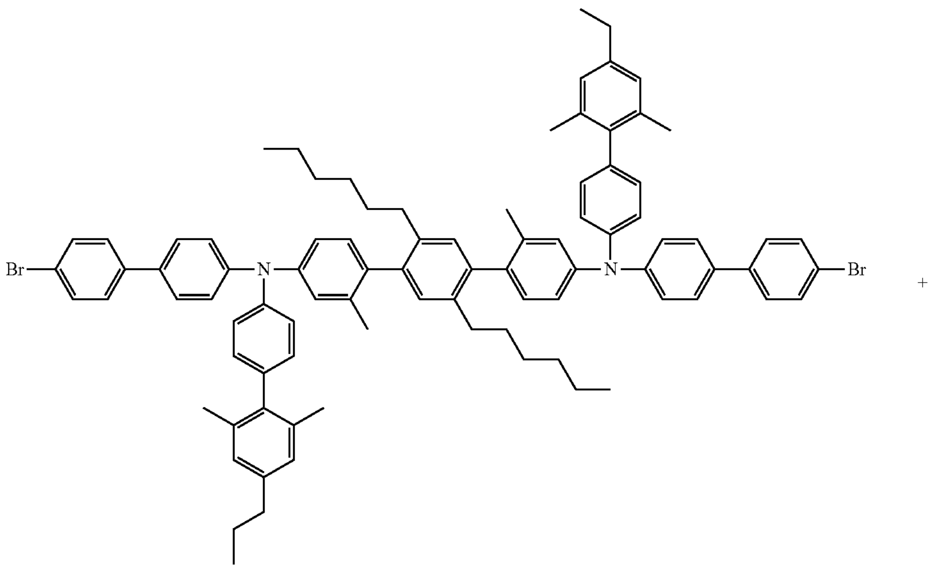
Monomer B
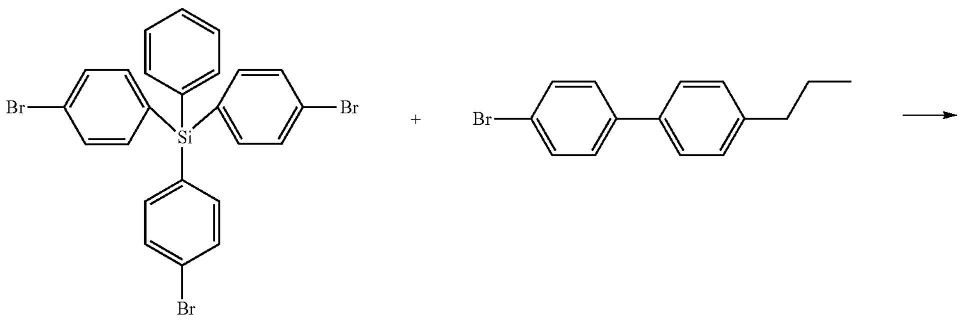

-continued
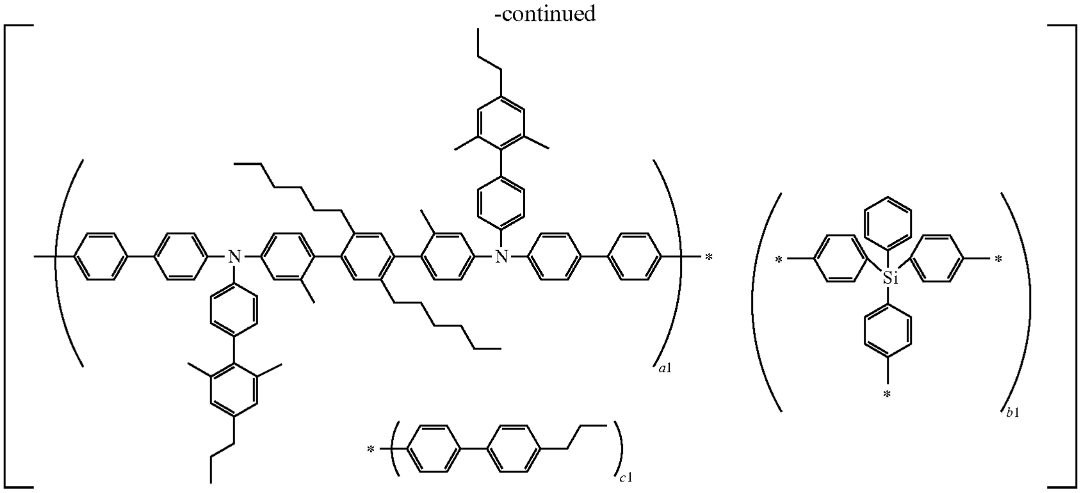
Polymer 9
Polymer 9 was prepared in the same manner as in Example 7, except that tris(4-bromophenyl)(phenyl)silane was used instead of 4,4"-dibromo-5'-(4-bromophenyl)-1,1':3',1"-terphenyl.
Example 10: Preparation of Polymer 10
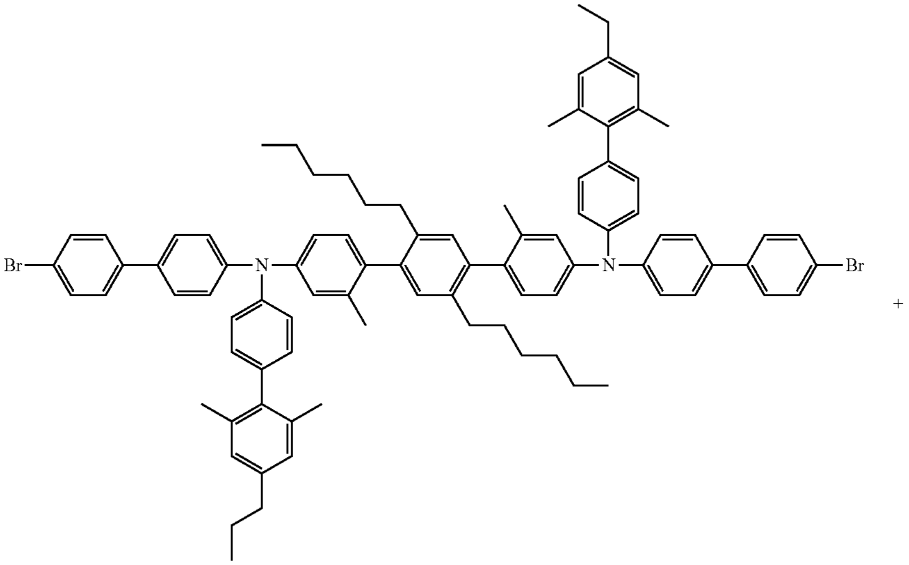
Monomer B
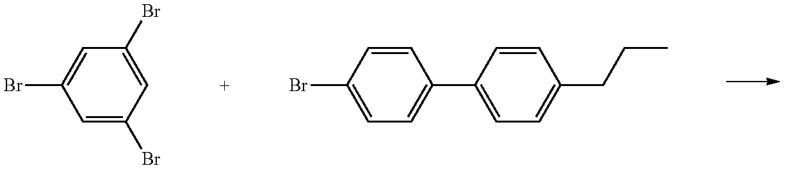

-continued
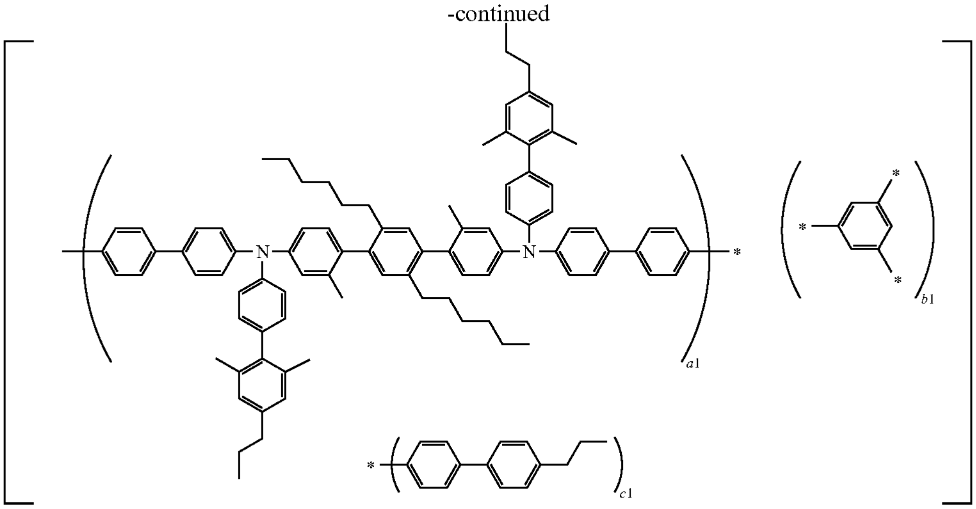
Polymer 10
Polymer 10 was prepared in the same manner as in Example 7, except that 1,3,5-tribromobenzene was used instead of 4,4"-dibromo-5'-(4-bromophenyl)-1,1':3',1"-terphenyl.
Example 11: Preparation of Polymer 11
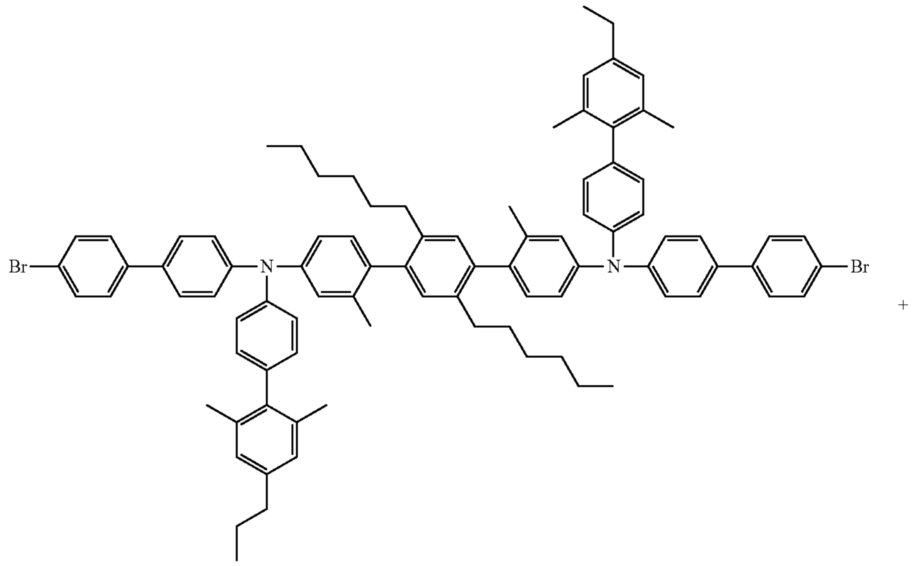
Monomer B
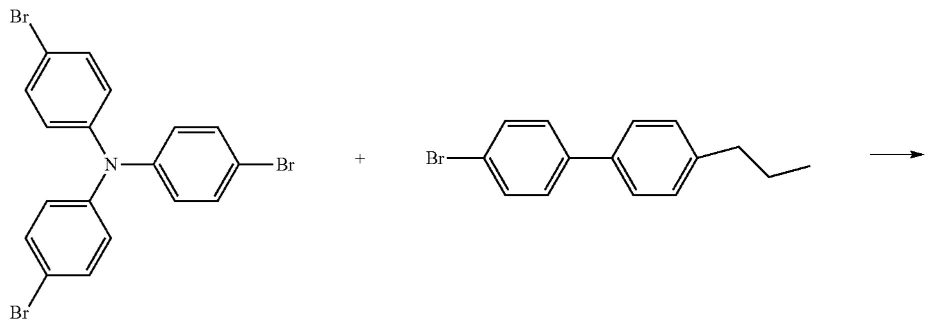

-continued
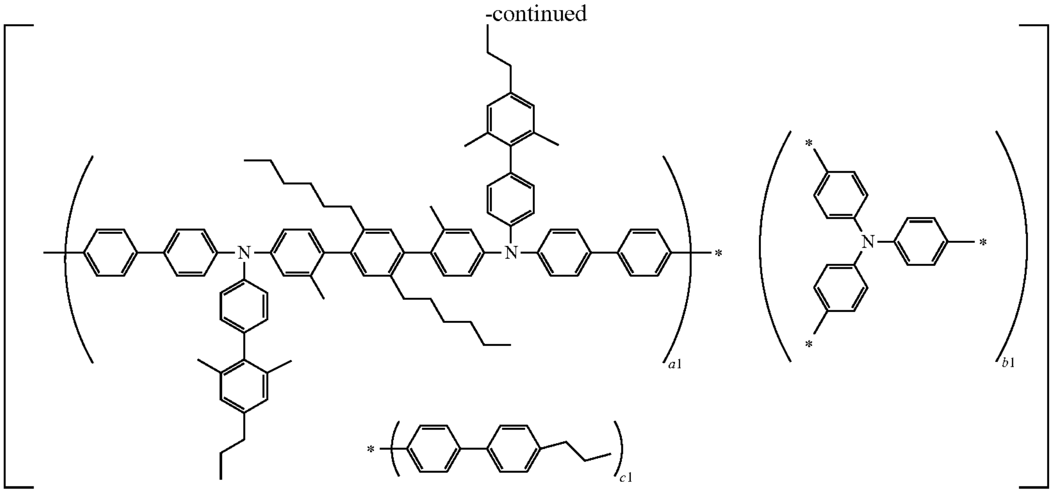
Polymer 11
Polymer 11 was prepared in the same manner as in Example 7, except that tris(4-bromophenyl)amine was used instead of 4,4"-dibromo-5'-(4-bromophenyl)-1,1':3',1"-terphenyl.
Example 12: Preparation of Polymer 12
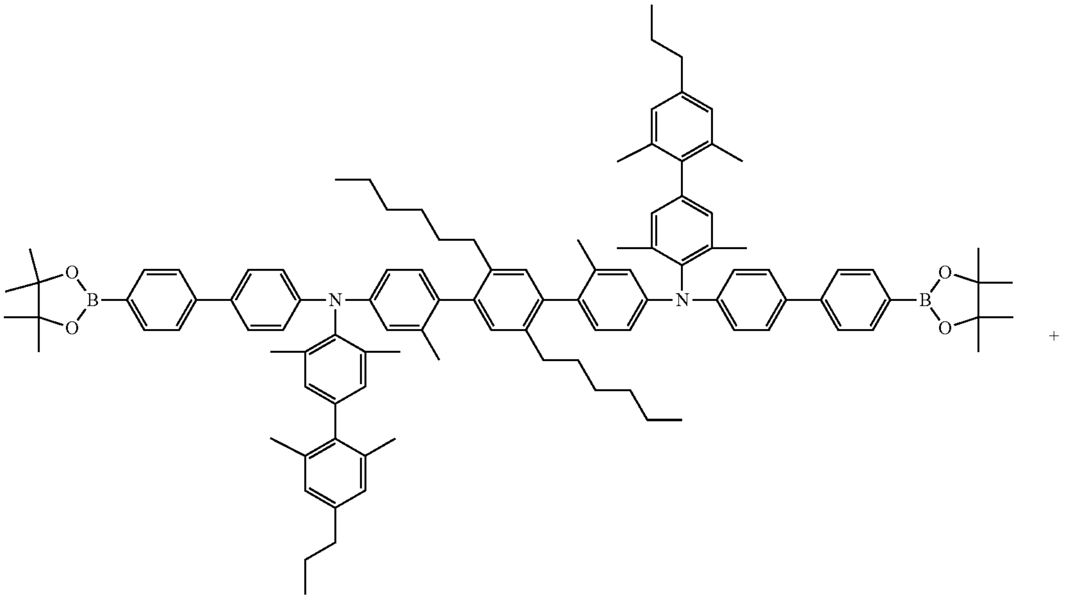
Monomer B'

-continued
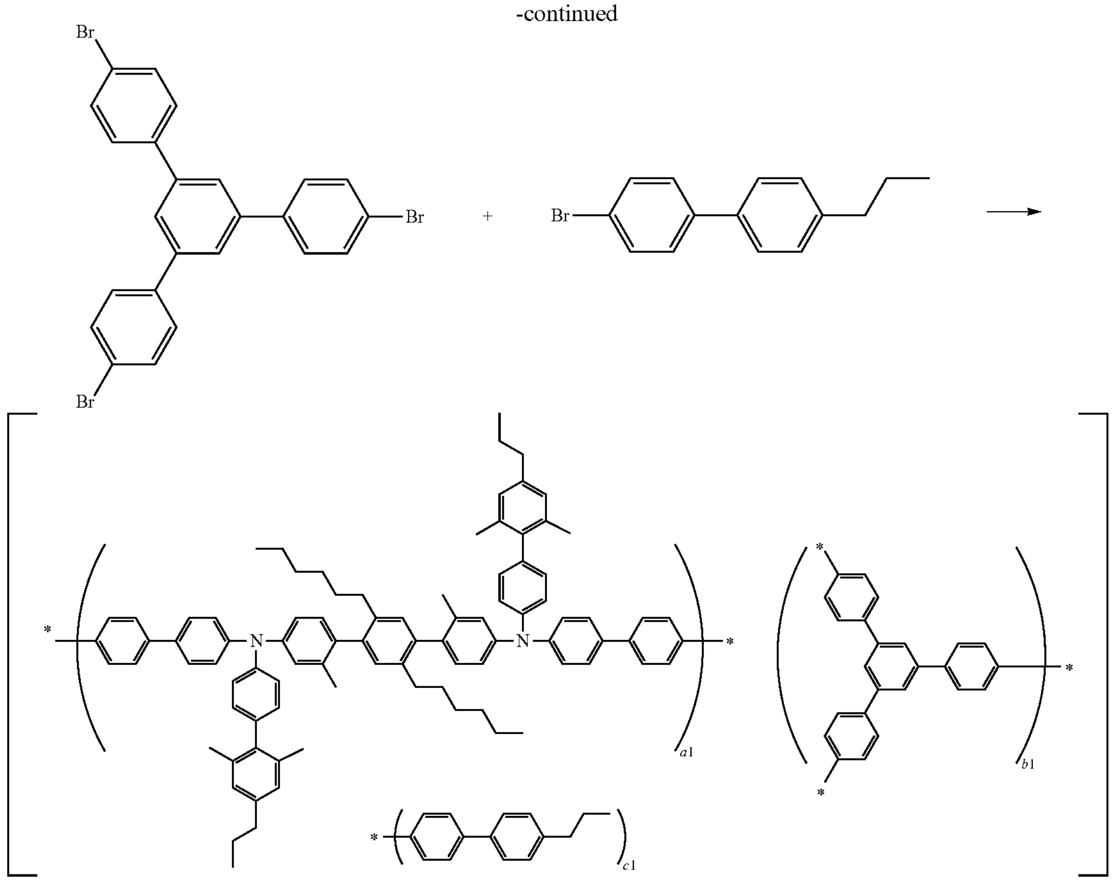
Polymer 12
Polymer 12 was prepared in the same manner as in Example 6, except that Monomer B' was used instead of Monomer A'.
Comparative Example: Preparation of Comparative Polymer
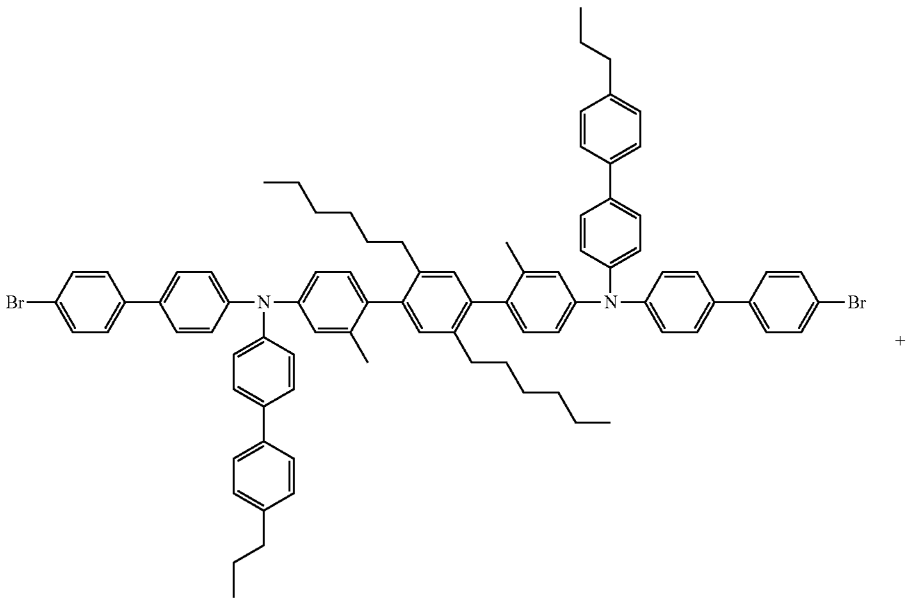
Monomer A'

-continued

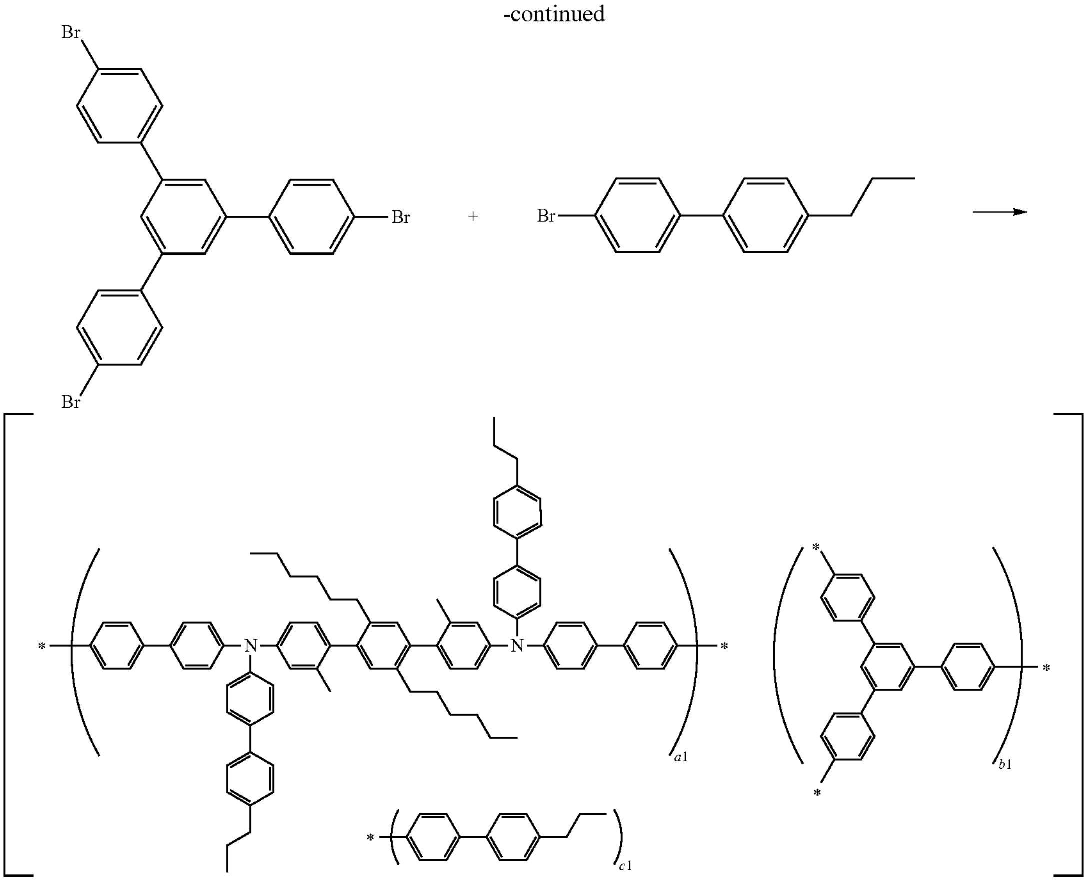

Comparative Polymer

Comparative Polymer was prepared in the same manner as in Example 1, except that Monomer A' was used instead of Monomer A.

The number average molecular weight (Mn), weight average molecular weight (Mw) and molecular weight distribution (PDI, Mw/Mn) of Polymers 1 to 12 and Comparative Polymer prepared above were measured by GPC (Agilent 1200 series) using a PC standard. The prepared polymer was measured using a solution in which 1 wt % of THF was dissolved. The results are shown in Table 1 below.

TABLE 1

| | a1:b1:e1 | Mn | Mw | PDI |
|---|---|---|---|---|
| Polymer 1 | 53.7:18.3:28.0 | 32K | 86K | 2.66 |
| Polymer 2 | 53.7:18.3:28.0 | 35K | 91K | 2.65 |
| Polymer 3 | 57.0:17.9:25.1 | 39K | 126K | 3.17 |
| Polymer 4 | 57.6:19.4:23.0 | 38K | 122K | 3.21 |
| Polymer 5 | 56.4:17.6:26.0 | 39K | 129K | 3.23 |
| Polymer 6 | 55.7:18.3:26.0 | 32K | 111K | 3.46 |
| Polymer 7 | 53.7:18.3:28.0 | 35K | 110K | 3.14 |
| Polymer 8 | 54.0:17.9:28.1 | 39K | 114K | 2.92 |
| Polymer 9 | 56.6:19.4:24.0 | 38K | 121K | 3.18 |
| Polymer 10 | 55.3:17.6:27.1 | 39K | 122K | 3.12 |
| Polymer 11 | 54.3:18.4:27.3 | 38K | 118K | 3.10 |
| Polymer 12 | 56.1:17.6:26.3 | 39K | 96K | 2.46 |
| Comparative Polymer | 53.7:18.3:28.0 | 30K | 100K | 3.33 |

EXPERIMENTAL EXAMPLE

Experimental Example 1

In the following, as the HIL material used in the preparation of the hole injection layer, the material prepared in Example 1 of U.S. Pat. No. 7,351,358 was used. In addition, as the dopant, the following bis(diarylamino)benzofluorene-based compound described in U.S. Pat. No. 8,465,848 was used.

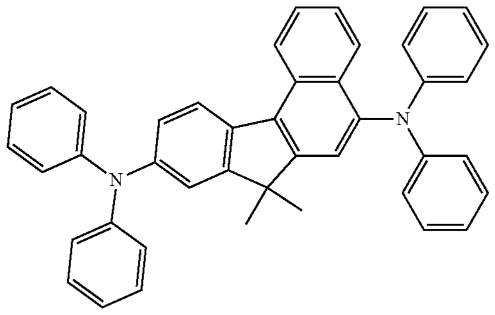 [SMILES: CC1(C)c2cc(N(c3ccccc3)c3ccccc3)ccc2-c2c1cc(N(c1ccccc1)c1ccccc1)c1ccccc21]

Further, the host used the following deuterated anthracene compound described in International Patent Publication WO 2011/028216.

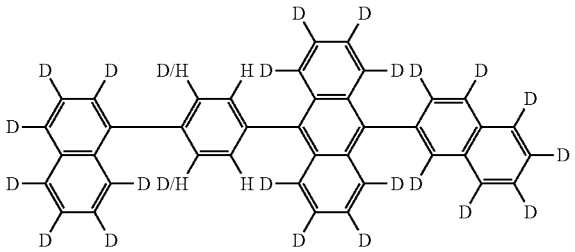

A glass substrate on which ITO (indium tin oxide) was coated as a thin film to a thickness of 1,500 Å was put into distilled water in which a detergent was dissolved, and ultrasonically cleaned. In this case, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol and acetone, dried, and then the substrate was cleaned for 5 minutes, and then dried.

Immediately before device fabrication, the cleaned and patterned ITO was treated with UV ozone for 10 minutes. After ozone treatment, an aqueous dispersion of HIL was spin-coated onto the ITO surface, and heat-treated at 230° C. for 10 minutes to remove the solvent, thereby forming a hole injection layer having a thickness of 400 Å. A toluene solution in which the previously prepared Polymer 1 was dissolved at a concentration of 1.5 wt % was spin-coated onto the hole injection layer, and heat-treated at 230° C. for 10 minutes to remove the solvent, thereby forming a hole transport layer having a thickness of 1000 Å. A methyl benzoate solution in which a host and a dopant (host: dopant=93:7 (wt %)) were dissolved at a concentration of 2.0 wt % was spin-coated onto the hole transport layer to form a light emitting layer having a thickness of 1000 Å. Then, after transferring to a vacuum evaporator, BCP (Bathocuproine) was vacuum-deposited on the light emitting layer to form an electron injection and transport layer having a thickness of 350 Å. LiF and aluminum were sequentially deposited to have a thickness of 10 Å and 1,000 Å on the electron injection and transport layer to form a cathode.

In the above-mentioned process, the vapor deposition rate of lithium fluoride on the cathode was maintained at 0.3 Å/sec, the deposition rate of aluminum was maintained at 2 Å/sec, and the degree of vacuum during the deposition was maintained at $2\times10^{-7}$ to $5\times10^{-6}$ torr.

Experimental Examples 2 to 12

The organic light emitting device was manufactured in the same manner as in Experimental Example 1, except that the polymers shown in Table 2 below were used instead of Polymer 1.

Comparative Experimental Example

The organic light emitting device was manufactured in the same manner as in Experimental Example 1, except that Comparative Polymer was used instead of Polymer 1.

The driving voltage, luminous efficiency, power efficiency, external quantum efficiency, luminance, chromaticity diagram, and CE/CIEy were measured at a current density of 10 mA/cm$^2$ for the organic light emitting devices manufactured in Experimental Examples and Comparative Experimental Example above, and the results are shown in Table 2 below. The external quantum efficiency was calculated by (number of emitted photons)/(number of injected charge carriers), the chromaticity diagram is the x and y coordinates according to the C.I.E chromaticity diagram (Commission Internationale de L'Eclairage, 1931), and CE/CIEy is a value obtained by dividing the luminous efficiency (cd/A) by the color coordinate (y) value.

TABLE 2

| | Hole transport layer | Driving voltage (V) | Luminous efficiency (cd/A) | Power efficiency (lm/W) | External quantum efficiency (QE)(%) | Luminance (cd/m$^2$) | Color coordinate (x, y) | CE/CIEy |
|---|---|---|---|---|---|---|---|---|
| Experimental Ex. 1 | Polymer 1 | 4.81 | 4.77 | 3.12 | 6.25 | 477.06 | (0.140, 0.093) | 51.29 |
| Experimental Ex. 2 | Polymer 2 | 4.76 | 4.73 | 3.12 | 6.25 | 473.28 | (0.140, 0.091) | 51.98 |
| Experimental Ex. 3 | Polymer 3 | 5.74 | 5.04 | 2.76 | 6.55 | 503.93 | (0.140, 0.094) | 53.62 |
| Experimental Ex. 4 | Polymer 4 | 5.22 | 4.99 | 3.01 | 6.39 | 499.25 | (0.139, 0.096) | 51.98 |
| Experimental Ex. 5 | Polymer 5 | 5.19 | 4.98 | 3.01 | 6.38 | 498.27 | (0.139, 0.095) | 52.42 |
| Experimental Ex. 6 | Polymer 6 | 4.44 | 4.66 | 3.29 | 5.69 | 465.97 | (0.138, 0.103) | 45.43 |
| Experimental Ex. 7 | Polymer 7 | 4.37 | 4.58 | 3.29 | 5.58 | 458.01 | (0.139, 0.103) | 44.48 |
| Experimental Ex. 8 | Polymer 8 | 4.54 | 4.69 | 3.25 | 5.82 | 469.09 | (0.139, 0.100) | 46.81 |
| Experimental Ex. 9 | Polymer 9 | 4.67 | 4.68 | 3.15 | 6.17 | 467.68 | (0.141, 0.092) | 51.04 |
| Experimental Ex. 10 | Polymer 10 | 4.24 | 4.59 | 3.40 | 6.03 | 458.51 | (0.140, 0.092) | 49.84 |
| Experimental Ex. 11 | Polymer 11 | 5.25 | 4.97 | 2.98 | 5.90 | 497.43 | (0.138, 0.107) | 46.72 |
| Experimental Ex. 12 | Polymer 12 | 5.04 | 4.83 | 3.01 | 5.69 | 482.55 | (0.137, 0.108) | 44.71 |
| Comparative Experimental Ex. | Comparative Polymer | 7.81 | 1.21 | 0.49 | 1.41 | 121.05 | (0.150, 0.107) | 11.31 |

As shown in Table 2, it can be confirmed that the polymers according to the present disclosure have a lower driving voltage and improved efficiency as compared with the polymer used in Comparative Experimental Example.

Explanation of Sign

| | |
|---|---|
| 1: substrate | 2: anode |
| 3: hole transport layer | 4: light emitting layer |
| 5: cathode | 6: hole injection layer |
| 7: electron transport layer | 8: electron injection layer |

The invention claimed is:

1. An organic light emitting device comprising an anode; a cathode that is disposed opposite to the anode; a light emitting layer that is provided between the anode and the cathode; and a hole transport layer that is provided between the anode and the light emitting layer, wherein the hole transport layer comprises a polymer comprising a repeating unit represented by Chemical Formula 1' or 1":

[Chemical Formula 1′]

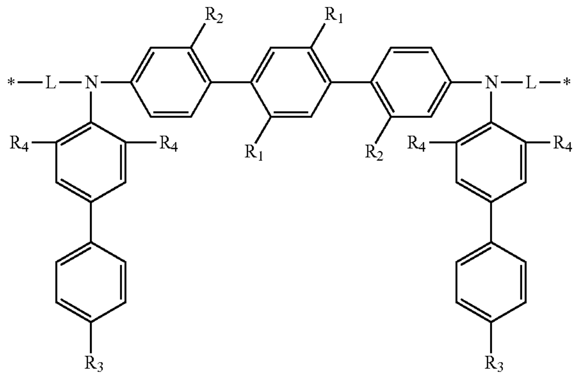

[Chemical Formula 1″]

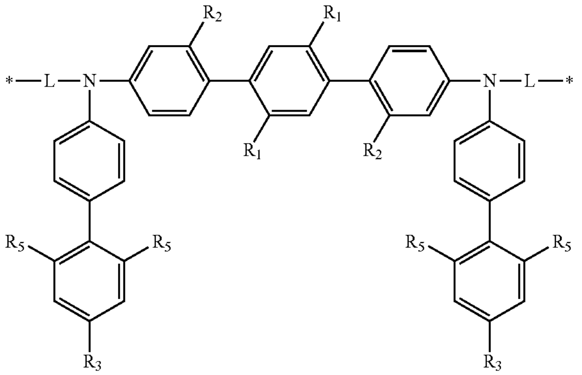

in Chemical Formula 1' and 1", each L is independently a substituted or unsubstituted $C_{6-10}$ arylene, each $R_1$ is independently a substituted or unsubstituted $C_{4-10}$ alkyl, each $R_2$ is independently a substituted or unsubstituted $C_{1-4}$ alkyl, each $R_3$ is independently a substituted or unsubstituted $C_{1-10}$ alkyl, and

* indicates the point of attachment within the polymer, in Chemical Formula 1', each $R_4$ is independently a substituted or unsubstituted $C_{1-4}$ alkyl, and in Chemical Formula 1", each $R_5$ is independently a substituted or unsubstituted $C_{1-4}$ alkyl.

2. The organic light emitting device according to claim 1, wherein each L is independently phenylene, or biphenyl.

3. The organic light emitting device according to claim 1, wherein each L is independently

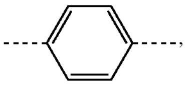

, or

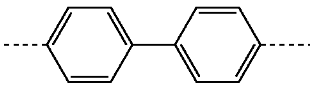

.

4. The organic light emitting device according to claim 1, wherein each $R_1$ is independently a straight-chain hexyl, a straight-chain heptyl, a straight-chain octyl, a straight-chain nonyl, or a straight-chain decyl.

5. The organic light emitting device according to claim 1, wherein each $R_2$ is independently methyl, ethyl, or propyl.

6. The organic light emitting device according to claim 1, wherein each $R_3$ is independently methyl, ethyl, or propyl.

7. The organic light emitting device according to claim 1, wherein each $R_4$ is independently methyl, ethyl, or propyl.

8. The organic light emitting device according to claim 1, wherein:

the repeating unit is represented by one of the following formulas:

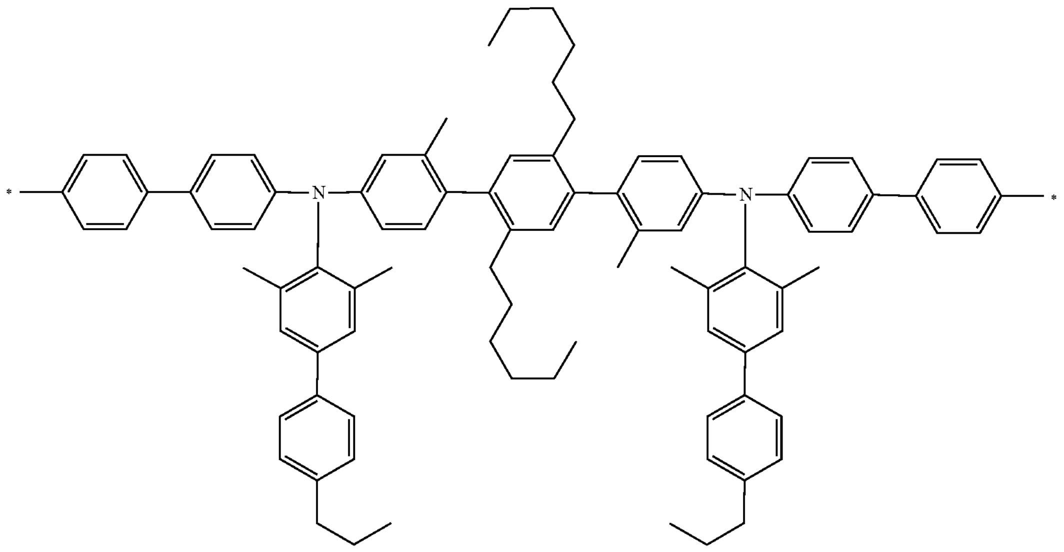

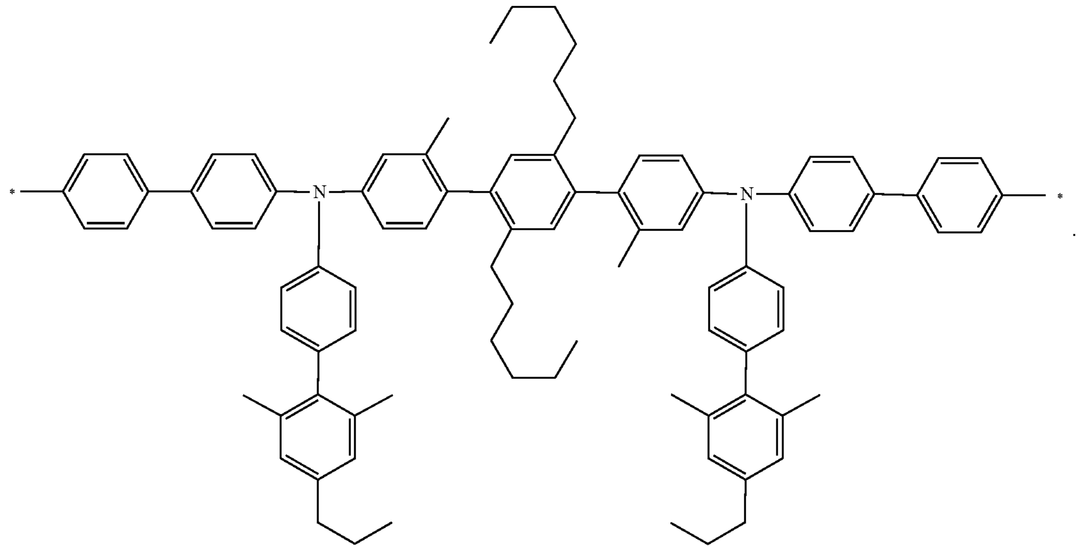

9. The organic light emitting device according to claim 1, wherein:

the polymer further comprises a repeating unit represented by the following Chemical Formula 2:

[Chemical Formula 2]

$$Z-(L'-*)_n$$

in Chemical Formula 2, each L' is independently a single bond; or a substituted or unsubstituted $C_{6-60}$ arylene, Z is C, Si, N, Si (phenyl), or an n-valent substituted or unsubstituted $C_{6-60}$ aromatic ring, n is 3 or 4, with the proviso that n is 4 if Z is C or Si and n is 3 if Z is N or Si (phenyl), and

* indicates the point of attachment within the polymer.

10. The organic light emitting device according to claim 9, wherein:

each L' is independently a single bond, or phenylene.

11. The organic light emitting device according to claim 9, wherein:

Z is C, N, Si, or a trivalent benzene.

12. The organic light emitting device according to claim 9, wherein:

the Chemical Formula 2 is any one selected from the group consisting of:

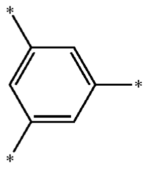

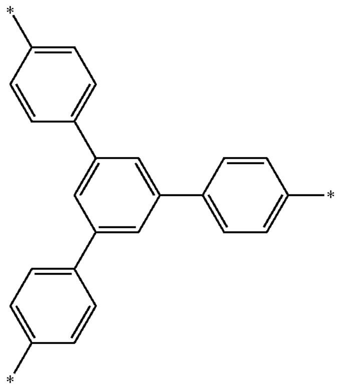

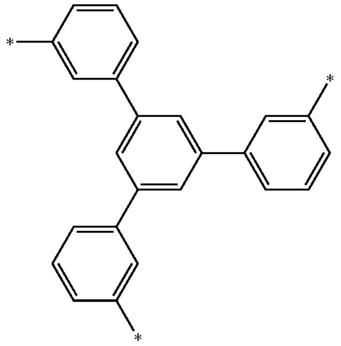

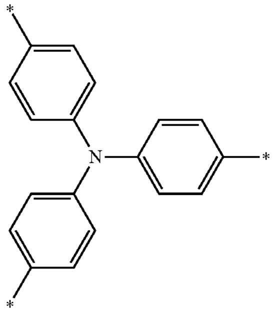

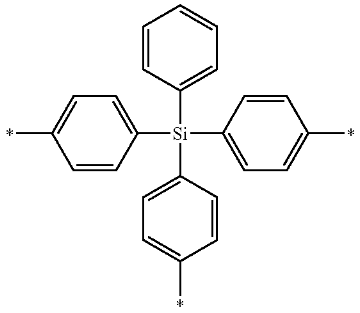

-continued

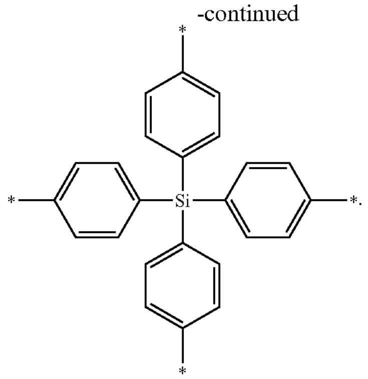

13. The organic light emitting device according to claim 1, wherein:

the polymer further comprises a terminal group represented by the following Chemical Formula 3:

Ar—* [Chemical Formula 3]

in Chemical Formula 3,

Ar is a substituted or unsubstituted $C_{6-60}$ aryl,

* indicates the point of attachment within the polymer.

14. The organic light emitting device according to claim 13, wherein:

Ar is phenyl, or biphenylyl, and the Ar is unsubstituted or substituted with a $C_{1-10}$ alkyl, a photocurable group, or a thermosetting group.

15. The organic light emitting device according to claim 13, wherein:

the Chemical Formula 3 is any one selected from the group consisting of:

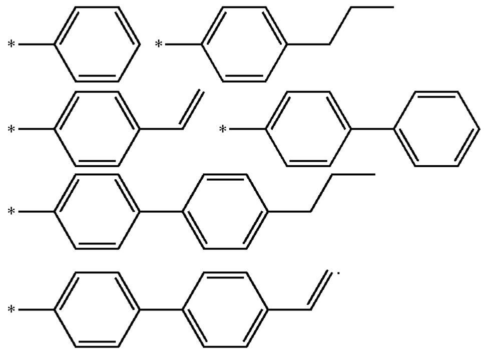

16. The organic light emitting device according to claim 1, wherein:

the polymer has a weight average molecular weight of 3,000 to 1,000,000 g/mol.

17. The organic light emitting device according to claim 9, wherein:

the repeating unit of Chemical Formula 2 is contained in an amount of 10 to 50 moles based on 100 moles of the repeating unit of Chemical Formula 1.

18. The organic light emitting device according to claim 13, wherein:

the repeating unit of Chemical Formula 3 is contained in an amount of 20 to 65 moles based on 100 moles of the repeating unit of Chemical Formula 1.

* * * * *